United States Patent [19]

Bolles et al.

[11] Patent Number: 4,970,466

[45] Date of Patent: Nov. 13, 1990

[54] TDR CABLE TESTING APPARATUS WITH PULSE TIMING MANIPULATION TO AUTOMATICALLY COMPENSATE FOR DIVERSE CABLE CHARACTERISTICS

[75] Inventors: David C. Bolles, Scottsdale; Eric J. Gotfredson; Robert W. Ellis, both of Phoenix, all of Ariz.

[73] Assignee: MicroTest, Inc., Phoenix, Ariz.

[21] Appl. No.: 327,346

[22] Filed: Mar. 22, 1989

[51] Int. Cl.[5] .......................................... G01R 31/11
[52] U.S. Cl. ...................................... 324/533; 379/26
[58] Field of Search ............. 324/532, 533, 534, 58 B, 324/58.5 B; 379/6, 26, 25

[56] References Cited

U.S. PATENT DOCUMENTS

| | | | |
|---|---|---|---|
| 3,244,975 | 4/1966 | Bauer | 324/534 |
| 3,431,369 | 3/1969 | McLaughlin | 379/6 |
| 4,041,381 | 8/1977 | Hwa | 324/85.5 B |
| 4,069,447 | 1/1978 | Frye | 320/1 |
| 4,307,267 | 12/1981 | Peoples | 379/6 |
| 4,479,228 | 10/1984 | Crane | 375/7 |
| 4,538,103 | 8/1985 | Cappon | 324/52 |
| 4,739,276 | 4/1988 | Graube | 324/534 |
| 4,755,742 | 7/1988 | Agoston et al. | 324/58 |
| 4,766,386 | 8/1988 | Oliver et al. | 324/533 |
| 4,797,621 | 1/1989 | Anderson et al. | 324/533 |

*Primary Examiner*—Reinhard J. Eisenzopf
*Assistant Examiner*—Maura K. Regan
*Attorney, Agent, or Firm*—Lowell W. Gresham; Jordan M. Meschkow; Don J. Flickinger

[57] ABSTRACT

A cable tester, which is adapted to be used by persons not expertly skilled in the technical characteristics of local area networks (LANs), is disclosed. The tester incorporates a time domain reflectometer which starts a counter upon the generation of an incident signal pulse and utilizes a comparator which compares signals present on a cable under test to a controllable amplitude to halt the timer. The tester exhibits an output impedance which is greater than the impedance of a cable being tested. The tester additionally measures instantaneous amplitude levels of signals present on the cable being tested, resistance, continuity, noise levels, and data activity on a network of which the cable is a part. In addition, the tester includes a display and a sound generally device. Software programming compensates for impedance mismatches with the cable and data present on an active network being tested. In addition, software programming processes test and measurement results for visual presentation on the display and for audible presentation on the sound generating device. The visual presentations incorporate graphical representations of test and measurement data. Furthermore, the tester supplies audible signals which can be used with the aid of a tracer device to locate the cable being tested.

34 Claims, 12 Drawing Sheets

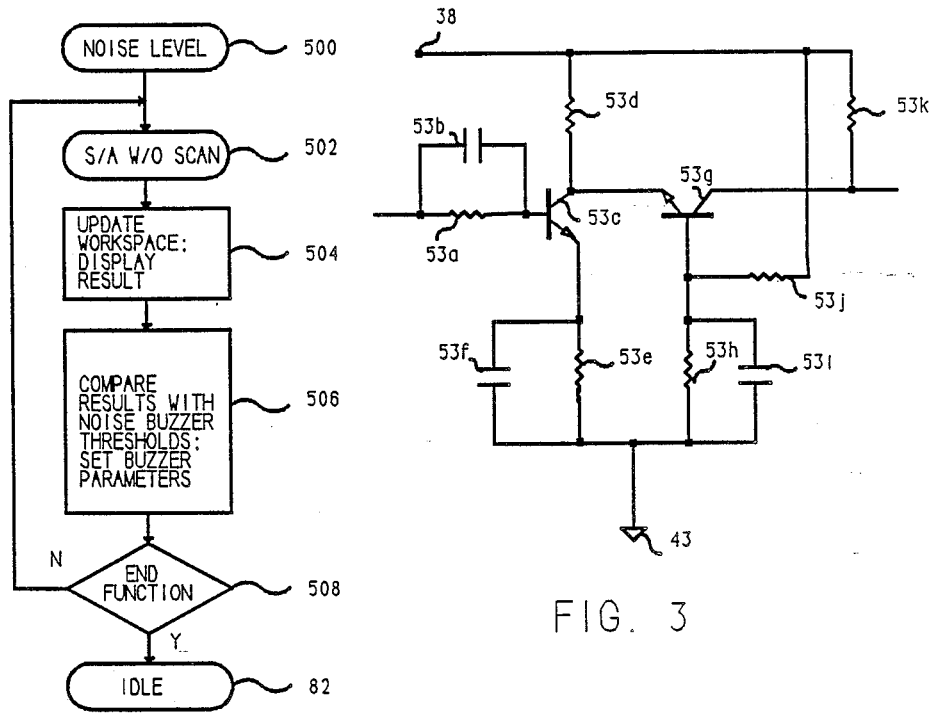
FIG. 11
FIG. 3
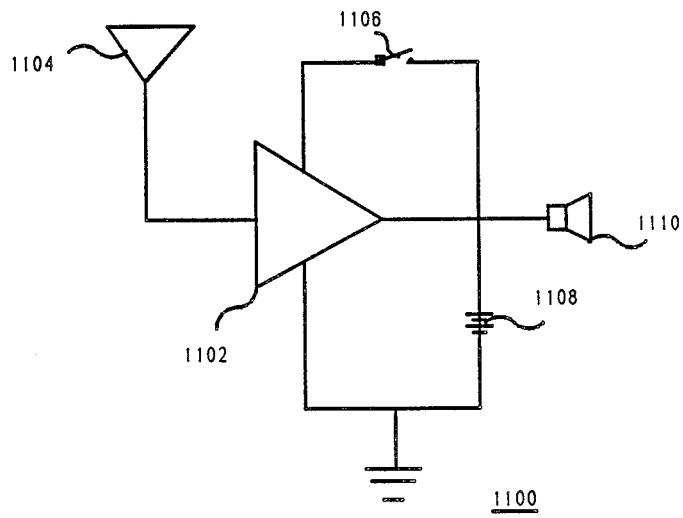
FIG. 16

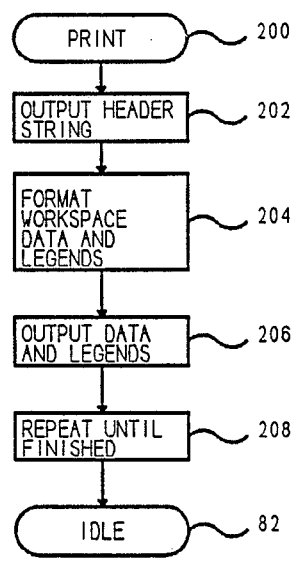
FIG. 8
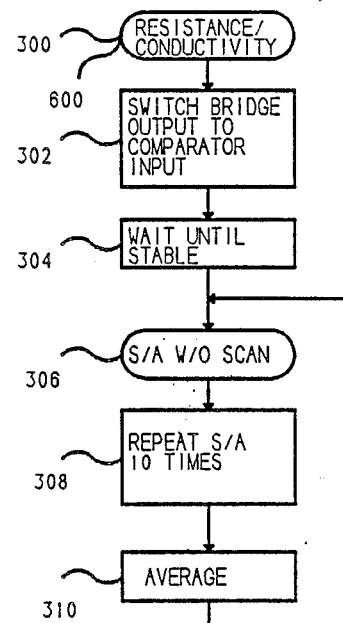
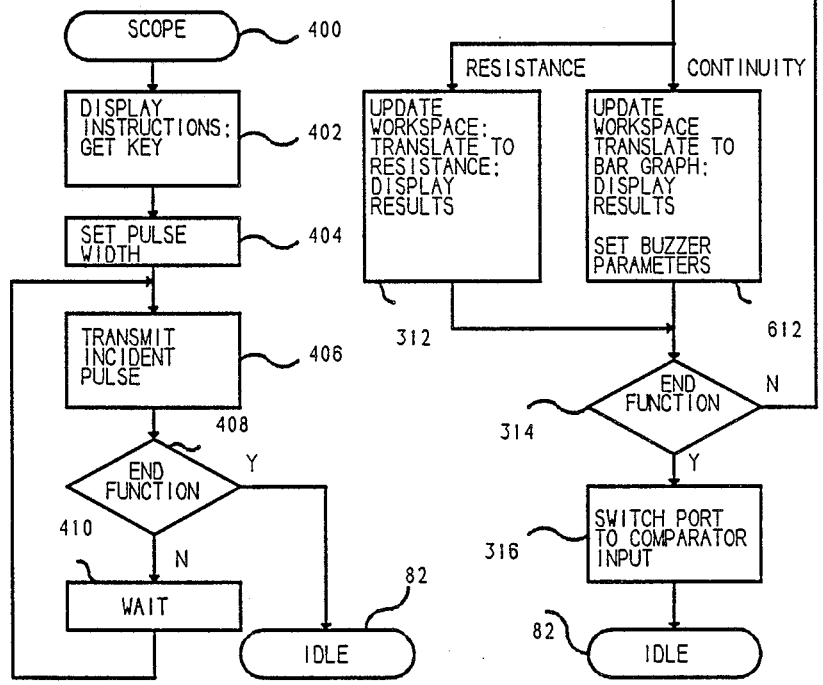
FIG. 10
FIG. 9

TDR CABLE TESTING APPARATUS WITH PULSE TIMING MANIPULATION TO AUTOMATICALLY COMPENSATE FOR DIVERSE CABLE CHARACTERISTICS

TECHNICAL FIELD OF THE INVENTION

The present invention relates generally to devices employed in the testing of electrical cables which are commonly utilized in local area networks (LANs). More specifically, the present invention relates to such devices which, at least in part, utilize the technology of time domain reflectometry (TDR) and which process TDR and other data for convenient presentation to a user of the device.

BACKGROUND OF THE INVENTION

Local area networks (LANs), which couple separately located computers together, have become a common feature in today's workplace. A LAN cable, which physically spans the distances between computers and includes connectors and terminators installed thereon, serves a key role in the LAN. However, failures in a LAN cable can occur during installation, during modifications to the computer network, and when furniture, computer, or office space relocations occur.

Typically, even LAN cable failures which completely halt LAN operations can be difficult to identify and isolate. However, LAN cables experience many other failure or problem modes which are extremely difficult to identify because they lead to a degradation in performance rather than a complete halting of LAN operations. Skilled engineers and technicians can and do utilize a variety of currently available test equipment to troubleshoot such LAN failures and problems. However, today's workplace is often staffed by persons who, while highly skilled in various technical areas, do not possess the types of skills or equipment required to fully understand and identify the many complex electrical parameters which characterize a LAN.

Consequently, the troubleshooting of a LAN, even when a relatively simple problem is suspected, requires the services of such LAN-skilled persons using the appropriate test equipment. Many managers in the workplace dislike obtaining the services of such LAN-skilled persons because of the excessive computer down-time which may result from waiting for such persons to arrive and because of the large fees such persons demand.

Accordingly, the successful troubleshooting of common LAN failures by an internal LAN user would be a highly desirable alternative to obtaining the services of outside LAN-skilled persons. Unfortunately, the test equipment currently utilized in troubleshooting LAN problems assumes a large familiarity with the complex electrical parameters that characterize a LAN. Consequently, such test equipment fails to meet the troubleshooting needs of the typical LAN user. For example, such equipment typically includes sophisticated time domain reflectometry (TDR) circuits which require an equipment operator to enter a significant amount of data in order to perform a TDR scan of a cable under test. Specifically, an operator is typically required to characterize a nominal velocity of propagation (NVP) and an impedance of the cable under test. While the entry of such data presents no obstacle to a typical LAN-skilled person, the entry of such data is highly undesirable to the typical LAN user who does not readily know such data and may not fully appreciate the significance of such data to TDR.

In addition, such conventional equipment requires a user to enter a desired pulse width for use in connection with TDR scans. While this pulse width selection is readily understood and appreciated by the typical LAN-skilled person, the typical LAN user may not fully appreciate its significance in TDR and may have trouble in making an appropriate choice.

Conventional LAN testing equipment fails to serve the typical LAN user's needs in other areas. For example, such conventional equipment fails to include functions for performing simple continuity checks, for electrical interference testing, for locating cables which may be hidden in ceilings, walls, under carpets, etc., and for performing other common tests required in a typical computerized workplace, such as serial data port testing. Moreover, such conventional equipment typically presents information in a cryptic manner which requires a significant amount of interpretation on the part of an equipment operator. Furthermore, such conventional equipment often performs TDR scans slowly so that such conventional equipment cannot operate simultaneously with operation of the LAN. Still further, such conventional equipment fails to permit the saving of test data for later analysis or for later presentation to a LAN-skilled person.

In addition, such conventional equipment often assumes the availability of additional "test" equipment, such as chart recorders, oscilloscopes, VOM's, and the like. However, the typical LAN user may not readily possess such additional "test" equipment. Furthermore, such conventional equipment, especially when associated with supporting "test" equipment, often costs so much that a typical LAN user cannot afford to purchase it for emergency and occasional use only.

Thus, a need exists for cable testing equipment which addresses the needs of the typical LAN user.

SUMMARY OF THE INVENTION

Accordingly, it is an advantage of the present invention that a cable testing apparatus and method which are particularly suited for the typical LAN user are provided.

Another advantage is that the present invention provides a time domain reflectometer which refrains from requiring a user to specify the types of parameters which are typically unknown to the user.

Still another advantage is that the present invention presents data to a user in numeric, graphical, and audible forms so that a user is required to engage in a minimum amount of data interpretation.

Yet another advantage is that the present invention includes a plurality of diverse functions so that a user need not obtain additional "test" equipment to successfully troubleshoot a wide variety of common LAN problems.

The above and other advantages of the present invention are carried out in one form by a cable testing device which includes a port for coupling to a cable under test. A time domain reflectometer couples to the port to transmit an incident pulse of a selectable width and to monitor signals at the port. A circuit, which automatically specifies a width for the incident pulse in response to the signals monitored at the port, couples to the time domain reflectometer.

The above and other advantages of the present invention are carried out in another form by a cable testing device which couples to a cable that exhibits a predetermined characteristic impedance. The cable testing device includes a time domain reflectometer which has an output that couples to the cable. The time domain reflectometer output exhibits a characteristic impedance which is greater than the predetermined characteristic impedance.

The above and other advantages of the present invention are carried out in yet another form by a method of performing time domain reflectometry at a port which is intended to couple to a cable under test. The method first measures a substantially instantaneous amplitude of signals present at the port. Subsequent to this measurement, the method transmits an incident signal pulse at the port and starts a timer substantially simultaneous with the transmission of the incident signal pulse. The method additionally monitors the signals present at the port and compares the amplitudes of these signals with a comparison amplitude that exceeds the instantaneous amplitude discussed above. Upon the detection at the port of a signal which exhibits an amplitude that exceeds the comparison amplitude, the method stops the timer to produce a timed duration.

BRIEF DESCRIPTION OF THE DRAWINGS

A more complete understanding of the present invention may be derived by referring to the detailed description and claims when considered in connection with the FIGURES, wherein like reference numbers refer to similar items throughout the FIGURES, and:

FIG. 3 shows a schematic diagram of a cable driver portion of the present invention;

FIG. 8 is a flow chart which illustrates the types of tasks performed by the present invention during a Print function;

FIG. 9 is a flow chart which illustrates the types of tasks performed by the present invention during Resistance and Continuity functions;

FIG. 10 is a flow chart which illustrates the types of tasks performed by the present invention during a Scope function;

FIG. 11 is a flow chart which illustrates the types of tasks performed by the present invention during a Noise Level function;

FIG. 16 shows a block diagram of a tracer device utilized in connection with the Tracer macro;

DETAILED DESCRIPTION OF THE PREFERRED EMBODIMENT

Figure 1:
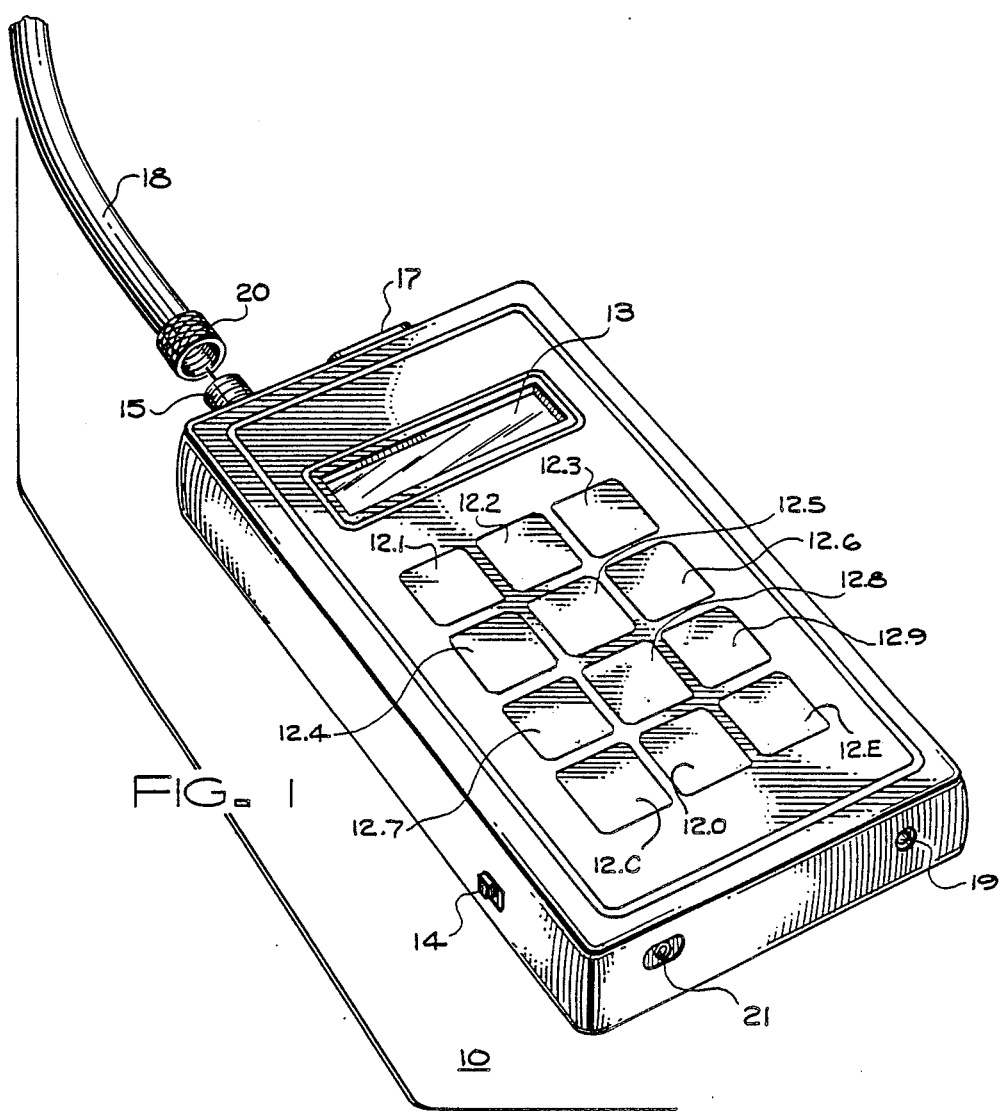
FIG. 1 shows an external, perspective view of the present invention.

FIG. 1 shows a hand-held cable tester 10 in accordance with the preferred embodiment of the present invention. Tester 10 resides in a box-like housing which measures approximately 1"×4"×7.5" and weighs approximately 2 pounds. A top surface of tester 10 includes a keyboard 12. Keyboard 12 is configured in an array having 12 keys, labeled keys 12.0–12.9 for the numerals 0–9, 12.c for "Clear," and 12.e for "Enter." In addition, the top surface of tester 10 includes a display 13, which provides a user of tester 10 with a visual indication of data in a 16 character by 2 line array.

Sides of tester 10 include a plurality of connectors and a power switch 14. A user of tester 10 manipulates power switch 14 to energize and de-energize tester 10. A cable port 15 in the form of a BNC connector and a test connector 17 reside on one side of tester 10. Port 15 is intended to connect to a cable under test (CUT) 18 through a suitable adaptor or mating BNC connector 20. Connector 17 electrically couples in parallel to port 15 for electrically connecting twisted pair cables, oscilloscopes, or other test equipment to CUT 18 at tester 10. In the preferred embodiment, CUT 18 represents any electrical cable, and more preferably represents any electrical cable used in a local area network (LAN).

Another side of tester 10 includes a serial data port 19 for allowing tester 10 to communicate with a printer, a computer, or other computer-controlled device (not shown) using standardized data communication signals, such as those utilized in an RS-232 data communications link. In addition, this side of tester 10 includes a connector 21 for coupling an electrical power source to tester 10 for charging batteries contained within tester 10 and for energizing tester 10.

Figure 2A:
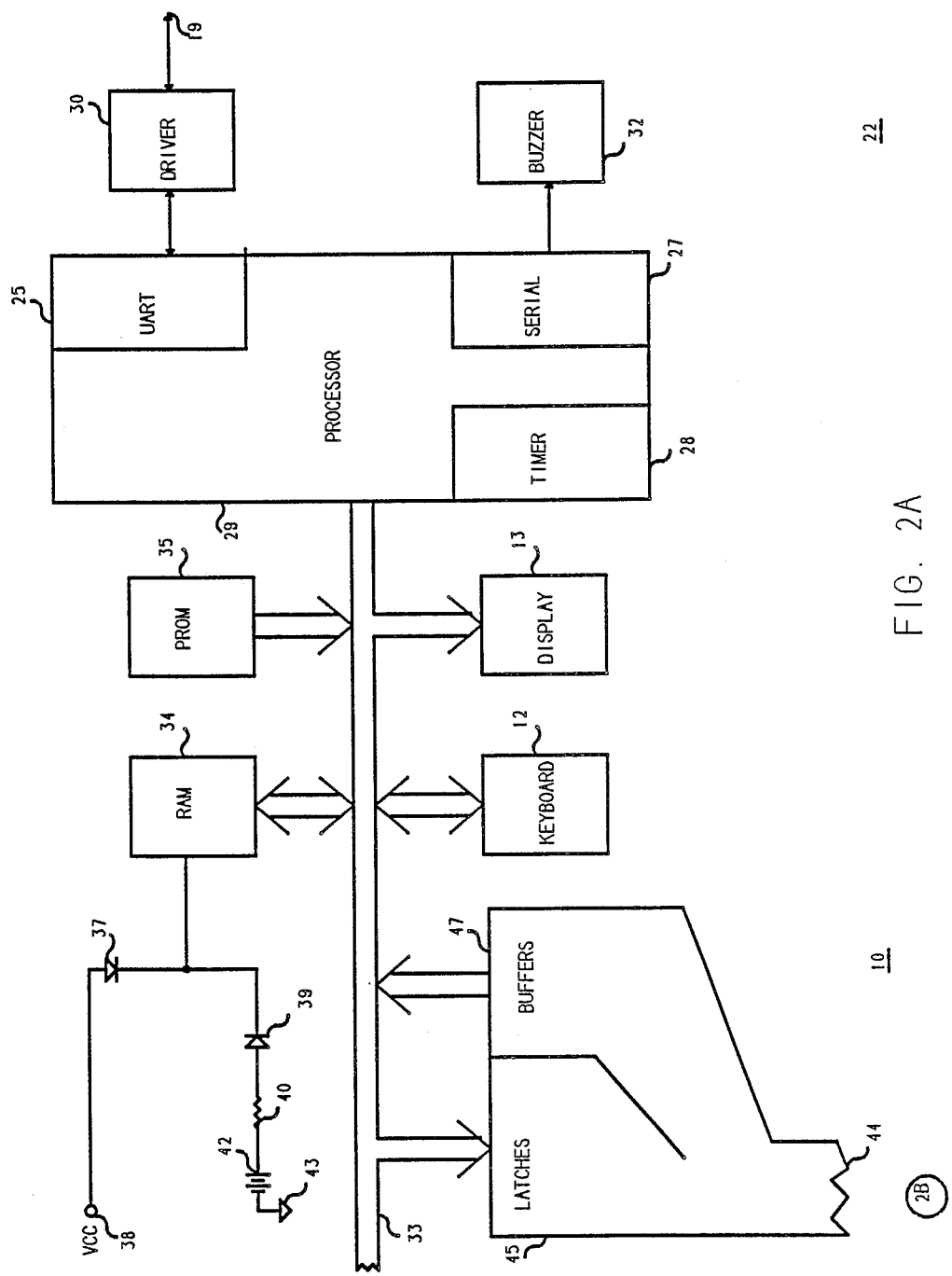
FIG. 2A shows a block diagram of a controller portion of hardware circuits included in the present invention.
Figure 2B:
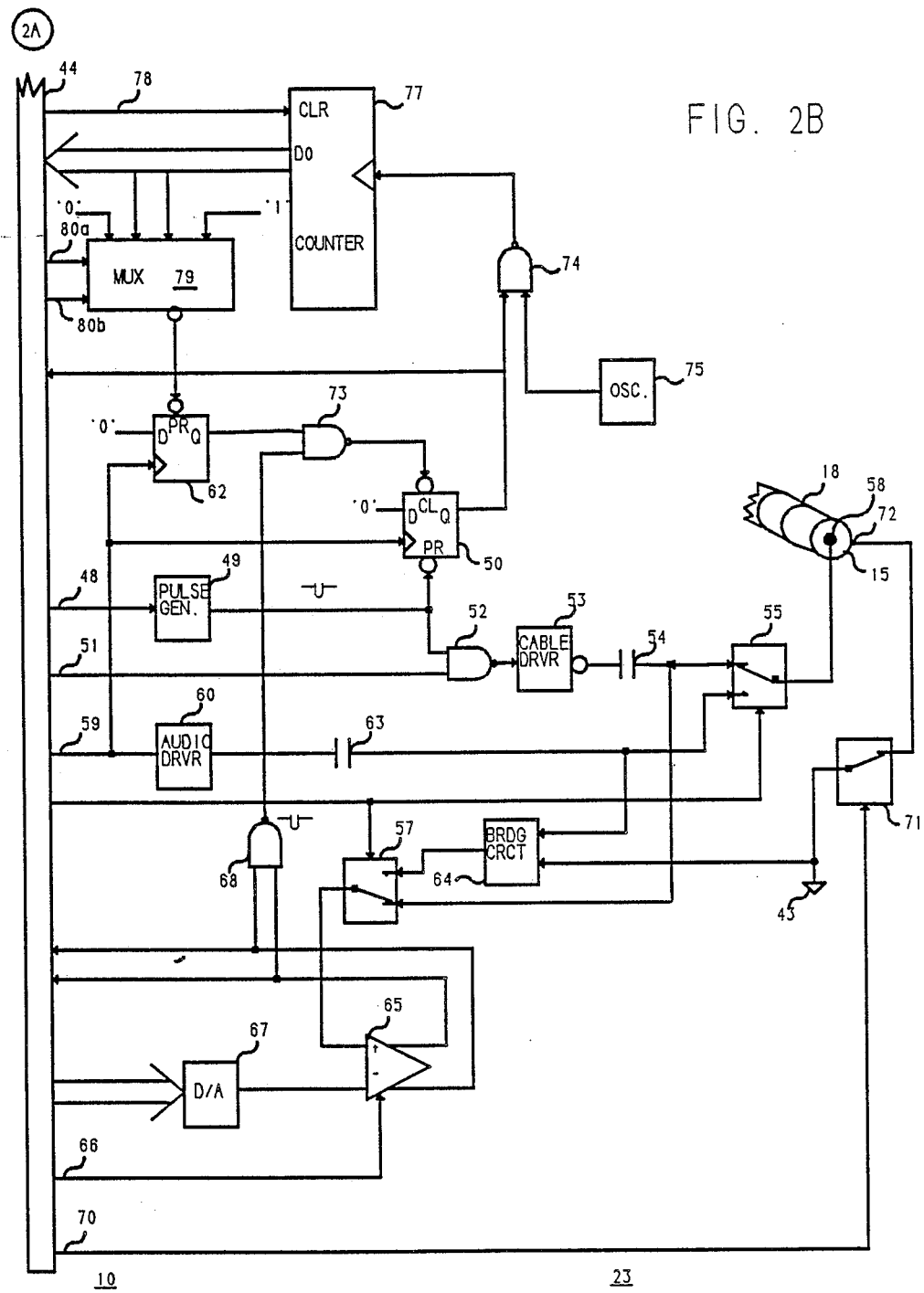
FIG. 2B shows a block diagram of a cable interface portion of hardware circuits included in the present invention.

FIGS. 2A and 2B show a block diagram of circuits utilized by tester 10. Generally, these circuits reside in either a controller section 22 (shown in FIG. 2A) or a cable interface section 23 (shown in FIG. 2B). As shown in FIG. 2A, controller 22 includes a conventional 8-bit microprocessor 24, such as an HD64180, manufactured by the Hitachi Corporation. This particular microprocessor 24 includes an internal universal asynchronous receiver/transmitter (UART) 25, a high-speed serial port 27, and a timer 28. Each of UART 25, serial port 27, and timer 28 utilize an interrupt structure to communicate with a processor portion 29 of microprocessor 24. Of course, those skilled in the art will recognize that the present invention can alternatively employ any one of a wide variety of alternate 4-bit, 8-bit, 16-bit, 32-bit, and the like microprocessor products which may or may not include such internal UART, timer, and serial port functions.

In the preferred embodiment, UART 25 couples through a driver circuit 30 to serial data port 19, discussed above in connection with FIG. 1. The preferred embodiment of the present invention engages in RS-232 serial data communication through UART 25 and driver 30 using conventional techniques. Such communication represents a widely accepted communication standard for computer devices. Consequently, hard-copy printouts of test results are provided utilizing such computer devices. The use of computer devices for hard-copy, rather than specialized test equipment, such as chart recorders, is advantageous because such equipment is readily available in an environment where a LAN operates. Consequently, a user of tester 10 need not purchase additional equipment to obtain hard-copy printouts of test results.

High speed serial port 27 provides an output from microprocessor 24 which couples to a conventional piezoelectric buzzer 32. Consequently, tester 10 provides audible indications of data through the emission of "beeps" by buzzer 32. Specifically, such "beeps" are produced by loading data containing alternating 1's and 0's, (i.e. AAH or 55H) into high speed serial port 27, then controlling the rate at which such data is clocked out of port 27 to define the tone of the "beep." Port 27 generates an interrupt to processor 29 when it has completed clocking its data out from microprocessor 24, and processor 29 reloads such data into port 27 in response to this interrupt. Such reloading continues for the desired duration of a beep.

A data, address, and control bus 33 couples microprocessor 24 to a random access memory (RAM) 34 and a programmable read only memory (PROM) 35. In addition, bus 33 couples to keyboard 12 and display 13, which were discussed above in connection with FIG. 1. Microprocessor 24 communicates with RAM 34, PROM 35, keyboard 12, and display 13 utilizing conventional techniques, which employ address decoding and appropriate manipulation of microprocessor control signals (not shown).

In the preferred embodiment, RAM 34 is a conventional volatile RAM. Controller 22 utilizes RAM 34 to store variables, test data, and other parameters which change due to the operation of tester 10. A power input terminal of RAM 34 couples through a diode 37 to a Vcc terminal 38. Terminal 38 is adapted to receive a positive voltage only when tester 10 has been energized through the operation of power switch 14 (see FIG. 1). In addition, the power input terminal of RAM 34 couples through a series-connected diode 39 and resistor 40 to a positive terminal of a battery 42. A negative terminal of battery 42 couples to a ground terminal 43. Consequently, RAM 34 employs a battery powered back-up scheme. When tester 10 is de-energized, battery 42 continues to supply current to RAM 34 so that data stored therein is not lost. Of course, the alternative use of non-volatile RAM circuits to maintain data integrity when tester 10 has been de-energized is equally within the scope of the present invention.

Controller 22 utilizes PROM 34 to store software programming instructions, tables, constant data, and other data which does not change through the operation of tester 10. Such instructions, tables, and the like are discussed below in connection with the flow charts of FIGS. 4-22.

Keyboard 12 and display 13 each communicate with microprocessor 24 in a conventional manner. Thus, in the preferred embodiment, a background mode of operation for microprocessor 24, initiated by an interrupt generated every 20 milliseconds by timer 28, examines keyboard 12 to determine which, if any, of keys 12.0-12.9, 12.c, and 12.e (see FIG. 1) have been depressed. Data describing a depressed key is then placed in a buffer for use by a foreground mode of operation.

Microprocessor 24 writes either control data or display data to display 13. The control data clears the display, indicates where on display 13 subsequent data shall be written, and performs other control functions. Each byte of display data forms a code, such as the well-known ASCII code, which display 13 formats as a character or symbol for display thereat.

Controller 22 interfaces to cable interface 23 (FIG. 2B) through a controller interface 44. Interface 44 includes a plurality of latches 45 and buffers 47, which couple to bus 33 in a conventional manner. Microprocessor 24 writes control bits of data, which configure and initiate the operation of cable interface 23, into latches 45. Conversely, microprocessor 24 reads test result data produced by cable interface 23 at buffers 47.

As shown in FIG. 2B, controller interface 44 supplies a short pulse control bit at a line 48 to an input of a pulse generator 49. Pulse generator 49 produces a 15---20 nanosecond logic low pulse at an output thereof in response to a low-to-high transition of the short pulse control bit. The precise pulse width is not a critical parameter. Such a pulse may be produced by splitting the input short pulse control bit into two signal paths having unequal propagation delays associated therewith, then gating the two unequally delayed signal paths together to produce the output signal. However, the present invention contemplates the use of delay lines or other circuits to produce this 15-20 nanosecond pulse.

The output of pulse generator 49 couples to a preset input of a D-type flip-flop 50 and to a first input of a NAND gate 52. Controller interface 44 supplies a long pulse control bit at a line 51, which couples to a second input of NAND gate 52. An output of NAND gate 52 couples to an input of an inverting cable driver circuit 53, the details of which are discussed below in connection with FIG. 3. An output of cable driver 53 AC couples through a series-connected capacitor 54 to a first signal port of a switching device or relay 55, and to a first signal port of a switching device or relay 57. A second signal port of relay 55 couples to a signal terminal 58 of port 15. In addition, the present invention contemplates the use of protection circuits (not shown) between relay 55 and terminal 58.

With further reference to the circuits depicted in FIG. 2B, controller interface 44 supplies a ready/audio control bit at a line 59 to an input of an audio signal driver 60, and to clock inputs of flip-flop 50 and a D-type flip-flop 62. "D" inputs of flip-flops 50 and 62 couple to a terminal which is adapted to supply a constant logical low signal. An output of audio signal driver 60 AC couples through a capacitor 63 to a second signal port of relay 55 and to a first signal input of a bridge circuit 64. A second signal input of bridge circuit 64 couples to ground terminal 43. Bridge circuit 64 is a conventional resistive bridge, in which the first and second signal inputs of bridge circuit 64 form one leg of the bridge. In addition, the preferred embodiment of bridge circuit 64 amplifies the output signal from the resistive bridge in an operational amplifier (not shown). An output of this operational amplifier serves as an output of bridge circuit 64 and couples to a second signal port of relay 57. In addition, bridge circuit 64 may advantageously incorporate filtering and temperature stabilization circuits so that a stable output is provided therefrom.

A third signal port of relay 57 couples to a non-inverting input of a comparator 65. A slope control bit presented at line 66 couples controller interface 44 to a slope control input of comparator 65. An output of a conventional 8-bit digital-to-analog (D/A) converter 67 couples to a negative input of comparator 65. An 8-bit data input of D/A converter 67 couples to eight control output bits from controller interface 44. A positive slope output of comparator 65 couples to a first input of a NAND gate 68 and to controller interface 44 so that it may be read by microprocessor 24. Likewise, a negative slope output of comparator 65 couples to a second input of NAND gate 68 and to controller interface 44. The preferred embodiment implements comparator 65 using a conventional dual-slope comparator, such as an LM361, manufactured by the National Semiconductor Corporation. However, those skilled in the art will understand that other similar devices or two single-output comparators may be configured to serve the functions performed by comparator 65 in the present invention.

Controller interface 44 additionally supplies a first relay control bit at a line 69 and a second relay control bit at a line 70. Line 69 couples to control inputs of relays 55 and 57, and line 70 couples to a control input of a switching device or relay 71. Of course, the present invention additionally contemplates the use of driving circuits (not shown) between the control inputs of relays 55, 57, and 71 and controller interface 44. Relays 55 and 57 are configured so that when the first relay control bit is in a first logical state, relay 55 electrically connects its first and second signal ports together while relay 57 electrically connects its first and third signal ports together, as shown in FIG. 2B. When the first relay control bit exhibits a second logical state, both of relays 55 and 57 connect their respective second and third signal ports together.

A first signal port of relay 71 couples to a reference terminal 72 of port 15. When CUT 18 is a coaxial cable, reference terminal 72 typically couples to a shield of CUT 18 while signal terminal 58 couples to a center conductor of CUT 18. A second signal port of relay 71 is left open, and a third signal port of relay 71 couples to ground terminal 43. Thus, relay 71 is configured so that when the second relay control bit is in a first logical state, the first and third signal ports thereof connect together. However, when the second relay control bit is in a second logical state, the first signal port of relay 71 is open, causing the shield of CUT 18 to become isolated from ground 43 of tester 10.

With further reference to the circuits depicted in cable interface 23 of tester 10, an output of NAND gate 68 couples to a first input of a NAND gate 73. A non-inverting output of flip-flop 62 couples to a second input of NAND gate 73, and an output of NAND gate 73 couples to a clear input of flip-flop 50. A non-inverting output of flip-flop 50 couples to a first input of a NAND gate 74 and to controller interface 44 so that it may be read by microprocessor 24. An oscillator 75, which operates at a frequency of around 100 MHz in the preferred embodiment, has an output which couples to a second input of NAND gate 74. An output of NAND gate 74 couples to a clock input of a counter circuit 77.

In the preferred embodiment of the present invention, counter 77 simply counts the 100 MHz clock signal produced by oscillator 75, when enabled to do so. The least significant bit of counter 77 is supplied from a flip-flop (not shown) which latches the phase of the clock signal as counter 77 is stopped, or disabled. Thus, counter 77 exhibits sufficient timing precision to enable tester 10 to resolve the location of opens or shorts in CUT 18 to within two feet. In addition, counter 77 is configured so that the less significant bits are implemented using high-speed logic circuits, such as Advanced Schottky devices, to accommodate the high frequency of the clock signal. On the other hand, the more significant bits of counter 77 are generated by low-power consuming circuits, such as CMOS devices, to minimize current drain on battery 42, which powers tester 10.

Counter 77 couples its 15-bit output to controller interface 44 so that the count values generated by counter 77 may be read by microprocessor 24. In addition, controller interface 44 supplies a clear counter control bit at a line 78 that couples to counter 77. Thus, microprocessor 24 initializes counter 77 to a known count, such as zero, prior to the enablement of counter 77 by activating the clear counter control bit. Two of the counter output bits (the fourth and seventh from the least significant side of the counter output) couple to first and second data inputs of a four-to-one multiplexer 79. A third data input of multiplexer 79 couples to a terminal adapted to supply a constant logical low signal, and a fourth data input of multiplexer 79 couples to a terminal adapted to supply a constant logical high signal. Controller interface 44 supplies first and second mux-selection control bits at lines 80a and 80b, collectively referred to as lines 80, which couple to first and second selection inputs, respectively, of multiplexer 79. An inverted output of multiplexer 79 couples to a preset input of flip-flop 62. Consequently, microprocessor 24 controls the mux-selection control bits to route a logical low, logical high, or one of the data output bits from counter 77 to the preset input of flip-flop 62.

Further description of the circuits within tester 10 and of their modes of operation is generally provided below in connection with various software routines which control the operation of such modes. However, FIG. 3 depicts specific circuits included in cable driver 53 which are discussed in detail here. Specifically, the input of cable driver 53 couples through a parallel-coupled combination of a resistor 53a and a capacitor 53b to a base of an NPN transistor 53c. A collector of transistor 53c couples through a biasing resistor 53d to terminal 38, which supplies Vcc as discussed above. An emitter of transistor 53c couples through a parallel-coupled combination of a biasing resistor 53e and an AC shorting capacitor 53f to ground terminal 43. The collector of transistor 53c additionally couples to an emitter of an NPN transistor 53g. A base of transistor 53g couples through a parallel-coupled combination of a biasing resistor 53h and an AC shorting capacitor 53i to ground terminal 43. In addition, the base of transistor 53g couples through a biasing resistor 53j to Vcc terminal 38. Finally, a collector of transistor 53g serves as the output of cable driver 53 and couples through a resistor 53k to Vcc terminal 38.

Resistor 53a and capacitor 53b together form a lead filter which serves to quicken a rising edge of a pulse being transmitted through cable driver 53. Transistor 53c and its associated biasing resistors operate as a first amplification stage for cable driver 53, and transistor 53g and its associated biasing resistors operate as a cascode amplifier at the output of cable driver 53. Consequently, the output of cable driver 53 presents a relatively high impedance to CUT 18 (see FIG. 2B). Since transistor 53g presents a high impedance, the impedance presented to CUT 18 is largely influenced by the value of resistor 53k, which is around 330 ohms in the preferred embodiment.

This high impedance output provides many advantages for the present invention. For example, the high impedance output nature of cable driver 53 minimizes the amount of energy from port 15 which propagates backwards into cable driver 53 from its output. Consequently, cable driver 53 tends to remain stable, without ringing or oscillation. In addition, the high impedance nature of cable driver 53 means that the output impedance of tester 10 need not match the impedance of CUT 18. In fact, this output impedance is higher than the characteristic impedances of typical LAN CUT's, which are generally around 150 ohms or less. Thus, an operator of tester 10 is not required to enter data describing such impedance of CUT 18. The absence of a need to enter the impedance of CUT 18 is particularly desirable because a user of tester 10 may not possess such data.

Figure 4:
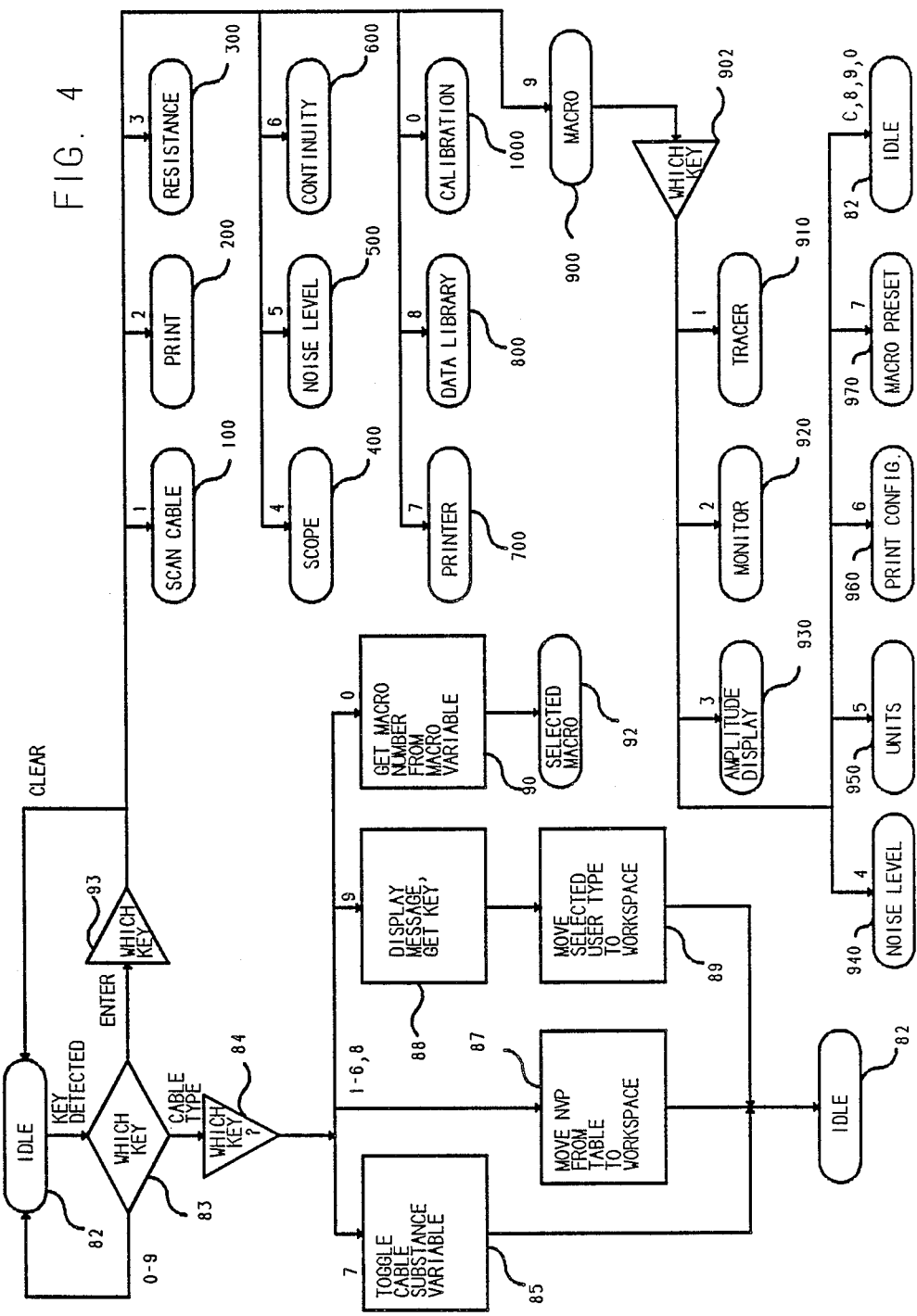
FIG. 4 is a flow chart which illustrates the types of tasks performed by the present invention during an Idle mode of operation.

FIG. 4 depicts a flow chart which illustrates the types of tasks performed by tester 10, under the control of microprocessor 24, during an Idle mode 82 of operation. Idle mode 82 is a foreground mode of operation which occurs when tester 10 is powered-up but not in the process of performing any specific test, function, or macro. As discussed above, during a background mode of operation, microprocessor 24 monitors keyboard 12 (see FIGS. 1-2A) to identify keys as they are pressed and to place a key identifier in a buffer. Idle mode 82, examines this buffer when the pressing of a key has been detected to determine which of keys 12.0-12.9, 12.c, and 12.e (see FIG. 1) has been pressed, as indicated in a task 83. If keys 12.0-12.9 are pressed, program control remains in Idle mode 82. However, if task 83 determines that either the Clear key (key 12.c) or the Enter key (key 12.e) has been pressed, then additional processing results.

When task 83 detects the Clear key (key 12.c), the selection of a Cable Type is being requested, and a task 84 then causes display 17 to instruct the user of tester 10 to enter a number describing the physical characteristics of CUT 18.

The selection of a cable type identifies a nominal velocity of propagation (NVP), which is a well known parameter to those skilled in the art of time domain reflectometry (TDR), for use in making TDR calculations. Printed matter associated with keys 12.1-12.6, and 12.8 identifies common LAN cable types, such as "ETHERNET," "ARCNET," "TOKEN RING," and the like. Printed matter associated with key 12.7 names two physical cable substances (i.e. teflon ("TFE") and poly vinyl chloride ("PVC")) which influence the NVP parameter of the named cable types. If task 84 determines that key 12.7 has been pressed, then a task 85 toggles a variable defining the cable substance from TFE to PVC, or vice-versa, and program control returns to Idle mode 82.

If task 84 determines that one of keys 12.1-12.6, and 12.8 have been pressed, then a task 87 moves an NVP parameter, selected from a table, to a workspace for use in subsequent TDR calculations. After task 87, program control returns to Idle mode 82. Table 1, shown below, contains NVP parameters in association with cable substances and LAN cable types, as used by task 87. Consequently, the use of keys 12.1-12.8 provide the NVP's defined by Table 1.

TABLE 1

| KEY | LAN CABLE TYPE | TFE | PVC |
|-----|----------------|-----|-----|
| 12.1 | Ethernet (Thin) | 70 | 67 |
| 12.2 | Ethernet (Thick) | 77 | 77 |
| 12.3 | ARCnet | 84 | 84 |
| 12.4 | Twisted Pair | 67 | 67 |
| 12.5 | TV Cable | 84 | 78 |
| 12.6 | Token Ring | 78 | 78 |
| 12.8 | Terminal Coax | 84 | 84 |

Task 84 may determine that key 12.9 was pressed. In this situation, a task 88 causes display 13 to instruct the user to enter a number (0-9) corresponding to a selected User Type. Task 88 then retrieves the entered number. The User Type represents a variable either preset from the factory or set by the user to contain a predetermined NVP. Thus, the user may simply select an NVP from an assortment of predetermined NVP's rather than in accordance with specific cable types, as discussed above in connection with task 87. The presetting of a User Type by the user is discussed below in connection with a Calibration function. A task 89, performed after task 88, moves a specified User Type variable from a User Type table (not shown) to the workspace. After task 89, program control returns to Idle mode 82.

In addition, task 84 may determine that key 12.0 was pressed. The pressing of key 12.0 causes a task 90 to obtain a macro variable, and use the value contained in the macro variable as an index which specifies a macro. Next, in a task 92, tester 10 proceeds to perform the specified macro. Macros, including a macro for setting the macro variable, are discussed below. However, generally speaking, the performance of a macro using key 12.0 at task 84 allows a user to use fewer keystrokes in instructing tester 10 to perform the specified macro than would otherwise be required.

Referring back to task 83, the initial key pressed in Idle mode 82 may have been the enter key (key 12.e). When task 83 determines that key 12.e was pressed, a task 93 causes display 13 (see FIG. 1) to instruct the user to press yet another key, collects data describing the pressed key, and switches program control to a routine for the function which was indicated by the pressed key. Each of keys 12.0-12.9, 12.c, and 12.e contain printed matter thereon to indicate a particular function or test which will be performed when that key is pressed. If task 93 decides that the clear key (key 12.c) was pressed, then program control returns to Idle mode 82. However, if keys 12.0–12.9 are pressed, then program control proceeds to the function indicated in Table 2, shown below.

TABLE 2

| Key | Function Name | Function Number |
|---|---|---|
| 12.1 | Scan Cable | 100 |
| 12.2 | Print | 200 |
| 12.3 | Resistance | 300 |
| 12.4 | Scope | 400 |
| 12.5 | Noise Level | 500 |
| 12.6 | Continuity | 600 |
| 12.7 | Printer | 700 |
| 12.8 | Data Library | 800 |
| 12.9 | Macro | 900 |
| 12.0 | Calibration | 1000 |

Functions 100–800 and 1000 are discussed below in connection with FIGS. 5–14. However if task 93 detects the selection of Macro function 900, then program control transfers to a task 902, which operates similarly to task 93, discussed above. Specifically, task 902 causes display 13 to instruct the user to press another key, collects data describing the pressed key, and switches program control to a routine for the macro which was indicated by the pressed key. If task 902 determines that one of keys 12.1–12.7 was pressed, then program control switches to the macro specified in accordance with Table 3, shown below.

TABLE 3

| Key | Macro Name | Macro Number |
|---|---|---|
| 12.1 | Tracer | 910 |
| 12.2 | Monitor | 920 |
| 12.3 | Amplitude Display | 930 |
| 12.4 | Noise Level | 940 |
| 12.5 | Units | 950 |
| 12.6 | Print Configuration | 960 |
| 12.7 | Define Macro Preset | 970 |

Macros 910–970 are discussed below in connection with FIGS. 15–22. On the other hand, if task 902 determines that the clear key (key 12.c) was pressed then program control returns to Idle Mode 82, and if task 902 determines that one of keys 12.8, 12.9, or 12.0 was pressed, then program control returns to Idle Mode 82 after first causing display 13 to instruct the user that no macro has been implemented for the selected key. In addition, tester 10 may advantageously emit an audible "beep" to inform the user that tester 10 is ignoring the previous selection.

Figure 5A:
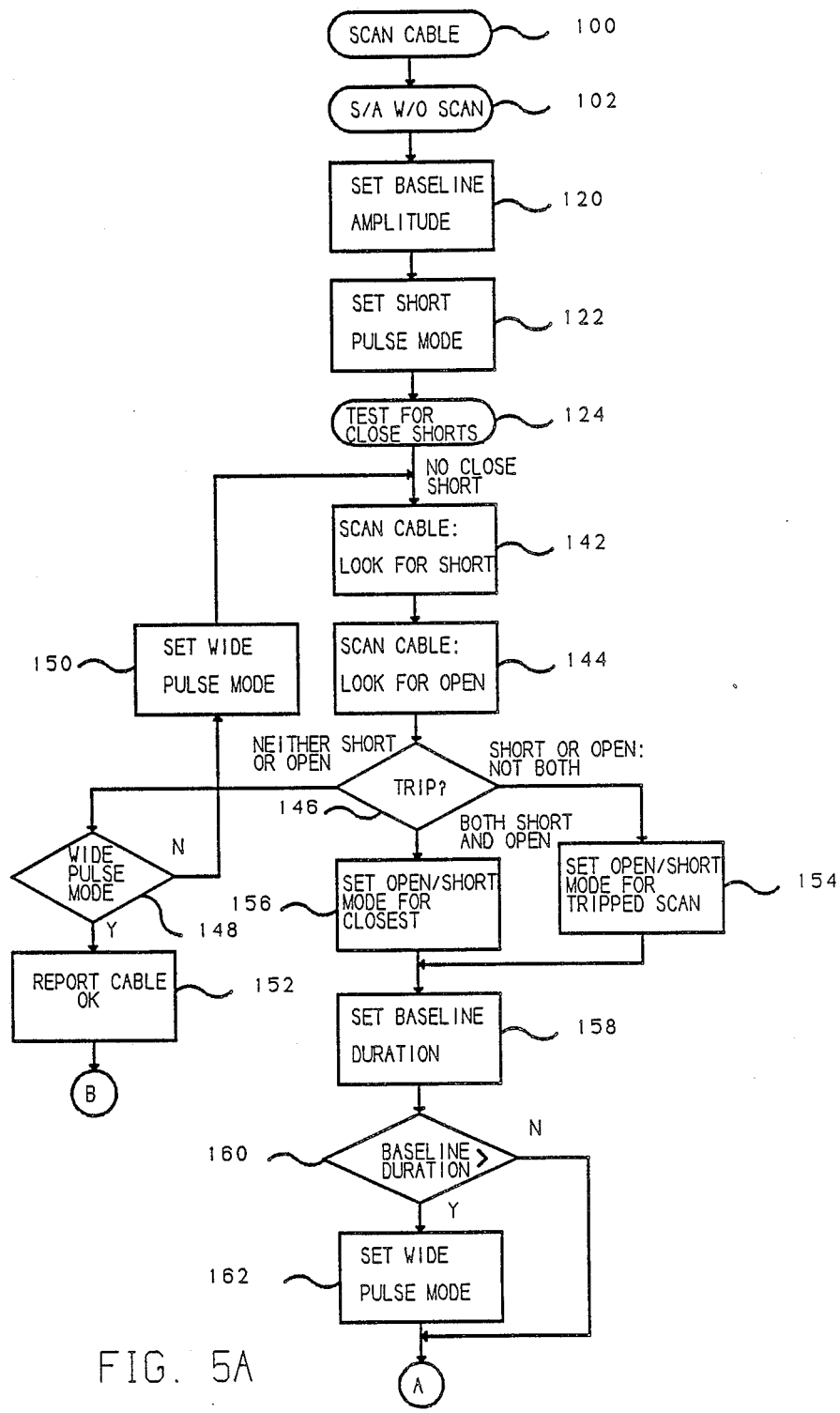
FIGS. 5A and 5B together provide a flow chart which illustrates the types of tasks performed by the present invention during a Scan Cable function.
Figure 5B:
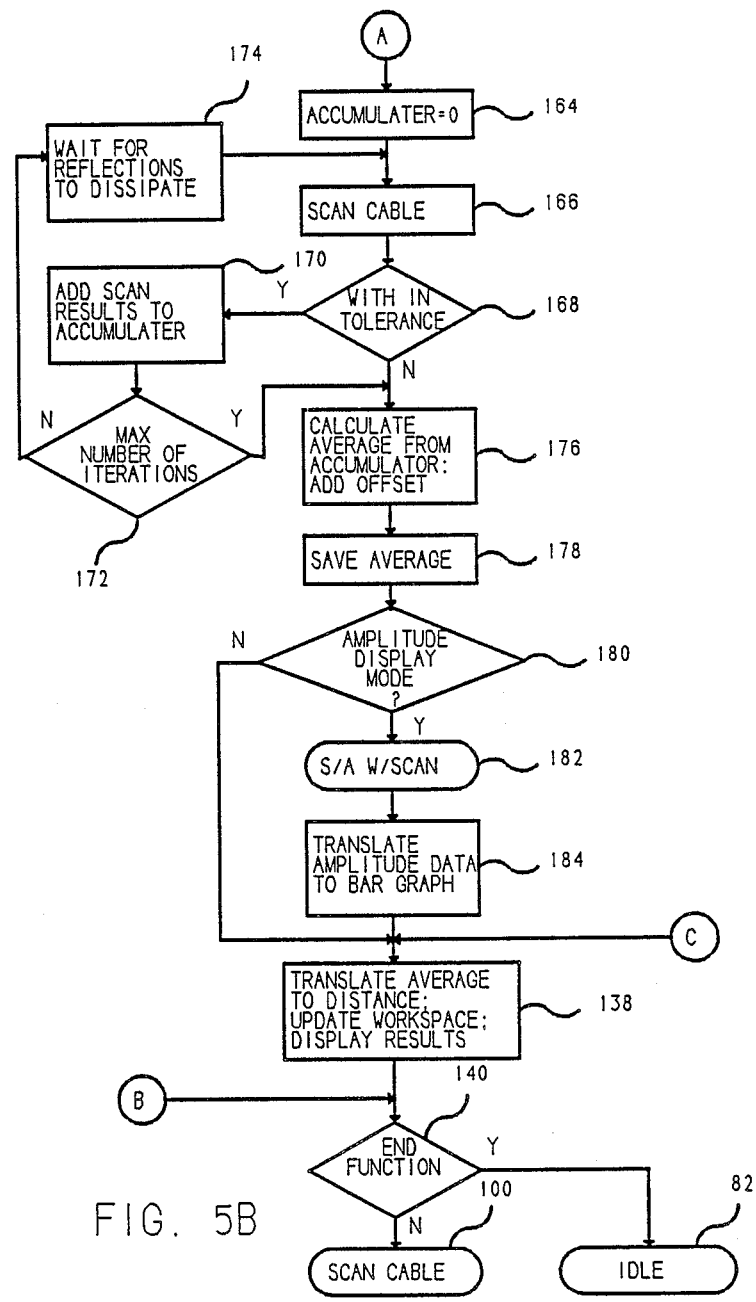

FIGS. 5A and 5B together depict the types of tasks performed by tester 10 during Scan Cable function 100. Function 100 provides the time domain reflectometry (TDR) function of tester 10. Referring briefly back to FIG. 2B, tester 10 performs TDR by causing an incident electrical pulse to be generated and transmitted through cable driver 53 and relay 55 for transmission into CUT 18. Simultaneously, counter 77 begins counting cycles of the clock signal supplied by oscillator 75. This incident pulse propagates away from tester 10 along CUT 18 until it encounters an impedance discontinuity or impedance mismatch. The discontinuity causes at least a portion of the energy in the electrical pulse to be reflected back toward tester 10 as a reflection pulse. The greater the impedance mismatch, the greater the reflection pulse amplitude. Thus, opens and shorts, which represent two common failure modes, produce large amplitude reflection pulses.

The non-inverting input of comparator 65 monitors port 15 through relays 55 and 57 in order to detect the reflected pulse. The inverting input of comparator 65 couples to a controllable comparison amplitude supplied by D/A converter 67. Controller 22 establishes this comparison amplitude so that comparator 65 will be most likely to "trip" when a reflection pulse is detected. When comparator 65 trips, flip-flop 50 disables counter 77 so that the count existing therein is frozen, and controller 22 subsequently reads this count. Thus, counter 77 operates as a timer which measures the period of time transpiring between the transmission of the incident pulse and the receipt of the reflection pulse. The NVP parameter characterizes the speed of propagation of the incident and reflected pulses along CUT 18. Accordingly, controller 22 then calculates the distance to the discontinuity using the time indicated by counter 77 and the NVP.

Moreover, the reflected pulse exhibits a polarity opposite of the incident pulse polarity when the impedance discontinuity is less than the characteristic impedance of CUT 18, such as occurs with a short, and the reflected pulse exhibits the same polarity as the incident pulse when the impedance discontinuity is greater than the characteristic impedance of CUT 18, such as occurs with an open. Thus, opens may be distinguished from shorts by monitoring the polarity of the reflected pulse.

Referring to FIG. 5A, one of the first tasks performed during Scan Cable function 100 is a Successive Approximation routine 102, which establishes an amplitude floor for use in setting the comparison amplitude applied from D/A converter 67 to comparator 65 (see FIG. 2B).

Figures 6, 7:
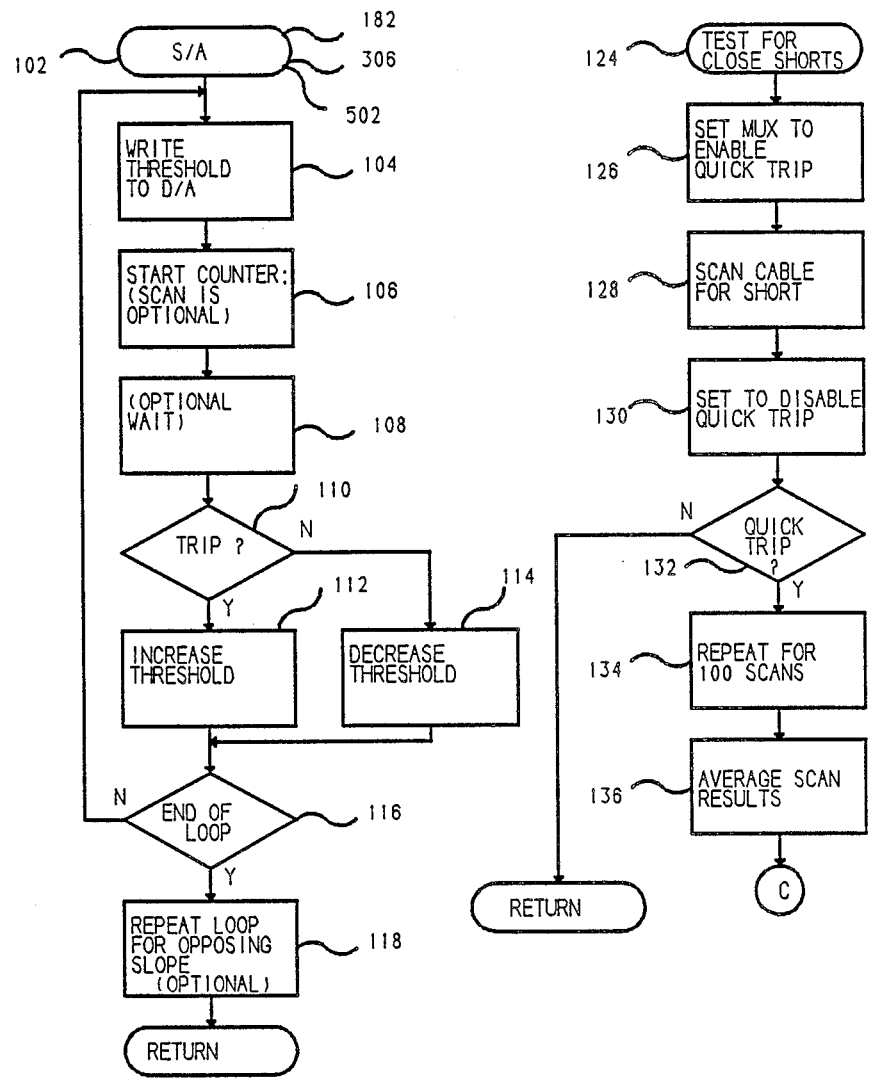
FIG. 6 is a flow chart which illustrates the types of tasks performed by the present invention during Successive Approximation routines.
FIG. 7 is a flow chart which illustrates the types of tasks performed by the present invention during a routine which Tests for Close Shorts.

FIG. 6 illustrates Successive Approximation routine 102 in detail. Generally, tester 10 performs successive approximation routines in several of the functions and macros. These successive approximation routines are similar to one another, although each successive approximation differs from the others in minor details. Consequently, the flow chart of FIG. 6 generically illustrates the types of tasks performed by all of these routines.

Tester 10 performs a task 104 upon entry to Successive Approximation routine 102. Task 104 causes a threshold value to be written to D/A converter 67 (see FIG. 2B). For a first iteration through a successive approximation loop, this threshold value is approximately one-half of full scale for D/A converter 67. After task 104, a task 106 enables counter 77 so that counter 77 begins counting.

Referring back to FIG. 2B, counter 77 may be enabled either with or without simultaneous generation of an incident signal pulse at port 15. The preferred embodiment enables counter 77 by first clocking the ready/audio control bit at line 59 to clear flip-flops 50 and 62, then changing the state of the short pulse control bit at line 48 from a low to a high. The incident signal pulse is generated by placing the long pulse control bit at line 51 in a high state while operating the short pulse control bit, and the incident signal pulse is prevented from being generated when the long pulse control bit is in a low state while operating the short pulse control bit.

After task 106 (see FIG. 6), an optional task 108 causes program control to wait before proceeding to a task 110. In task 110, controller 22 (see FIG. 2A) examines cable interface 23 to see if counter 77 has been disabled since the prior enablement of task 106. This examination is accomplished by reading the output from flip-flop 50 which couples to controller interface 44.

While counter 77 counts, comparator 65 monitors the signals present at port 15 and trips when it detects an amplitude peak at port 15 which exceeds the comparison amplitude generated by D/A converter 67. Of course, such an amplitude peak may be of a positive or negative nature, and comparator 65 can be controlled, through the operation of the slope control bit at line 66, to trip on positive-going or negative-going signals. Thus, those skilled in the art will understand that, for the purposes of the preferred embodiment illustrated by FIG. 2B the exceeding of the comparison amplitude occurs if, during a positive slope comparison, an input signal exhibits a greater positive amplitude than a positive comparison amplitude or a less negative amplitude than a negative comparison amplitude. In addition, the exceeding of the comparison amplitude occurs if, during a negative slope comparison, an input signal exhibits a less positive amplitude than a positive comparison amplitude or a more negative amplitude than a negative comparison amplitude.

When task 110 (see FIG. 6) detects that comparator 65 has tripped and stopped counter 77, a task 112 increases the threshold from the previous threshold used during task 104. Specifically, the amount of increase is one-half of the previous step, which was one-half of full scale during the first iteration of the successive approximation loop. Thus, task 112 increases the threshold by one-fourth of full scale during the first iteration of the successive approximation loop, by one-eighth during the second iteration, and so on. Conversely, when task 110 detects that comparator 65 has failed to trip and stop counter 77, a task 114 decreases the threshold from the previous threshold used during task 104. Task 114 decreases the threshold by one-fourth of full scale during the first iteration, by one-eighth during the second iteration, and so on.

After either of tasks 112 or 114, program control transfers to a task 116, which inquires whether to end the successive approximation loop or repeat the loop at task 104. In the preferred embodiment, D/A converter 67 receives an 8-bit data input, and therefore task 116 ends the successive approximation loop after 8 iterations. At the end of 8 iterations, the threshold value obtained during the last iteration approximates the peak amplitude detected during execution of Successive Approximation routine 102.

As discussed above, comparator 65 operates in positive slope and negative slope modes. Thus, when task 116 detects the end of the successive approximation loop, a task 118 optionally repeats the above-discussed successive approximation loop (tasks 104–116) to obtain a peak amplitude for the opposing slope mode of comparator 65. After task 118, program control continues with the function or macro which utilizes Successive Approximation routine 102.

Referring back to FIG. 5A, Successive Approximation routine 102 is executed therein without generating an incident signal pulse from tester 10 and without waiting during task 108 of FIG. 6. Moreover, task 102 in FIG. 5A performs both positive and negative slope successive approximation loops to obtain positive and negative peak amplitudes of signals present at port 15. Since task 102 in FIG. 5A does not wait during task 108 (see FIG. 6), the peak amplitude levels detected during task 102 represent substantially instantaneous peak amplitude measurements. Moreover, since task 102 in FIG. 5A refrains from generating an incident signal pulse, the peak amplitude levels detected during task 102 do not include influences from incident or reflected pulses but instead represent the then-current amplitudes of noise and data signals present on CUT 18.

After task 102 in FIG. 5A, a task 120 sets a baseline comparison amplitude by adding predetermined offsets to the peak amplitudes detected in task 102. In the preferred embodiment of the present invention, these predetermined offsets are around ±100 millivolts. Thus, task 120 establishes a positive comparison amplitude, which is approximately 100 millivolts greater than the positive peak amplitude measured in task 102, and a negative comparison amplitude, which is approximately 100 millivolts more negative than the negative peak amplitude measured in task 102.

A task 122, which is performed after task 120, sets a pulse width variable to specify a short pulse width. Subsequent tasks in Scan Cable function 100 use this pulse width variable to control the operation of cable interface 23 (see FIG. 2B) so that a relatively short width incident signal pulse will be generated by tester 10.

Referring back to FIG. 2B, a low-to-high transition on the short pulse control bit at line 48 while the long pulse control bit at line 51 exhibits a high level produces the relatively short width incident pulse, which is approximately 15–25 nanoseconds in the preferred embodiment. The width of this pulse is controlled by pulse generator 49. On the other hand, a high-to-low transition of the long pulse control bit generates the relatively wide incident pulse, which is approximately 300–400 nanoseconds in the preferred embodiment. The value of capacitor 54, which is around 0.1 microfarad in the preferred embodiment, causes the trailing edge of the wide incident pulse to occur approximately 300–400 nanoseconds after its leading edge.

With continued reference to FIG. 5A, after the short pulse width specification in task 122, a routine 124 tests for potential shorts in CUT 18 near tester 10. FIG. 7 illustrates details of routine 124. Specifically, routine 124 includes a task 126, which controls the operation of multiplexer 79 (see FIG. 2B) so that counter 77 may be disabled in the event that comparator 65 trips within a predetermined short period of time after being enabled. In the preferred embodiment, this period of time is set at approximately 65 nanoseconds so that shorts which may exist at 25 or fewer feet from tester 10 in CUT 18 may be detected. Thus, the selection control bits at lines 80 are set so that multiplexer 79 holds flip-flop 62 in a constantly preset state.

After task 126, a task 128 performs a scan on CUT 18 with the aim of detecting a reflection pulse from a short in CUT 18. The scanning of CUT 18 occurs by initializing counter 77, as discussed above in connection with FIG. 6, generating an incident pulse exhibiting a pulse width specified in the pulse width variable, discussed above, and then testing the output of flip-flop 50 to detect whether comparator 65 has tripped and stopped counter 77. The preferred embodiment generates a negative-going pulse at port 15 for the incident pulse. Thus, the scanning of CUT 18 for a short condition additionally requires the setting of the slope control bit input to comparator 65 so that comparator 65 trips on positive-going signals at port 15. Moreover, the scanning of CUT 18 for a short condition requires the writing of the positive baseline amplitude, discussed above in connection with task 120 (see FIG. 5A), into D/A converter 67 to set the level at which comparator 65 trips.

After task 128 (see FIG. 7), a task 130 resets multiplexer 79 so that such "quick trips" will not disable counter 77 in future scans of CUT 18. Task 130 sets the selection inputs to multiplexer 79 to an initialized state that accommodates a "normal" scan with a short width incident pulse. Specifically, task 130 controls multiplexer 79 to route the least significant one of the two counter output bits input to multiplexer 79 to the preset input of flip-flop 62.

A task 132, performed after task 130, inquires whether the quick trip occurred. This inquiry is performed by first examining the output from flip-flop 50 to see if comparator 65 has tripped and stopped counter 77. If comparator 65 has not tripped, then the quick trip has not occurred, and program control returns to Scan Cable function 100. On the other hand, if comparator 65 has tripped, then task 132 examines the output from counter 77 to detect whether the trip occurred within the predetermined short period of time, discussed above. If a trip occurs within the predetermined short period of time, then task 132 routes program control to a task 134. Otherwise, program control returns to Scan Cable function 100.

Assuming that task 132 determines that a quick trip occurred, then task 134 repeats tasks 126-130 for approximately 100 iterations, and a task 136 then averages the scan results from the quick trips of these 100 iterations to generate an average duration for the quick trips. The large number of iterations are preformed due to the relatively low probability of detecting such shorts in any single scan. Thus, reliability in detecting such shorts improves.

After task 136, a task 138, shown in FIG. 5B, performs arithmetic calculations which translate the average count obtained from the prior scans into a number which represents the distance to the detected fault. The present invention displays this distance in either feet or meters, depending on the contents of a units variable, which is discussed below in connection with macro 950. In addition, task 138 updates the workspace and displays this distance number at display 13 (see FIGS. 1-2A) along with an appropriate legend to indicate the nature of the number, such as "SHORT at *** FEET."

Next, a task 140 inquires whether the Scan Cable function has ended. In the preferred embodiment, this inquiry examines the buffer which the background mode utilizes to communicate the occurrence of activity at keyboard 12 (see FIGS. 1-2A) to the foreground mode. Thus, a user of tester 10 causes tester 10 to exit Scan Cable function 100 by pressing a key on keyboard 12. If task 140 decides that Scan Cable function 100 should end, program control transfers to Idle mode 82. Otherwise, program control remains within Scan Cable function 100 by looping back to the beginning of Scan Cable function 100.

Referring back to FIG. 5A, when the test for close shorts routine 124 decides that no quick trips occurred in task 132, discussed above in connection with FIG. 7, program control returns to Scan Cable function 100 at a task 142. Task 142 scans CUT 18 with the aim of detecting a short in CUT 18. Thus, this scan of CUT 18 is similar to the scan of CUT 18 discussed above in connection with task 128 (see FIG. 7). However, task 142 waits a sufficient length of time to permit a reflection from a fault at a distance of approximately 10,000 feet to trip comparator 65 (see FIG. 2). In addition, task 142 operates with the selection controls of multiplexer 79 set to hold the output of flip-flop 62 at a low level until counter 77 progresses to a predetermined count so that the tripping of comparator 65 prior to the occurrence of this predetermined count will not disable counter 77. Thus, task 142 scans CUT 18 for faults at a distance greater than the distance for which faults were scanned in task 128.

The prevention of quick trips in task 142 is not a critical feature of the present invention because a reflection pulse from a short in CUT 18 exhibits a polarity opposite to the polarity of the incident pulse. Consequently, the incident pulse itself will not cause comparator 65 to trip when comparator 65 is set to look for a reflection pulse from a short. However, a task 144, which occurs after task 142, scans CUT 18 with the aim of detecting an open in CUT 18. For an open condition the reflection pulse exhibits the same polarity as the incident pulse. Thus, task 144 sets comparator 65 to trip on a negative-going signal in the preferred embodiment. The selection controls of multiplexer 79 (see FIG. 2B) are again set to hold the output of flip-flop 62 at a low level until counter 77 progresses to the predetermined count so that the tripping of comparator 65 prior to the occurrence of this predetermined count will not disable counter 77. This feature prevents the incident pulse itself from disabling counter 77. In other words, tester 10 will not permit detection of the incident pulse itself to be interpreted as an open fault in CUT 18 at a distance near to tester 10.

Next, a task 146 examines the scan results from tasks 142 and 144. Such scan results include data describing whether a tripping of comparator 65 disabled counter 77 and the count achieved by counter 77 if it was disabled. Task 146 routes program control to perform three different actions depending upon the inquiry of task 146.

If task 146 decides that counter 77 did not become disabled in either of the short or open scans of tasks 142 and 144, respectively, then a task 148 examines the pulse width variable, discussed above, to determine whether the scans of tasks 142 and 144 were performed with the short or wide incident pulse. If such scans were performed with the short pulse, attenuation characteristics of CUT 18 could possibly have diminished the amplitude of a legitimate reflection pulse sufficiently so that comparator 65 did not trip. Consequently, tester 10 repeats the open and short scans of CUT 18 using an incident pulse having a greater amount of energy than is contained in the short incident pulse to compensate for such potential attenuation.

Specifically, the pulse width variable is set to the wide pulse in a task 150, and program control returns to task 142 again. Another iteration of tasks 142, 144, and 146 is performed substantially as described above, except that the incident pulse generated by tester 10 now exhibits the wide pulse width. In addition, as a consequence of the wide pulse mode of operation, the selection inputs of multiplexer 79 are now set to route the most significant one of the two counter output bits input to multiplexer 79 to the preset input of flip-flop 62. This selection at multiplexer 79 extends the predetermined period of time during which the disabling of counter 77 is prevented.

If counter 77 does not become disabled in either of the short or open scans of tasks 142 and 144 during the wide pulse mode of operation, task 148 routes program control to a task 152. Task 152 causes display 13 (see FIGS. 1-2A) to indicate that no faults were found in CUT 18 by displaying a message such as "NO FAULTS FOUND." After task 152, program control proceeds to task 140, discussed above and shown in FIG. 5B, to exit or repeat Scan Cable function 100.

On the other hand, if the scan results from only one (not both) of the short and open scans of tasks 142 and 144 detect a fault, then task 146 routes program control to a task 154. Task 154 sets a short/open mode variable to control the slope of comparator 65 in subsequent scans so that comparator 65 will operate in the selected mode. Specifically, if only the short scan of task 142 detected the disabling of counter 77, then task 154 sets the short/open mode variable to indicate a short mode of operation. Likewise, if only the open scan of task 144 detected the disabling of counter 77, then task 154 sets the short/open mode variable to indicate an open mode of operation.

Alternatively, if the scan results from both of the short and open scans of tasks 142 and 144 detect a fault, then task 146 routes program control to a task 156. Task 156 sets the short/open mode variable in accordance with the closest one of the detected faults. Specifically, task 156 examines the final counts obtained by counter 77 when disabled in tasks 142 and 144. If the count from task 142 is less than the count from task 144 then task 156 sets the short/open mode variable to indicate the short mode of operation. Likewise, if the count from task 144 is less than the count from task 142, then task 156 sets the short/open mode variable to indicate the open mode of operation.

After either of tasks 154 or 156, a task 158 initializes a baseline duration variable. During an initial iteration of Scan Cable function 100, the baseline duration variable is set equal to the final count obtained by counter 77 in the selected one of the previous short and open scans of tasks 142 and 144. The short/open variable indicates the selected one of the previous scans. In subsequent iterations of Scan Cable function 100, the results obtained in a previous iteration are utilized to initialize the baseline duration variable.

Next, a task 160 compares the baseline duration variable against a predetermined switch point. In the preferred embodiment of the present invention, this switch point occurs at a count which represents a period of time approximately equal to 750 nanoseconds. When this switch point is exceeded by the baseline duration variable, a task 162 sets the pulse width variable, discussed above, to the wide pulse. Thus, when a detected fault in CUT 18 occurs at a distance of around 250 feet or more away from tester 10, tester 10 automatically selects the wide pulse mode of operation for improved reliability, accuracy, and precision in test results reported by tester 10.

After task 162 or when task 160 fails to determine that the above-discussed switch point has been exceeded by the baseline duration variable, a task 164, shown in FIG. 5B, sets an accumulator to an initial value, such as zero. Thus, task 164 initializes a scan loop, which Scan Cable function 100 performs next.

A task 166 of this scan loop scans CUT 18 utilizing the pulse width defined by the pulse width variable. In addition, task 166 controls the slope of comparator 65 in accordance with the short/open mode variable. After the scan of task 166, a task 168 inquires whether the results from the scan are within a predetermined tolerance of the baseline duration variable. The preferred embodiment of the present invention uses a range equal to the baseline duration ±10% for this tolerance. So long as scan results remain within this tolerance, tester 10 remains in the scan loop by performing a task 170, which adds the scan results to the accumulator.

After task 170, a task 172 examines the number of iterations performed in the scan loop to determine whether the scan loop should now end. The preferred embodiment permits a maximum of 30 iterations before ending the scan loop. However, this maximum number is not a critical parameter in the present invention so long as it remains substantially greater than three. This number is chosen in the preferred embodiment primarily to simplify the 8-bit arithmetic performed by microprocessor 24 (see FIG. 2A).

So long as the maximum number of iterations of the scan loop has not yet been reached, tester 10 remains in the scan loop by proceeding from task 172 to a task 174. Task 174 waits a predetermined period of time so that reflections present on CUT 18 may dissipate. As discussed above in connection with FIG. 3, the output impedance of tester 10 does not match the characteristic impedance of CUT 18. Consequently, reflected pulses which encounter port 15 of tester 10 are reflected at port 15 back into CUT 18. As a result, CUT 18 may experience the influence of an incident pulse generated by tester 18 for a considerable duration while the pulse reflects back and forth between a fault in CUT 18 and port 15 of tester 10. However, only a portion of the energy of an incident or reflected pulse reflects at a fault or at port 15, and the pulse eventually attenuates or dissipates. Task 174 causes the scan loop to time a subsequent scan of CUT 18 so that CUT 18 no longer experiences a significant influence from a previous scan of CUT 18. Of course, those skilled in the art will recognize that the effects of task 174 may be built into any portion of the scan loop, and that task 174 takes into account the time required for tester 10 to perform tasks 168, 170, and 172, which tasks occur after a scan of CUT 18. After task 174, the scan loop repeats at task 166.

Either of inquiry tasks 168 or 172 may cause the scan loop to end. Task 168 ends the scan loop when out-of-tolerance scan results are detected. Task 172 ends the scan loop when the maximum number of iterations for the scan loop have been reached. When the scan loop ends, a task 176 calculates an average duration from the sum of scan results contained in the accumulator and from tee number of iterations actually performed by the scan loop. In addition, task 176 adds a predetermined offset value to this average duration, which is in the range of ±10 counts of counter 77 for the preferred embodiment. This offset compensates for any mismatch in the propagation delay of cable interface 23 (see FIG. 2B) between the signal path which generates the incident signal pulse transmitted at port 15 and the signal path which enables counting by counter 77. Consequently, accuracy improves in describing a distance, which tester 10 calculates and reports in subsequent steps, to a fault in CUT 18.

After task 176, a task 178 saves the average calculated above in task 176 for use in updating the baseline duration variable in a subsequent performance of task 158, discussed above. Consequently, a subsequent iteration of the Scan Cable function utilizes the average count obtained from a prior iteration of the Scan Cable function as the new baseline duration.

Next, tester 10 performs a task 180, which inquires whether tester 10 is currently operating in a mode in which the amplitude of the reflected pulse is displayed. This inquiry examines an amplitude display variable, which is set in accordance with the procedure specified in macro 930, discussed below. When this mode of operation is specified, a task 182 performs a successive approximation routine similar to the one discussed above in connection with task 102 and illustrated in FIG. 6. For task 182, the successive approximation routine performs a scan of CUT 18 while performing the successive approximation. However, in task 182 the successive approximation does not add wait states so that the routine executes as quickly as possible. In addition, the successive approximation performs only a single successive approximation loop in accordance with the state of the short/open mode variable. Consequently, the successive approximation results obtained in task 182 represent the peak value of the reflection pulse monitored by tester 10.

After task 182, a task 184 translates the successive approximation results from task 182 into parameters which define a bar graph. This bar graph is displayed in task 138, discussed above, which tester 10 performs after task 182. In the preferred embodiment, the lower line of display 13 (see FIGS. 1-2A) displays this bar graph. The bar graph is configured so that display 13 shows 16 ">" characters when a maximum amplitude reflected pulse is detected by task 182, and a no ">" characters (i.e. a blank line) when task 182 detects a minimal amplitude reflected pulse. Of course, the number of ">" characters displayed varies in accordance with the relationship between an actual reflected pulse amplitude and the above-discussed extremes. Consequently, tester 10 provides a user with a graphical indication of the transmission quality of CUT 18. A larger displayed bar indicates a lower-attenuation, better quality medium for the transmission of electrical signals. On the other hand, a smaller displayed bar indicates a higher-attenuation cable which is more easily influenced by external noise in a given set of circumstances. Moreover, the use of a graphical indicator frees the user from interpreting attenuation data which might otherwise be presented using numerals.

As discussed above, task 138 translates count data into distances, updates the workspace, and controls display 13 in accordance with the previously performed iteration of Scan Cable function 100. Task 138 is performed after task 184 or after task 180, when the reflected pulse amplitude display mode of operation is not enabled. After task 138, program control proceeds to task 140 to decide whether to repeat or exit Scan Cable function 100.

As discussed above in connection with FIG. 4, a user of tester 10 may instruct tester 10 to perform any one of several functions and macros, of which Scan Cable function 100 represents only one. Print function 200 represents another function, and FIG. 8 presents a flow chart which illustrates the types of tasks performed by tester 10 during Print function 200. Print function 200 outputs data stored within tester 10 so that such data may be printed, displayed, or stored at a computer device, such as a printer or personal computer, placed in data communication with tester 10 at serial port 19 (see FIGS. 1-2A).

With reference to FIG. 8, in a task 202, tester 10 outputs a series of data bytes, coded in accordance with the ASCII standard, which serve as a header string for data subsequently output. This header string represents constant data which identifies tester 10 and the operational data which will be subsequently output. In addition the header string may advantageously include column titles, units of measurement, scale identifiers, and the like, to aid in interpreting the subsequently output data.

After task 202, a task 204 formats the test data contained in the workspace for output. In addition, task 204 may advantageously include header or legend information to make the test data easily readable. Moreover, the formatting additionally contemplates the translation of numerical data into an appropriate graphical format so that the output, when printed or displayed, provides a graphical indication of test data.

Next, a task 206 outputs the data formatted during task 204, and a task 208 repeats the formatting and outputting tasks 202-206 until all data in the workspace has been transmitted at serial port 19. After task 208, program control returns to Idle mode 82.

FIG. 9 presents a flow chart which illustrates the types of tasks performed by tester 10 during Resistance function 300 and during Continuity function 600. Functions 300 and 600 both perform a resistance measurement of CUT 18 or of a terminator (not shown) and display the results of the measurement. Of course, those skilled in the art understand that resistance and continuity provide inverse characterizations of a single electrical parameter. Thus, Resistance function 300 has many features which are similar to the features of Continuity function 600. Accordingly, functions 300 and 600 are discussed together herein.

As shown in FIG. 9, a task 302 controls the state of the first relay control bit at line 69 (see FIG. 2B) so that relay 55 couples port 15 to the input of bridge circuit 64 and so that relay 57 couples the output of bridge circuit 64 to the non-inverting input of comparator 65. As a result, bridge circuit 64 monitors CUT 18, and comparator 65 monitors the output of bridge circuit 64 rather than port 15.

After task 302, a task 304 causes tester 10 to wait a predetermined period of time before proceeding to a task 306. This wait allows relays 55 and 57 and bridge circuit 64 to stabilize. In task 306, tester 10 performs a successive approximation routine, similar to Successive Approximation routine 102, discussed above and illustrated in FIG. 6. During task 306, the successive approximation routine does not simultaneously allow an incident pulse to be transmitted from tester 10, nor does task 306 wait appreciable amounts of time during the successive approximation loop. Furthermore, task 306 performs only a single iteration of the successive approximation loop over the full scale of D/A converter 67. As a result of this successive approximation routine, task 306 obtains an 8-bit number representing a voltage amplitude at which the output from D/A converter 67 approximates the voltage output from bridge circuit 64. This number is proportional to the resistance monitored by bridge circuit 64 in a manner well-known to those skilled in the art.

Next, a task 308 repeats the successive approximation routine of task 306 until a total of 10 successive approximation iterations have occurred. After task 308, a task 310 averages the results from the 10 successive approximation iterations to obtain a single, reliable number which is proportional to the measured resistance.

The procedures followed by tester 10 during Resistance function 300 and Continuity function 600 differ after task 310 depending on whether Resistance function 300 or Continuity function 600 is being performed. After task 310 during Resistance function 300, a task 312 translates the number obtained in task 310 into a numerical resistance value, updates the workspace so that the resistance value may be included with other test data, and operates display 13 to display an appropriate legend along with the resulting resistance number. Bridge circuit 64 in the preferred embodiment is configured so that this resistance number is less than 25 ohms.

After task 310 during Continuity function 600, a task 612 updates the workspace and translates the average number obtained during task 310 into parameters which describe a bar graph. The preferred embodiment translates a resistance value of around zero ohms into a bar graph having 16 ">" characters and translates a resistance value of around 25 ohms into a blank display, or a bar graph having no ">" characters. Resistance values between 0 and 25 ohms produce a bar graph having 16 or fewer ">" characters, the precise number of which is proportional to the resistance in accordance with the above-discussed extremes. Task 612 then displays this bar graph at display 13.

Tester 10 additionally emits an audible indication of continuity during Continuity function 600 in accordance with parameters established during task 612. Specifically, task 612 establishes parameters for the operation of buzzer 32 (see FIG. 2A) so that a constant tone results from a resistance of around 12 ohms or less and silence results from a resistance of around 23 ohms or more. In addition, the present invention saves past measured values and compares current resistance measurements against such past values. When a reduction in resistance to a value less than 23 ohms is detected, task 612 establishes parameters so that buzzer 32 will emit a single "beep."

This audible indication of continuity is advantageous because a user of tester 10 may wiggle connectors, terminators, or CUT 18 itself while listening to the audible indications supplied by tester 10. The user need not look at display 13 to learn the measured resistance or continuity value, and the user need not interpret whether a given value is acceptable or unacceptable. Rather, the user need only arrange CUT 18, including connectors and terminators coupled thereto, while listening for tester 10 to "beep."

After tasks 312 or 612, a task 314 inquires whether the function should end or repeat. In the preferred embodiment, the function continually repeats until a user of tester 10 presses any key, in a manner similar to that discussed above in connection with task 140 (see FIG. 5B). When task 314 does not detect the end of the function, the function repeats at task 306. On the other hand, when task 314 encounters the end-of-function event, a task 316 controls the state of the first relay control bit at line 69 (see FIG. 2B) so that relays 55 and 57 return to an initialized state wherein tester 10 is set-up for Scan Cable function 100. After task 316, program control returns to Idle mode 82.

FIG. 10 presents a flow chart which illustrates the types of tasks performed by tester 10 during Scope function 400. Generally, during Scope function 400 tester 10 continually generates incident signal pulses at port 15 without processing data related to monitoring reflected pulses. A LAN-skilled person may then connect an oscilloscope to CUT 18 using connector 17 (see FIG. 1) and view incident and reflection signal timing, amplitudes, and shapes on an oscilloscope.

As shown in FIG. 10, a task 402 causes display 13 to instruct the user to press a key on keypad 12 (see FIG. 1) and thereby select a pulse width which tester 10 will use during Scope function 400. The instructions may, for example, instruct the user to press key 1 for a short pulse or key 2 for a wide pulse. Task 402 waits for the user's response, then proceeds to a task 404, which sets the pulse width variable, discussed above, in accordance with the selection made in task 402.

After task 404, a task 406 causes tester 10 to transmit at port 15 an incident pulse having the width specified by the pulse width variable. This task differs from the scan cable tasks discussed above n connection with Scan Cable function 100 because tester 10 pays no attention to whether comparator 65 trips or whether counter 77 becomes disabled as a result of reflections from the incident pulse.

Next, a task 408 inquires whether to end Scope function 400. As discussed above, the preferred embodiment accomplishes this inquiry by detecting whether any key has been pressed. If task 408 determines that Scope function 400 should now end, program control simply transfers back to Idle mode 82. However, if task 408 determines that Scope function 400 should continue, a task 410 next waits a predetermined period of time before repeating a scope loop by returning program control to task 406. In the preferred embodiment, 50 microseconds transpires between successive incident pulses. Consequently, task 410 waits a sufficient period of time so that the next incident pulse occurs around 50 microseconds after the previous incident pulse.

FIG. 11 presents a flow chart which illustrates the types of tasks performed by tester 10 during a Noise Level function 500. Noise Level function 500 generally detects a peak-to-peak noise level present at port 15, and reports the measured noise level to the user of tester 10. Moreover, Noise Level function 500 reports the measured noise level both visually and audibly.

Referring to FIG. 11, a task 502 performs a successive approximation routine which is similar to the successive approximation routine discussed above in connection with task 102 and illustrated in FIG. 6. For task 502 the successive approximation does not allow tester 10 to generate an incident signal pulse. However, for task 502, the successive approximation routine operates slowly, as discussed above in connection with task 108 (see FIG. 6). Specifically, task 502 causes each iteration of the successive approximation loop to require on the order of 15–25 milliseconds. This 15–25 millisecond period is sufficiently long so that substantially a full cycle, including the peaks thereof, of a 50–60 Hz noise signal may be experienced at port 15. Accordingly, the slowness of task 502 allows tester 10 to detect a common and pervasive type of noise which is caused by public power distribution lines. In addition, task 502 performs both positive and negative iterations of the successive approximation loop so that task 502 obtains positive and negative amplitude values which correspond to the signals present at port 15.

After task 502, a task 504 translates the amplitude values obtained during task 502 into a form suitable for output to display 13, and causes display 13 to visually indicate the measured peak-to-peak noise level. This visual display takes the form of a number which describes the peak-to-peak noise.

A task 506, which occurs after task 504, compares the noise value to low and high noise buzzer threshold variables. These threshold variables are established in accordance with the procedure discussed below in connection with macro 940. Generally speaking, the low noise buzzer threshold variable defines the noise level below which tester 10 will remain silent, and the high noise buzzer threshold variable defines the noise level above which tester 10 will emit a constant tone from buzzer 32 (see FIG. 2A). In a manner similar to that discussed above in connection with task 612 of Continuity function 600, task 506 sets an on-time parameter for the operation of buzzer 32 in accordance with the measured noise level when this noise level is between the low and high noise buzzer threshold variables. Thus, tester 10 emits "beeps" to audibly indicate the noise level measured at port 15.

This audible indication of the noise level is advantageous because a user of tester 10 may move and arrange the physical location of wires while listening to the audible indications supplied by tester 10. The user need not look at display 13 to learn the measured noise level, and the user need not interpret whether a given noise level is acceptable or unacceptable. Rather, the user need only arrange the physical location of CUT 18 so that tester 10 emits as few beeps as possible.

After task 506, a task 508 inquires whether to end Noise Level function 500. As discussed above, the end of the function occurs in the preferred embodiment when the user presses any key. When task 508 detects the end-of-function event, program control returns to Idle mode 82. However, until task 508 detects the end-of-function event, program control remains within Noise Level function 500 by transferring from task 508 back to task 502.

Figures 12, 13:
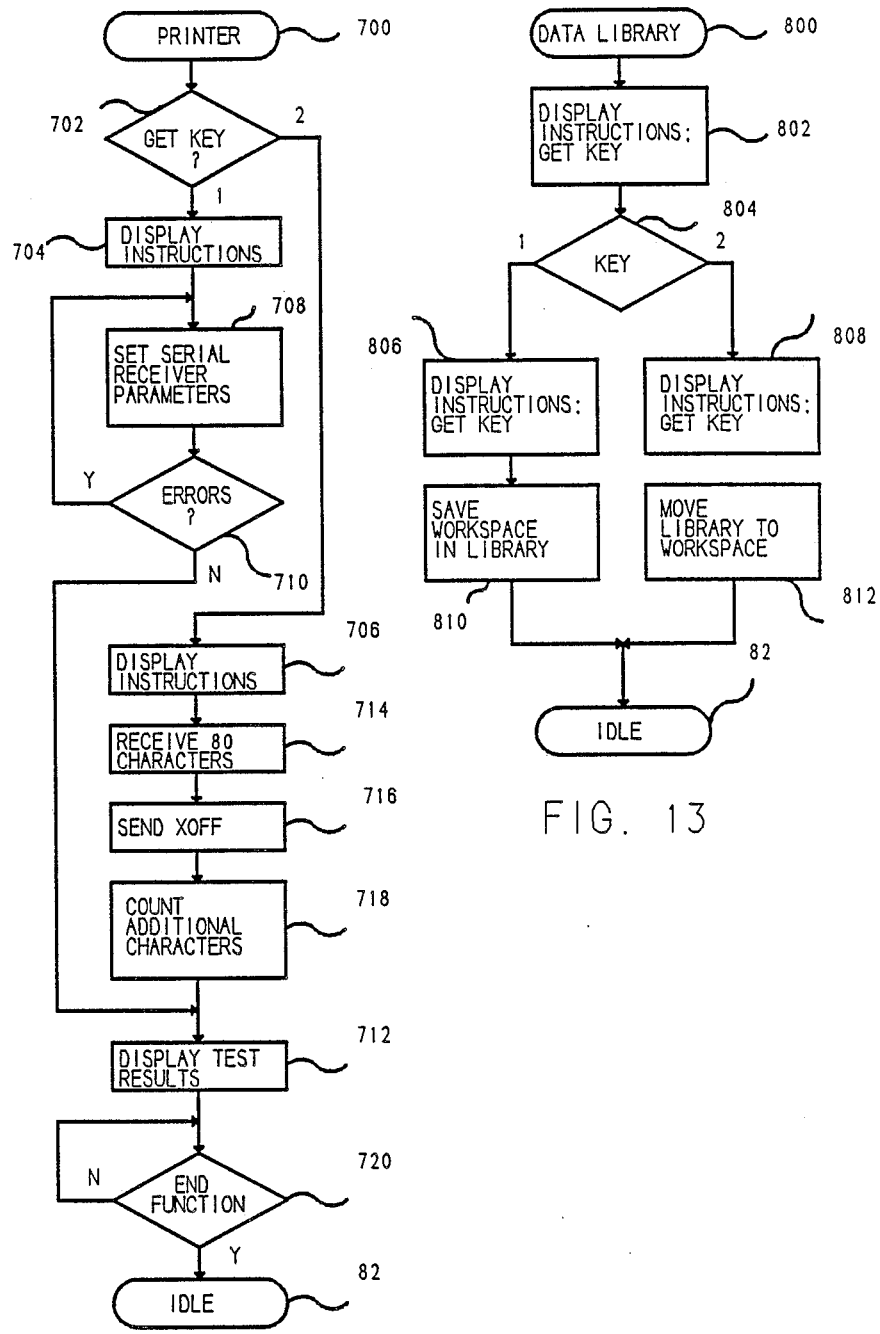
FIG. 12 is a flow chart which illustrates the types of tasks performed by the present invention during a Printer function.
FIG. 13 is a flow chart which illustrates the types of tasks performed by the present invention during a Data Library function.

FIG. 12 presents a flow chart which illustrates the types of tasks performed by tester 10 during Printer function 700. Generally, during Printer function 700 tester 10 monitors serial port 19 (see FIGS. 1–2A) to perform baud rate or XON/XOFF testing of an RS-232 communications link with a computer device coupled to tester 10 at serial port 19. As shown in FIG. 12, a task 702 causes display 13 to instruct the user to press a key on keypad 12 (see FIG. 1) and thereby select whether to perform baud rate testing or XON/XOFF testing. The instructions may, for example, instruct the user to press key 1 for baud rate testing or key 2 for XON/XOFF testing. Task 702 waits for the user's response, then transfers program control to a task 704 if baud rate testing has been indicated or to a task 706 if XON/XOFF testing has been indicated. Tasks 704 and 706 both cause display 13 to instruct the user to send any file of data toward tester 10 at serial port 19. Thus, after tasks 704 and 706, serial port 19 should be receiving data.

After task 704, microprocessor 24 (see FIG. 2A) sets receive data parameters, such as baud rate, stop bits, and parity, for UART 25 in a task 708. After task 708, a task 710 causes microprocessor 24 to inquire whether UART 25 has detected any errors in received data. If errors have been detected, then the proper parameters have not been set in UART 25, and tasks 708 and 710 are repeated until task 710 fails to detect the occurrence of errors. Of course, each iteration of task 708 sets a different receive data parameter for UART 25. Consequently, all possible receive data parameters for UART 25 will eventually be attempted unless no errors are detected by task 710. When task 710 detects no received data errors at UART 25, program control proceeds to a task 712.

After task 706, microprocessor 24 allows UART 25 to receive approximately 80 characters, as indicated in a task 714. Next, in a task 716, microprocessor 24 causes UART 25 to transmit an ASCII XOFF character at serial port 19. Following task 716, a task 718 counts the additional characters received by UART 25 through serial port 19 after the transmission of the XOFF character, and then program control proceeds to task 712.

Task 712 displays the results of the prior serial port testing at display 13. When baud rate testing has been conducted, display 13 indicates the discovered baud rate. When XON/XOFF testing has been conducted, display 13 indicates the number of additional characters received after transmission of the XOFF character. This number should be around 3 or less if the computer device coupled to serial port 19 has the XON/XOFF protocol correctly installed.

After task 712, a task 720 inquires whether to exit Printer function 700. In the preferred embodiment, an exit from Printer function 700 occurs after a user of tester 10 presses any key. Upon exiting Printer function 700, program control returns to Idle mode 82. However, when an end-of-function event has not yet been detected in task 720, task 720 simply loops back on itself so that the test results will remain on display 13.

FIG. 13 presents a flow chart which illustrates the types of tasks performed by tester 10 during Data Library function 800. Generally, during Data Library function 800 the contents of the workspace may be either saved in a dedicated portion of RAM 34 (see FIG. 2A) or updated with data previously saved in this dedicated portion of RAM 34. Data Library function 800 operates in conjunction with Print function 200, discussed above in connection with FIG. 8. As discussed above, Print function 200 causes the contents of the workspace to be printed at serial port 19 (see FIGS. 1–2). Thus, a test run whose results are contained in the workspace may be stored in a data library so that the test run may be printed at a later time. In the meantime, additional test runs may be performed or tester 10 may be powered-down and transported to a location where a printer or other computer device is located.

With reference to FIG. 13, a task 802 causes display 13 to instruct the user to press a key on keypad 12 (see FIG. 1) and thereby select whether to store the workspace into a data library or to retrieve a data library into the workspace. The instructions may, for example, instruct the user to press key 1 to save the workspace or key 2 to retrieve a data library into the workspace. Task 802 waits for the user's response, then transfers program control to a task 804 to examine the entered key. If the user has selected to save the workspace, then program control transfers to a task 806. If the user has selected to retrieve a data library into the workspace, then program control transfers to a task 808. Tasks 806 and 808 both cause display 13 to instruct the user to press the key corresponding to the number of a data library selected for use in connection with Data Library function 800. Then, tasks 806 and 808 each wait until the user has entered a selection. The preferred embodiment of the present invention reserves nine segments of RAM 34 for use as data libraries. Consequently, the user is requested to press one of keys 12.1–12.9 (see FIG. 1) to indicate a single, unique data library.

After task 806, tester 10 transfers data from the workspace into the indicated portion of RAM 34 in a task 810. Conversely, after task 808 tester 10 transfers data from the indicated portion of RAM 34 to the workspace in a task 812. After either of tasks 810 and 812, program control returns to Idle mode 82.

Figures 14, 15:
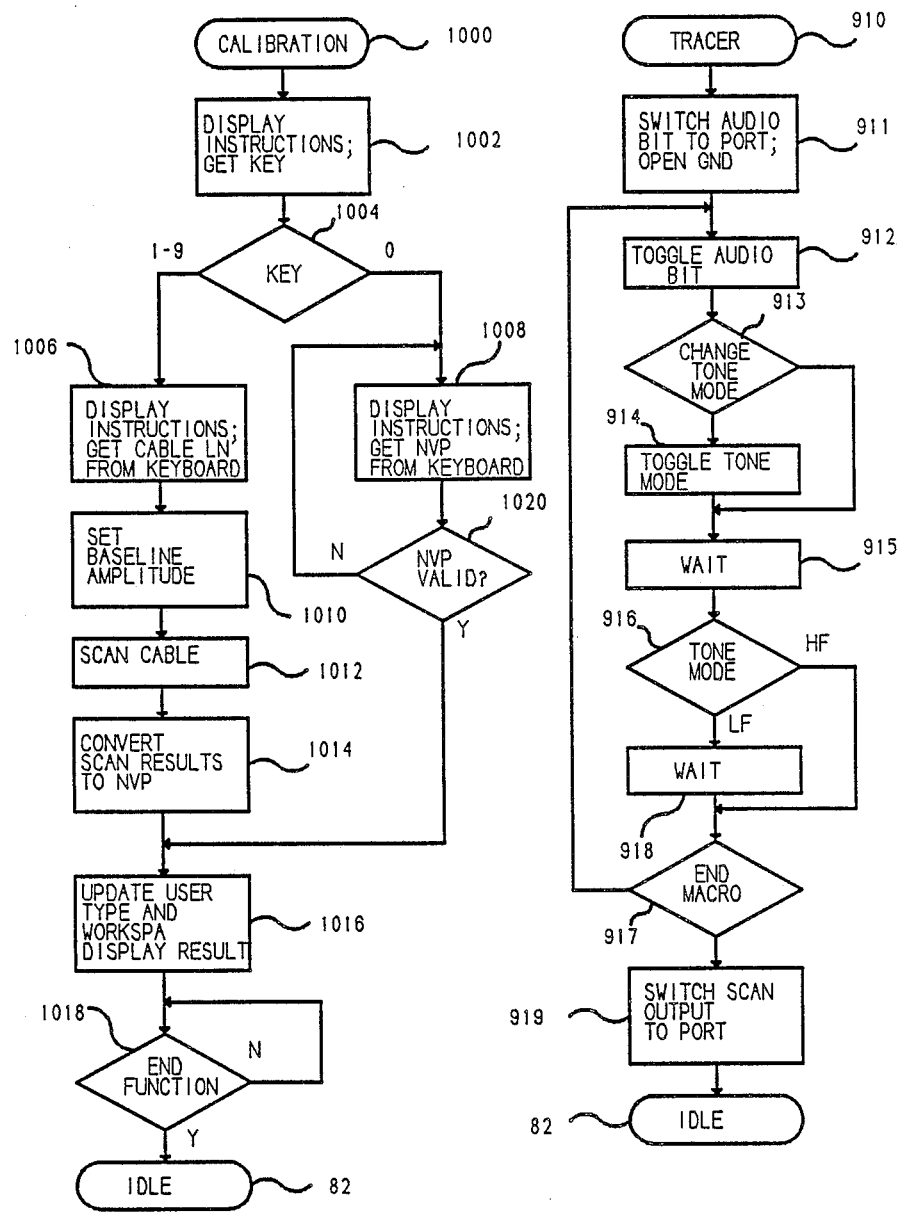
FIG. 14 is a flow chart which illustrates the types of tasks performed by the present invention during a Calibration function.
FIG. 15 is a flow chart which illustrates the types of tasks performed by the present invention during a Tracer macro.

FIG. 14 presents a flow chart which illustrates the types of tasks performed by tester 10 during Calibration function 1000. During Calibration function 1000, the user of tester 10 enters data which describe an NVP parameter. Calibration function 1000 permits such data to be entered in two different forms. In one form tester 10 calculates the NVP parameter from a sample cable of known length. In another form, tester 10 receives a number which it regards as the NVP from keypad 12 (see FIG. 1).

As shown in FIG. 14, a task 1002 causes display 13 to instruct the user to press a key on keypad 12 and thereby select whether to calculate an NVP using scan results from a sample cable or to accept an NVP directly from keypad 12. The instructions may, for example, instruct the user to press keys 12.1-12.9 (see FIG. 1) to obtain the NVP from a sample cable or key 12.0 to accept the NVP directly from keypad 12. If the user enters one of keys 12.1-12.9, then such an entry is additionally interpreted as indicating the one of user types 1-9, discussed above in connection with task 89 of FIG. 4, in which to store the NVP. Task 1002 waits for the user's response, then transfers program control to a task 1004 to examine the entered key. If the user has decided to obtain the NVP from a sample cable, then program control transfers to a task 1006. If the user has decided to directly enter the NVP on keyboard 12, then program control transfers to a task 1008.

Tasks 1006 and 1008 both cause display 13 to instruct the user to enter a number, and both of tasks 1006 and 1008 wait until the number has been completely entered. Specifically, task 1006 instructs the user to enter a number corresponding to the length of the sample cable from which the NVP will be calculated. Typically, this cable length should be as long as possible to obtain accurate results, and preferably at least 50 feet long. The sample cable is to be attached at one end thereof to port 15 (see FIGS. 1-2A) of tester 10, and the opposing end of the sample cable remains either open or shorted. Moreover, task 1006 interprets the units associated with the entered number as being either feet or meters in accordance with the state of the units variable, which is set in macro 950, discussed below.

After task 1006, a task 1010 sets a baseline amplitude for use in a subsequent TDR scan of the sample cable. Task 1010 is similar to task 120, discussed above in connection with Scan Cable function 100 (see FIG. 5A). However, since the sample cable is typically not used in an operational LAN, a constant, predetermined amplitude may be used for the baseline amplitude rather than establishing the baseline amplitude with reference to amplitude measurements of signals currently present at port 15 (see FIGS. 1-2A).

After task 1010, a task 1012 performs a TDR scan of the sample cable. The scan conducted in task 1012 is similar to the scans discussed above in connection with Scan Cable function 100. Thus, task 1012 produces a scan result which represents a count from counter 77 (see FIG. 2B), and this count describes the time required for an incident pulse to reflect at the end of the sample cable which opposes tester 10 and propagate back to tester 10 as a reflected pulse.

Next, a task 1014 converts the scan results into the NVP using a formula similar to the following:

$$NVP = 2*L/T*C \qquad \text{Eq. 1}$$

where:

L is the length of the sample cable;
T is the time measured in the TDR scan; and
C is the speed of light.

After the NVP has been calculated by task 1014, a task 1016 updates the workspace and the user type indicated above in tasks 1002-1004 with this newly calculated NVP. In addition, in task 1016 tester 10 displays this NVP at display 13. Next, a task 1018 inquires whether to end Calibration function 1000. As discussed above in connection with other functions, the preferred embodiment terminates Calibration function 1000 when the user presses any key on keyboard 12. The termination of Calibration function 1000 causes program control to proceed back to Idle mode 82. However, as long as the user does not press a key on keyboard 12, task 1018 loops back on itself so that the data shown on display 13 will remain displayed.

Referring back to task 1008, which tester 10 utilizes when a user wishes to directly enter an NVP, program control remains in task 1008 until the user enters a two-digit number on keyboard 12. After this event occurs, a task 1020 examines the entered data to see if it is within reasonable limits for an NVP. Specifically, task 1020 inquires whether this data is within the range of 50-99. If the entered data is out of range, program control loops back to task 1008 so that a valid number may be entered. In addition, tester 10 may advantageously emit a "beep" so that the user is audibly informed that the previously entered data is out-of-range. On the other hand, if task 1020 determines that the entered data is within range, then such data is interpreted as a percentage, and program control proceeds to task 1016, discussed above.

As discussed above in connection with FIG. 4, Macro function 900 is one of the functions performed by tester 10. Furthermore, Macro function 900 generally represents a software switch which routes program control to a specified macro. FIG. 15 presents a flow chart which illustrates the types of tasks performed by tester 10 during Tracer macro 910. Generally, Tracer macro 910 supplies an audio signal to CUT 18 as an aid in detecting the precise location of CUT 18. When CUT 18 is installed in a building or other location as part of a LAN, CUT 18 typically resides within walls, above ceilings, under carpets, and the like. Thus, locating CUT 18 becomes a significant problem when the user troubleshoots CUT 18. Tracer macro 910 operates in conjunction with a tracer device 1100, which is described below in connection with FIG. 16.

As shown in FIG. 15, a task 911 sets the first and second relay control bits presented to cable interface 23 (see FIG. 2B) on lines 69 and 70 so that relay 55 couples audio signal driver 60 to signal terminal 58 of port 15 and so that reference terminal 72 of port 15 is open. Next, tester 10 enters a tracer loop at a task 912, which toggles the ready/audio control bit presented at line 59 (see FIG. 2B) In other words, if the ready/audio control bit is initially high, task 912 simply sets it low, and vice-versa. This change in the state of the ready/audio control bit is transmitted to CUT 18 at port 15.

After task 912, a task 913 inquires whether a tone mode of operation should be changed at the then-current time. Tracer macro 910 supplies the audio signal as a tone which alternates between a high frequency and a low frequency at a predetermined rate. The user of tester 10 listens for the audio signal with tracer device 1100. Thus, the use of the alternating tones makes the audio signal distinctive and easily identified by the user.

Accordingly, task 913 inquires whether to change between high and low frequency tone modes of operation. If task 913 decides to change tone modes, program control proceeds through a task 914 to a task 915. However if task 913 decides not to change tone modes, program control proceeds directly to task 915.

Task 914 toggles a tone mode variable from high to low or vice-versa. In task 915, tester 10 waits a predetermined period of time. The preferred embodiment of the present invention supplies an approximately 6000 Hz high frequency audio signal and an approximately 3000 Hz low frequency audio signal. Thus, the 6000 Hz signal cycles through positive and negative polarities of the signal in approximately 167 microseconds and cycles through only one of the positive and negative polarities in approximately 83 microseconds. The wait imposed by task 915 is a little less than approximately one-half of a cycle for the high frequency signal, or a little less than approximately 83 microseconds in the preferred embodiment.

After task 915, a task 916 examines the tone mode variable to determine if tester 10 is then-currently operating in the high or low frequency mode. If task 916 detects operation in the high frequency mode, then the ready/audio control bit needs to be toggled again, and program control proceeds to a task 917. On the other hand, if task 916 detects current operation in the low frequency mode, then tester 10 must wait an additional period of time before toggling the ready/audio control bit, and program control proceeds to a task 918.

Task 918 imposes another wait in the tracer loop. Since the frequency of the low frequency signal in the preferred embodiment is approximately one-half that of the high frequency signal, the wait imposed by task 918 is approximately the same as the wait imposed by task 915, discussed above. After task 918 causes tester 10 to wait the allotted period of time, the ready/audio control bit needs to be toggled again for the low frequency mode of operation, and program control proceeds to task 917.

Task 917 inquires whether to exit Tracer macro 910 before routing program control back to task 912. Tracer macro 910 ends when a user presses any key on keyboard 12 (See FIG. 1). When this ending event occurs, a task 919 returns the relay control bits to their initial states, which prepare tester 10 for Scan Cable function 100 (see FIGS. 5A–5B).

FIG. 16 shows a block diagram of tracer device 1100, which the user of tester 10 utilizes with Tracer macro 910 to locate CUT 18. Specifically, FIG. 16 shows a high-gain amplifier 1102 having a signal input coupled to an antenna 1104. In the preferred embodiment, antenna 1104 is formed from a wire which is between a few inches and a couple of feet in length. An output of amplifier 1102 couples to an input of a speaker 1110. A power input to amplifier 1102 couples through a switch 1106 to a first output of a battery 1108. A second output of battery 1108 and a ground terminal of amplifier 1102 couple together.

In the preferred embodiment, switch 1106 is spring biased to remain in an open configuration unless specifically depressed. Thus, a user of tracer device 1100 must continually depress switch 1106 in order for amplifier 1102 to be energized and for tracer device 1100 to operate. As a result, tracer device 1100 cannot inadvertently be left energized, and the life of battery 1108 is extended.

While tester 10 performs Tracer macro 910, reference terminal 72 of port 15 is open (see FIG. 2B), causing a shield or reference conductor of CUT 18 to become ungrounded. Consequently, CUT 18 operates as an antenna which radiates a portion of the energy contained in the audio signal feed into CUT 18. This radiated energy inductively couples into antenna 1104 of tracer device 1100 when tracer device 1100 is moved within a few feet of CUT 18. The audio signal is amplified in amplifier 1102 and presented at speaker 1110 so that it may be heard by the user. Accordingly, CUT 18 may be found within walls, above ceilings, under carpets, and the like, by moving tracer device 1100 near such fixtures and listening for the audio signal. This audio signal becomes louder as tracer device 1100 moves nearer to CUT 18.

Figures 17, 18, 19, 20, 21, 22:
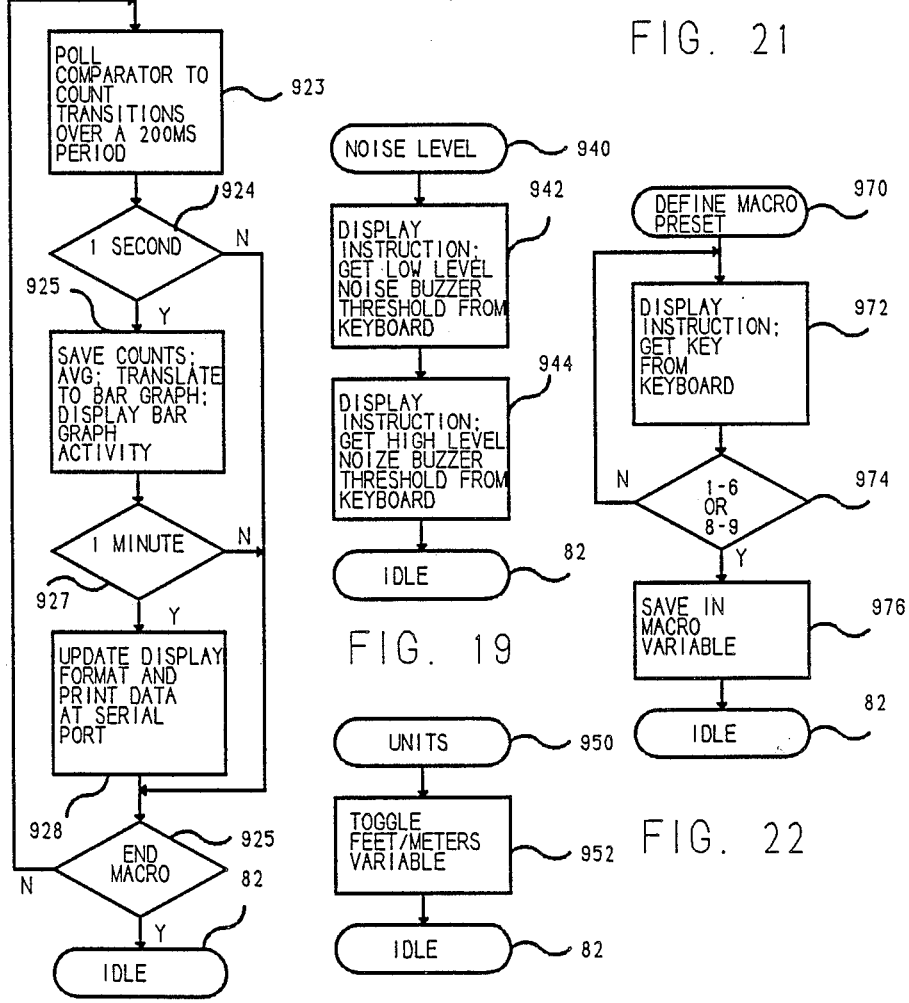
FIG. 17 is a flow chart which illustrates the types of tasks performed by the present invention during a Monitor macro.
FIG. 18 is a flow chart which illustrates the types of tasks performed by the present invention during an Amplitude Display macro.
FIG. 19 is a flow chart which illustrates the types of tasks performed by the present invention during a Noise Level macro.
FIG. 20 is a flow chart which illustrates the types of tasks performed by the present invention during a Units macro.
FIG. 21 is a flow chart which illustrates the types of tasks performed by the present invention during a Print Configuration macro.
FIG. 22 is a flow chart which illustrates the types of tasks performed by the present invention during a Define Macro Preset macro.

FIG. 17 presents a flow chart which illustrates the types of tasks performed by tester 10 during Monitor macro 920. Generally, Monitor macro 920 operates while a LAN network of which CUT 18 is a part carries data traffic. Monitor macro 920 measures the data activity on CUT 18 without instigating activity of its own. Moreover, Monitor macro 920 processes and presents the activity data to the user of tester 10.

As shown in FIG. 17, a task 921 causes display 13 to instruct the user to enter a number which will be interpreted as a time of day. Task 921 then waits until the user enters a number and initializes an internal clock using the entered number. After task 921, a task 922 writes a threshold value to D/A converter 67 (see FIG. 2B). This threshold value causes D/A converter 67 to generate a comparison amplitude which comparator 65 utilizes in monitoring network activity. In the preferred embodiment, this comparison amplitude is around $-0.5$ volts.

Next, a task 923 continually polls the outputs from comparator 65 which couple to controller interface 44 (see FIG. 2B). This continued polling operation persists for around 200 milliseconds, and task 923 counts the number of transitions observed in the outputs of comparator 65 during task 923. A transition occurs each time the amplitude of the signals monitored at port 15 cross over the threshold amplitude set above in task 922.

After task 923, a task 924 inquires whether a one-second point in time has occurred. If this one-second point has not yet occurred, then Monitor macro 920 need not update display information, and program control proceeds directly to a task 925. Task 925 inquires whether to end Monitor macro 920, and loops program control back to task 923 until it determines that Monitor macro 920 should end. On the other hand, if task 924 determines that the one-second point has been reached, a task 926 processes activity data obtained in previous iterations of task 923 for presentation to the user.

Specifically, task 926 averages the count data from several of the prior iterations of task 923 to obtain an average activity number. In the preferred embodiment, this average encompasses the prior 15 iterations of task 923. Task 926 translates this number into a second number which is logarithmicly related to the average number of transitions and displays the second number at display 13 along with a legend, which identifies the second number as representing a one-second average.

In addition, task 926 translates this second number into parameters which control a bar graph and causes display 13 to display the resulting bar graph. In the preferred embodiment of the present invention, the bar graph produced in Monitor macro 920 is a single character bar graph in which the number of lines in the single character increases as the value of the second number increases. Thus, a short vertical bar appears at display 13 when tester 10 detects only a little network activity at port 15, and a tall vertical bar appears when tester 10 detects a substantial amount of network activity.

After task 926, a task 927 inquires whether a one-minute point in time has occurred. If this one-minute point has not yet occurred, Monitor macro 920 need not update additional display information, and program control proceeds to a task 925. However, if task 927 determines that a one-minute point has been reached, then a task 928 processes the one-second data accumulated over the previous minute to produce one-minute data. Specifically, task 928 averages the one-second numbers displayed above in task 926 for the previous minute to produce an average of network activity over the previous minute. Then, task 928 formats and displays this one-minute average with an appropriate legend identifying it as such.

In addition, task 928 formats the one-minute data for output at serial port 19 (See FIGS. 1-2A) so that it may be printed or saved at an external computer device. A current value form the clock, initialized above in task 921, is also output to identify the time of day to which the output activity report applies. Moreover, in the preferred embodiment, the one-minute data is formatted as a bar graph so that once each minute serial port 19 outputs a single line of data that includes the time of day and a bar which graphically indicates network activity over the preceding minute.

After task 928, program control proceeds to task 925, which inquires whether to end Monitor macro 920. Monitor macro 920 ends when task 925 determines that a key on keyboard 12 (see FIG. 1) has been pressed. When task 925 makes the determination to end Monitor macro 920, program control returns to Idle mode 82.

FIG. 18 presents a flow chart which illustrates the types of tasks performed by tester 10 during Amplitude Display macro 930. As shown in FIG. 18, a task 932 simply toggles the amplitude display variable, then program control proceeds to Idle mode 82. As discussed above in connection with tasks 180-184 of Scan Cable function 100 (see FIG. 5B), tester 10 uses the amplitude display variable to enable and disable the bar graph display which describes the amplitude of reflected pulses during Scan Cable function 100. Thus, tester 10 performs Amplitude Display macro 930 to enable a disabled bar graph, and vice-versa.

FIG. 19 presents a flow chart which illustrates the types of tasks performed by tester 10 during Noise Level macro 940. As shown in FIG. 19, a task 942 causes display 13 to instruct the user to enter a number which identifies a low noise buzzer threshold, and task 942 waits until this number has been completely entered. Next, a task 944 causes display 13 to instruct the user to enter a number which identifies a high noise buzzer threshold, and task 944 waits until this number has been completely entered. Noise Level macro 940 interprets the numbers entered in tasks 942 and 944 as representing millivolts, and the low and high noise buzzer threshold variables are set accordingly. As discussed above in connection with task 506 of Noise Level function 500 (see FIG. 11), the low and high noise threshold variables specify the operation of the audible "beeps" emitted by tester 10 during function 500. Thus, the user of tester 10 utilizes Noise Level macro 940 to set the noise level below which tester 10 remains silent during function 500 and to set the noise level above which tester 10 emits a continuous tone during function 500. After task 944, program control returns to Idle mode 82.

FIG. 20 presents a flow chart which illustrates the types of tasks performed by tester 10 during Units macro 950. As shown in FIG. 20, a task 952 toggles the units variable, then program control proceeds to Idle mode 82. As discussed above in connection with task 138 of Scan Cable function 100 (see FIG. 5B) and task 1006 of Calibration function 1000 (see FIG. 14), tester 10 uses the units variable to determine whether tester 10 operates with distances expressed in feet or in meters. Thus, tester 10 performs Units macro 950 to switch between operating modes in which distances are expressed as feet or meters.

FIG. 21 presents a flow chart which illustrates the types of tasks performed by tester 10 during Print Configuration macro 960. As shown in FIG. 21, a task 962 formats current default values used by tester 10 for printing and outputs such default values at serial port 19 (see FIGS. 1-2A). After task 962, program control proceeds to Idle mode 82. These default values include data describing NVP numbers stored in various user types, the amplitude display variable, low and high noise buzzer thresholds variables, the units variable, the preset macro variable, and the like. Thus, Print configuration macro 960 allows a user of tester 10 to make a record of the internal configuration of tester 10.

FIG. 22 presents a flow chart which illustrates the types of tasks performed by tester 10 during Define Macro Preset macro 970. As shown in FIG. 22, a task 972 causes display 13 (see FIGS. 1-2A) to instruct the user to press one of keys 12.1-12.9 (see FIG. 1) on keypad 12 and thereby select a macro to utilize in connection with the selected macro feature of tester 10, which was discussed above in connection with tasks 90-92 of FIG. 4. After a numbered key on keypad 12 has been pressed, a task 974 saves this number or a corresponding identifier in the macro variable, discussed above in connection with tasks 90-92. After task 974, program control returns to Idle mode 82.

In summary, the present invention provides a cable testing apparatus and method which are particularly suited for use by a typical LAN user and need not be used only by LAN-skilled persons. The tester of the present invention provides a time domain reflectometer which may be used without a user specifying incident pulse width or cable impedance parameters. In addition, the TDR features of the present invention perform a scan of a cable under test quickly after detecting the then-current dynamic state of signals present on the cable so that a LAN may remain energized during TDR testing. Furthermore, the present invention provides modes of operation which indicate test results using graphical and audible forms of communicating information so that the usability of the tester improves and so that a user of the tester is required to engage in only a minimal amount of data interpretation. Moreover, the present invention includes a multiplicity of test functions in a single device so that a user need not obtain additional "test" equipment to successfully troubleshoot a wide variety of common LAN problems.

The present invention has been described above with reference to a preferred embodiment. However, those skilled in the art will recognize that changes and modifications may be made in this preferred embodiment without departing from the scope of the present invention. For example, those skilled in the art can devise a wide variety of specific hardware implementations for the structures depicted by FIGS. 1-3 and 16. Clearly, the specific devices, logic elements, and signal polarities discussed herein are subject to modification. Likewise, those skilled in the art will recognize that the software programming depicted by the flow charts of FIGS. 4-15 and 17-22 may differ considerably without departing from the scope of the present invention and may include more or fewer features and exhibit a markedly different internal organization. Moreover, those skilled in the art will recognize that these flow charts are presented to teach the present invention and that these flow charts, like any flow chart describing complicated software, can only approximate the actual software utilized. In order to understand actual implementations of the software in the preferred embodiment, the reader is referred to the "C" programming source listing contained in the Appendix attached hereto. These and other changes and modifications which are obvious to those skilled in the art are intended to be included within the scope of the present invention.

APPENDIX

COPYRIGHT INFORMATION

ALL SOFTWARE PROGRAMMING DISCLOSED IN THIS PATENT DOCUMENT, INCLUDING, BUT NOT LIMITED TO, PROGRAMMING THAT APPEARS IN THE FOLLOWING APPENDIX, IS COPYRIGHTED TO MICROTEST, INC. MICROTEST, INC. HEREBY CONSENTS TO THE REPRODUCTION OF THE COPYRIGHTED SOFTWARE DISCLOSED IN THIS PATENT DOCUMENT, BUT ONLY SO FAR AS SUCH REPRODUCTION IS UNDERTAKEN SOLELY AS NECESSARY IN CONJUNCTION WITH THE REPRODUCTION OF AN ISSUED PATENT WITH WHICH THE COPYRIGHTED SOFTWARE IS ASSOCIATED. MICROTEST, INC. RESERVES EXCLUSIVELY UNTO ITSELF THE RIGHT TO USE THE COPYRIGHTED SOFTWARE FOR ALL OTHER PURPOSES, INCLUDING, BUT NOT LIMITED TO, THE PURPOSES DISCLOSED OR SUGGESTED BY THIS PATENT DOCUMENT AND INCLUDING THE CREATION OF DERIVATIVE WORKS.
COPYRIGHT ©1989 MICROTEST, INC.

```
meas.c 1:
meas.c 2:
..\include\std.h 1:
meas.c 3:
..\include\tdr.h 1:
meas.c 4:
..\include\globs.ext 1:
meas.c 5:
meas.c 6:              int      f166(da,sc,wide,slope)
meas.c 7:              char da;
meas.c 8:              char sc;
meas.c 9:          char wide;
meas.c 10:         char slope;
meas.c 11: {
meas.c 12:              int i;
meas.c 13:              unsigned result;
meas.c 14:              char test;
meas.c 15:
meas.c 16: sf0066(0x80  ,0x00  | 0x20  | slope);
meas.c 17: if( slope == 0x40  )
meas.c 18: {
meas.c 19: sf0066(0x80 +1 ,0x0);
meas.c 20: }
meas.c 21: else
meas.c 22: {
meas.c 23: sf0066(0x80 +1 ,0xa0);
meas.c 24: }
meas.c 25:
meas.c 26:
meas.c 27: sf0064( 0, 0x01  | 0x02  | 0x04  | 0x08 );
meas.c 28: sf0064( 0x04 , 0);
meas.c 29:
meas.c 30: sf0066(0x80 +1 ,da);
meas.c 31:
meas.c 32: sf0066(0x80  ,slope | 0x20  | sc);
meas.c 33:
meas.c 34:
meas.c 35:
meas.c 36: sf0064( 0x08  | 0x04  | 0x01 , 0 );
meas.c 37: sf0064( 0, 0x08  );
meas.c 38:
meas.c 39:
meas.c 40:
meas.c 41:
```

```
meas.c 42:
meas.c 43:
meas.c 44: if( wide == 1   )
meas.c 45: {
meas.c 46: sf0066( 0x80   ,slope | 0x10   | sc);
meas.c 47: sf0066( 0x80   ,slope | 0x20   | sc);
meas.c 48:
meas.c 49: test = sf0048(1);
meas.c 50: }
meas.c 51:
meas.c 52: else
meas.c 53: {
meas.c 54: sf0066(0x80   ,slope | 0x20   | 0x10   | sc);
meas.c 55:
meas.c 56: test = sf0048(0);
meas.c 57: }
meas.c 58: if( test == 0)
meas.c 59: {
meas.c 60: result = sf0065(0x80 +1 ) << 8;
meas.c 61: result |= sf0065(0x80   );
meas.c 62: }
meas.c 63: else if( test != -1 )
meas.c 64: {
meas.c 65: result = 0;
meas.c 66: }
meas.c 67: else
meas.c 68: {
meas.c 69: result = -1;
meas.c 70: }
meas.c 71: return( result );
meas.c 72:
meas.c 73: }
meas.c 74:      int f182( type, avg, ofst )
meas.c 75:   char ofst;
meas.c 76:   char type;
meas.c 77:      unsigned avg;
meas.c 78: {
meas.c 79:      char i;
meas.c 80:      unsigned j;
meas.c 81:
meas.c 82: type -= 1;
meas.c 83: if(type < 2)
meas.c 84: {
meas.c 85: for( i=0xff; i > ofst; i--)
meas.c 86: {
meas.c 87: if(f166( i, sngl_val[type].start,sngl_val[type].width,
meas.c 88: sngl_val[type].slope) )
meas.c 89: {
meas.c 90:
meas.c 91: i -= ofst;
meas.c 92: }
meas.c 93: }
meas.c 94: }
meas.c 95: else
meas.c 96: {
meas.c 97: for( i=1; i < ofst; i++)
meas.c 98: {
meas.c 99: if(f166( i, (sngl_val[type].start), sngl_val[type].width,
meas.c 100: sngl_val[type].slope) )
meas.c 101: {
meas.c 102:
meas.c 103: i = ofst - i;
meas.c 104: break;
meas.c 105: }
meas.c 106: }
meas.c 107: }
meas.c 108: if( i == ofst)
meas.c 109: {
meas.c 110: i = 0;
meas.c 111: }
meas.c 112: return(i);
meas.c 113: }
meas.c 114:
```

```
meas.c 115:       int       f300()
meas.c 116: {
meas.c 117:       unsigned da_meas;
meas.c 118:       char i;
meas.c 119:
meas.c 120: sf0028();
meas.c 121: port82 |= 0x02 ;
meas.c 122: sf0066( 0x82 , port82 );
meas.c 123: for( da_meas=0; da_meas<1000; da_meas++)
meas.c 124: ;
meas.c 125: do
meas.c 126: {
meas.c 127: da_meas = f306(10);
meas.c 128: sf0025();
meas.c 129:
meas.c 130: reslt[0].dcohms = da_meas & 0xff;
meas.c 131:
meas.c 132:
meas.c 133:
meas.c 134: if( da_meas == 0xff )
meas.c 135: {
meas.c 136: sf0020("Resistance: OPEN");
meas.c 137: }
meas.c 138: else
meas.c 139: {
meas.c 140: sf0022("Resistance:%d.%d%c ",da_meas/10, da_meas%10, 0xf4 );
meas.c 141:
meas.c 142: }
meas.c 143: }while( ! sf0041(3 ) );
meas.c 144:
meas.c 145: port82 &= 0xfd ;
meas.c 146: sf0066( 0x82 , port82 );
meas.c 147: }
meas.c 148:
meas.c 149:       int       f600()
meas.c 150: {
meas.c 151:       unsigned da_meas;
meas.c 152:       char bp_count;
meas.c 153:       char quit;
meas.c 154:       char i;
meas.c 155:
meas.c 156: sf0028();
meas.c 157: port82 |= 0x02 ;
meas.c 158: sf0066( 0x82 , port82 );
meas.c 159: for( da_meas=0; da_meas<1000; da_meas++)
meas.c 160: ;
meas.c 161: quit = 0 ;
meas.c 162:
meas.c 163: do
meas.c 164: {
meas.c 165: da_meas = f306(5);
meas.c 166: if( (da_meas <= 0x80) && (quit == 0 ) )
meas.c 167: {
meas.c 168: sf0046();
meas.c 169: sf0025();
meas.c 170: sf0026( (0xff - da_meas)/0x10 );
meas.c 171:
meas.c 172:
meas.c 173:
meas.c 174:
meas.c 175:
meas.c 176:
meas.c 177: do
meas.c 178: {
meas.c 179:
meas.c 180: if( (sf0042() != 0xff ) && (sf0042() != 6 ) )
meas.c 181: {
meas.c 182: quit = 1 ;
meas.c 183: }
meas.c 184: }while( (quit == 0 ) && (f306(2) <= 0x80) );
meas.c 185: sf0047();
meas.c 186:
meas.c 187: }
```

```
meas.c 188: else if( (da_meas < 0xf0) && (quit == 0 ) )
meas.c 189: {
meas.c 190: bp_count = 0x05;
meas.c 191: sf0046();
meas.c 192: sf0025();
meas.c 193: sf0026( (0xff - da_meas)/0x10 );
meas.c 194: sf0047();
meas.c 195:
meas.c 196:
meas.c 197: do
meas.c 198: {
meas.c 199: da_meas = f306(2);
meas.c 200: sf0025();
meas.c 201: sf0026( (0xff - da_meas)/0x10 );
meas.c 202: if( sf0041(6 ) )
meas.c 203: {
meas.c 204: quit = 1 ;
meas.c 205: }
meas.c 206: }while((da_meas > 0x80) && ( da_meas < 0xf0 ) && (quit==0 ));
meas.c 207: }
meas.c 208: sf0025();
meas.c 209:
meas.c 210: if( da_meas == 0xff )
meas.c 211: sf0027("Continuity Mode ");
meas.c 212: else
meas.c 213: sf0026( (0xff - da_meas)/0x10 );
meas.c 214: if( sf0041(6 ) )
meas.c 215: {
meas.c 216: quit = 1 ;
meas.c 217: }
meas.c 218: }while( quit == 0  );
meas.c 219: port82 &= 0xfd ;
meas.c 220: sf0066( 0x82 , port82 );
meas.c 221: }
meas.c 222:
meas.c 223:             int f306(avg)
meas.c 224:             char avg;
meas.c 225: {
meas.c 226:             char da;
meas.c 227:             char count;
meas.c 228:             unsigned da_meas;
meas.c 229:             char i;
meas.c 230:             char j;
meas.c 231:
meas.c 232: sf0066( 0x80 , 0x40 | 0x20 );
meas.c 233: da_meas = 0;
meas.c 234: sf0066( 0x81 , 0xff);
meas.c 235:
meas.c 236: for(i = 0; i<avg; i++)
meas.c 237: {
meas.c 238: da = 0x80;
meas.c 239: count = 0x40;
meas.c 240: do
meas.c 241: {
meas.c 242: sf0066( 0x81 , da);
meas.c 243:
meas.c 244: if( ( sf0065(0x82 ) & 0x04 ) == 0 )
meas.c 245: {
meas.c 246: da += count;
meas.c 247: }
meas.c 248: else
meas.c 249: {
meas.c 250: da -= count;
meas.c 251: }
meas.c 252: count /= 2;
meas.c 253: }while( count );
meas.c 254: da_meas += da;
meas.c 255: }
meas.c 256: da_meas = da_meas/avg;
meas.c 257: return(da_meas);
meas.c 258: }
meas.c 259:
meas.c 260:             int f164(type, offset, count)
```

```
meas.c 261:         char offset;
meas.c 262:         char count;
meas.c 263:         char type;
meas.c 264: {
meas.c 265:             unsigned j;
meas.c 266:         unsigned old_avg;
meas.c 267:             unsigned avg;
meas.c 268:         char front;
meas.c 269:             char i;
meas.c 270:         char quit;
meas.c 271:         unsigned dist;
meas.c 272:         char *bpnt;
meas.c 273:
meas.c 274: if( type < 3)
meas.c 275: {
meas.c 276: front = scbl_front;
meas.c 277: }
meas.c 278: else
meas.c 279: {
meas.c 280: front = ocbl_front;
meas.c 281: }
meas.c 282:
meas.c 283: old_avg = 0;
meas.c 284: quit = 0 ;
meas.c 285: while( quit == 0   )
meas.c 286: {
meas.c 287: avg = 0;
meas.c 288: for( i=0; i < count; i++)
meas.c 289: {
meas.c 290:
meas.c 291: j = f166( offset, sngl_val[type-1].start, sngl_val[type-1].width,
meas.c 292: sngl_val[type-1].slope);
meas.c 293:
meas.c 294: if( j > 0x2aaa)
meas.c 295: {
meas.c 296: j = 0x2aa0;
meas.c 297: }
meas.c 298: if( ( j > 0xa0) && ( (type == 3) || (type == 1) ) )
meas.c 299:
meas.c 300: {
meas.c 301: avg = 0;
meas.c 302: break;
meas.c 303: }
meas.c 304:
meas.c 305:
meas.c 306: if( ( (j-front) < ((old_avg*9)/10) ) || ( (j-front) >
meas.c 307: ((old_avg*11)/10) ) )
meas.c 308: {
meas.c 309: if(!old_avg)
meas.c 310:
meas.c 311: {
meas.c 312: avg+=j;
meas.c 313: }
meas.c 314: else
meas.c 315: {
meas.c 316: break;
meas.c 317: }
meas.c 318: }
meas.c 319: else
meas.c 320: {
meas.c 321: avg +=j;
meas.c 322: }
meas.c 323: }
meas.c 324:
meas.c 325:
meas.c 326: if( (i < (count/2)) || (avg ==0) )
meas.c 327:
meas.c 328: {
meas.c 329: break;
meas.c 330: }
meas.c 331: avg /= i;
meas.c 332: if( !old_avg)
meas.c 333: {
```

```
meas.c 334: old_avg = avg;
meas.c 335: }
meas.c 336:
meas.c 337: i = f182(type, avg, offset);
meas.c 338:
meas.c 339: if ( (!i) || (avg > 0x2000) )
meas.c 340: {
meas.c 341: break;
meas.c 342: }
meas.c 343:
meas.c 344:
meas.c 345:
meas.c 346: sf0037(type, avg, i);
meas.c 347:
meas.c 348: if( type < 3 )
meas.c 349: {
meas.c 350: reslt[0].ampl = i + offset;
meas.c 351: }
meas.c 352: else
meas.c 353: {
meas.c 354: reslt[0].ampl = (i * -1) - offset;
meas.c 355: }
meas.c 356:
meas.c 357:
meas.c 358: if( (avg  < ((old_avg*9)/10) ) || ( avg > ((old_avg*11)/10) ) )
meas.c 359: {
meas.c 360: break;
meas.c 361: }
meas.c 362: old_avg = avg;
meas.c 363:
meas.c 364: if( sf0041(0xff ) )
meas.c 365: {
meas.c 366: quit = 1 ;
meas.c 367: }
meas.c 368:
meas.c 369: }
meas.c 370:
meas.c 371: return(quit);
meas.c 372: }
meas.c 373:
meas.c 374:          int f100()
meas.c 375: {
meas.c 376:           char i;
meas.c 377:       char quit;
meas.c 378:     char pos_floor;
meas.c 379:     char neg_floor;
meas.c 380:     unsigned sht_dist;
meas.c 381:     unsigned opn_dist;
meas.c 382:       char count;
meas.c 383:       char offset;
meas.c 384:       char type;
meas.c 385:       char p[3];
meas.c 386:       char *pnt1;
meas.c 387:       char *pnt2;
meas.c 388:
meas.c 389: sf0019();
meas.c 390: sf0020("Scanning ..");
meas.c 391:
meas.c 392:
meas.c 393: quit = 0 ;
meas.c 394: do
meas.c 395: {
meas.c 396: if( kblen )
meas.c 397: {
meas.c 398:
meas.c 399:
meas.c 400: quit = 1 ;
meas.c 401: break;
meas.c 402: }
meas.c 403: do
meas.c 404: {
meas.c 405: if( kblen )
meas.c 406: {
```

```
meas.c 407:
meas.c 408:
meas.c 409: quit = 1 ;
meas.c 410: type = 0;
meas.c 411: break;
meas.c 412: }
meas.c 413:
meas.c 414: pos_floor = f102(0x40 );
meas.c 415: neg_floor = f102(0x00 );
meas.c 416:
meas.c 417: if( ! f124() )
meas.c 418: {
meas.c 419:
meas.c 420:
meas.c 421: pnt1 = f142( pos_floor, neg_floor, 0 );
meas.c 422:
meas.c 423: pnt2 = p;
meas.c 424: for(i=0; i<3; i++)
meas.c 425: *pnt2++ = *pnt1++;
meas.c 426: type   = p[0];
meas.c 427: offset = p[1];
meas.c 428: count  = p[2];
meas.c 429:
meas.c 430:
meas.c 431: }
meas.c 432: else
meas.c 433: {
meas.c 434: type = 0;
meas.c 435: }
meas.c 436: }while( type == 0);
meas.c 437:
meas.c 438:
meas.c 439: if( type )
meas.c 440: quit = f164(type, offset, count);
meas.c 441:
meas.c 442: }while( quit == 0  );
meas.c 443:
meas.c 444:
meas.c 445: reslt[0].noise = pos_floor - neg_floor;
meas.c 446:
meas.c 447: }
meas.c 448:
meas.c 449:           int     f124()
meas.c 450: {
meas.c 451:           unsigned dist;
meas.c 452:              unsigned avg;
meas.c 453:              unsigned i;
meas.c 454:
meas.c 455: for( i=0,avg=0; i<100; i++)
meas.c 456: {
meas.c 457: dist = f166(0xd0,0,0 ,0x40 );
meas.c 458: avg += dist;
meas.c 459: }
meas.c 460:
meas.c 461: dist = avg/i;
meas.c 462:
meas.c 463: if( (dist < 18) && (dist > 4 ) )
meas.c 464: {
meas.c 465:
meas.c 466: sf0024();
meas.c 467: sf0027("CLOSE-IN short");
meas.c 468: sf0025();
meas.c 469: if(ftm_flag)
meas.c 470: {
meas.c 471: dist = ((dist*1524)-7600)/scable_nvp;
meas.c 472: sf0022(" at about %d.%d m   ", (dist/10), (dist%10) );
meas.c 473: }
meas.c 474: else
meas.c 475: {
meas.c 476: sf0022(" at about %d ft     ", ((dist*500)-2500)/scable_nvp);
meas.c 477: }
meas.c 478: return( 1 );
meas.c 479: }
```

```
meas.c 480:    return(0 );
meas.c 481: }
meas.c 482:
meas.c 483:                    int        f502(slope)
meas.c 484:             char slope;
meas.c 485: {
meas.c 486:                char da;
meas.c 487:             char count;
meas.c 488:                char sc;
meas.c 489:             char test;
meas.c 490:                char i;
meas.c 491:
meas.c 492: sc = 7;
meas.c 493: count = 0x20;
meas.c 494:
meas.c 495: da = sf0049( sc, slope );
meas.c 496:
meas.c 497: do
meas.c 498: {
meas.c 499: sf00501( sc, da, slope );
meas.c 500: for( i=0; i<85; i++)
meas.c 501: {
meas.c 502: if( (sf0065(0x80 +1 ) & 0x80) == 0 )
meas.c 503: {
meas.c 504: break;
meas.c 505: }
meas.c 506: }
meas.c 507:
meas.c 508:
meas.c 509: test = (i == 85) ? 1  : 0 ;
meas.c 510:
meas.c 511: da = sf0051( test, slope, count, da );
meas.c 512:
meas.c 513: count = count/2;
meas.c 514: }while( count );
meas.c 515: return( da );
meas.c 516:
meas.c 517: }
meas.c 518:
meas.c 519:                    int        f102(slope)
meas.c 520:             char slope;
meas.c 521: {
meas.c 522:                char da;
meas.c 523:             char count;
meas.c 524:               char sc;
meas.c 525:               char test;
meas.c 526:             unsigned i;
meas.c 527:
meas.c 528: sc = 7;
meas.c 529: count = 0x20;
meas.c 530: da = sf0049( sc, slope );
meas.c 531:
meas.c 532: do
meas.c 533: {
meas.c 534: sf00501( sc, da, slope );
meas.c 535:
meas.c 536:
meas.c 537:
meas.c 538: test = sf0048(0);
meas.c 539: if( test != -1 )
meas.c 540: {
meas.c 541: da = sf0051( test, slope, count, da );
meas.c 542: }
meas.c 543: else
meas.c 544: {
meas.c 545: break;
meas.c 546: }
meas.c 547: count = count/2;
meas.c 548: }while( count );
meas.c 549: return( da );
meas.c 550: }
meas.c 551:
meas.c 552:        int sf0049( sc, slope )
```

```
meas.c 553:                  char sc;
meas.c 554:           char slope;
meas.c 555: {
meas.c 556:                  char da;
meas.c 557:
meas.c 558: sf0066(0x80   ,0x00);
meas.c 559: sf0064( 0, 0x04   );
meas.c 560: sf0064( 0x04 , 0x01   );
meas.c 561:
meas.c 562: if( slope == 0x40   )
meas.c 563: {
meas.c 564: da = 0xc0;
meas.c 565: }
meas.c 566: else
meas.c 567: {
meas.c 568: da = 0x40;
meas.c 569: }
meas.c 570:
meas.c 571: sf0066(0x80   ,0x00 | slope | sc);
meas.c 572: return(da);
meas.c 573: }
meas.c 574:
meas.c 575:           int sf00501( sc, da, slope)
meas.c 576:                  char sc;
meas.c 577:                  char da;
meas.c 578:            char slope;
meas.c 579: {
meas.c 580:
meas.c 581: sf0066(0x80   ,0x00 | slope | sc );
meas.c 582:
meas.c 583:
meas.c 584: if( slope == 0x40   )
meas.c 585: sf0066(0x80 +1 ,0x0);
meas.c 586: else
meas.c 587: sf0066(0x80 +1 ,0xff);
meas.c 588:
meas.c 589:
meas.c 590: sf0066(0x80 +2 ,port82 & ~0x04 );
meas.c 591: sf0066(0x80 +2 ,port82);
meas.c 592: sf0066(0x80 +1 ,da);
meas.c 593:
meas.c 594:
meas.c 595: sf0066(0x80   ,slope | sc );
meas.c 596:
meas.c 597:
meas.c 598:
meas.c 599: sf0064( 0x08  | 0x04 , 0x01   );
meas.c 600: sf0064( 0x01 , 0x08   );
meas.c 601:
meas.c 602:
meas.c 603: sf0066(0x80   ,slope | 0x10  | sc );
meas.c 604: }
meas.c 605:
meas.c 606:              int sf0051(test, slope, count, da )
meas.c 607:            char test;
meas.c 608:            char slope;
meas.c 609:            char count;
meas.c 610:                  char da;
meas.c 611: {
meas.c 612:
meas.c 613: if(test)
meas.c 614: {
meas.c 615: if( slope == 0x40   )
meas.c 616: {
meas.c 617: da -= count;
meas.c 618: }
meas.c 619: else
meas.c 620: {
meas.c 621: da += count;
meas.c 622: }
meas.c 623: }
meas.c 624: else
meas.c 625: {
```

```
meas.c 626: if( slope == 0x40  )
meas.c 627: {
meas.c 628: da += count;
meas.c 629: }
meas.c 630: else
meas.c 631: {
meas.c 632: da -= count;
meas.c 633: }
meas.c 634: }
meas.c 635: return(da);
meas.c 636: }
meas.c 637:
meas.c 638:
meas.c 639:             int sf0048( type )
meas.c 640:             char type;
meas.c 641: {
meas.c 642:             unsigned i;
meas.c 643:     char result;
meas.c 644:
meas.c 645: for( i=0; i<7500; i++ )
meas.c 646: {
meas.c 647: if( kblen )
meas.c 648: {
meas.c 649: result = -1;
meas.c 650: break;
meas.c 651: }
meas.c 652: if( sf0065(0x80 +2 ) & 0x01)
meas.c 653: {
meas.c 654: result = 1 ;
meas.c 655: break;
meas.c 656: }
meas.c 657: if ( ( type &&  ((sf0065(0x80 +1 ) & 0x80) == 0))
meas.c 658: || (!type && ( sf0065(0x80 +1 ) != 0x80)))
meas.c 659: {
meas.c 660:
meas.c 661: result = 0 ;
meas.c 662: break;
meas.c 663: }
meas.c 664: }
meas.c 665: if( i == 7500 )
meas.c 666: sf0015(0x01 );
meas.c 667:
meas.c 668: return( result );
meas.c 669:
meas.c 670: }
meas.c 671:
meas.c 672:         char *f142( pos_floor, neg_floor, margin )
meas.c 673:     char pos_floor;
meas.c 674:     char neg_floor;
meas.c 675:         char margin;
meas.c 676: {
meas.c 677:     char result[3];
meas.c 678:     unsigned sht_dist;
meas.c 679:     unsigned opn_dist;
meas.c 680:         char offset;
meas.c 681:         char type;
meas.c 682:         char count;
meas.c 683:
meas.c 684:
meas.c 685: count = 6;
meas.c 686: do
meas.c 687: {
meas.c 688:
meas.c 689: sht_dist = f166( (pos_floor + sngl_val[0].da), sngl_val[0].start,
meas.c 690: sngl_val[0].width, sngl_val[0].slope);
meas.c 691:
meas.c 692: opn_dist = f166( (neg_floor - sngl_val[2].da), sngl_val[2].start,
meas.c 693: sngl_val[2].width, sngl_val[2].slope);
meas.c 694:
meas.c 695: if( ((sht_dist <= opn_dist) && (sht_dist !=0))
meas.c 696: || ((sht_dist) && (opn_dist == 0)) )
meas.c 697: {
meas.c 698: if( sht_dist > 0xa0 )
```

```
meas.c 699:
meas.c 700: {
meas.c 701:
meas.c 702: type = 2;
meas.c 703: offset = pos_floor + (sngl_val[1].da + margin);
meas.c 704: break;
meas.c 705: }
meas.c 706: else
meas.c 707: {
meas.c 708:
meas.c 709: type = 1;
meas.c 710: count = 30;
meas.c 711: offset = pos_floor + (sngl_val[0].da + margin);
meas.c 712: break;
meas.c 713: }
meas.c 714: }
meas.c 715:
meas.c 716: else if( ((opn_dist < sht_dist) && (sht_dist !=0))
meas.c 717: || ((opn_dist) && (sht_dist == 0)) )
meas.c 718: {
meas.c 719: if( opn_dist > 0xa0 )
meas.c 720:
meas.c 721: {
meas.c 722:
meas.c 723: type = 4;
meas.c 724: offset = neg_floor - (sngl_val[3].da + margin);
meas.c 725: break;
meas.c 726: }
meas.c 727: else if( opn_dist < 0x50 )
meas.c 728: {
meas.c 729:
meas.c 730: if( f166( (neg_floor - opnda_short), sngl_val[2].start,
meas.c 731: sngl_val[2].width, sngl_val[2].slope) )
meas.c 732: {
meas.c 733: type = 3;
meas.c 734: offset = neg_floor - opnda_short;
meas.c 735: count = 30;
meas.c 736: break;
meas.c 737: }
meas.c 738: else
meas.c 739: {
meas.c 740: type = 3;
meas.c 741: offset = neg_floor - (sngl_val[2].da + margin);
meas.c 742: count = 30;
meas.c 743: break;
meas.c 744: }
meas.c 745: }
meas.c 746: else
meas.c 747: {
meas.c 748:
meas.c 749: type = 3;
meas.c 750: offset = neg_floor - (sngl_val[2].da + margin);
meas.c 751: count = 30;
meas.c 752: break;
meas.c 753: }
meas.c 754: }
meas.c 755: opn_dist = f166( (neg_floor - sngl_val[3].da), sngl_val[3].start,
meas.c 756: sngl_val[3].width, sngl_val[3].slope);
meas.c 757:
meas.c 758: sht_dist = f166( (pos_floor + sngl_val[1].da), sngl_val[1].start,
meas.c 759: sngl_val[1].width, sngl_val[1].slope);
meas.c 760:
meas.c 761: if( ((sht_dist <= opn_dist) && (sht_dist !=0))
meas.c 762: ||((sht_dist) && (opn_dist == 0)) )
meas.c 763: {
meas.c 764:
meas.c 765: type = 2;
meas.c 766: offset = pos_floor + (sngl_val[1].da + margin);
meas.c 767: break;
meas.c 768: }
meas.c 769: else if( ((opn_dist < sht_dist) && (opn_dist !=0))
meas.c 770: || ((opn_dist) && (sht_dist == 0)) )
meas.c 771: {
```

```
meas.c 772:     type = 4;
meas.c 773:     offset = neg_floor - (sngl_val[3].da + margin);
meas.c 774:     break;
meas.c 775:   }
meas.c 776:   else
meas.c 777:   {
meas.c 778:     type = 0;
meas.c 779:     f152();
meas.c 780:   }
meas.c 781:  }while(0);
meas.c 782:
meas.c 783:  result[0] = type;
meas.c 784:  result[1] = offset;
meas.c 785:  result[2] = count;
meas.c 786:  return( result );
meas.c 787: }
meas.c 788:
meas.c 789:
meas.c 790:

globs.c 1:
globs.c 2:
..\include\std.h 1:
globs.c 3:
..\include\tdr.h 1:
globs.c 4:
globs.c 5: CABLE_POINT  cables[24];
globs.c 6:
globs.c 7:          char rxbuf[256];
globs.c 8:          char safspot[20];
globs.c 9:            char rxnxti;
globs.c 10:             char rxnxto;
globs.c 11:
globs.c 12:             char rxstat0;
globs.c 13:             char rxmod0;
globs.c 14:             unsigned sp_sav;
globs.c 15:             int kbcount;
globs.c 16:         char pwr_cntr;
globs.c 17:
globs.c 18:         int softinit()
globs.c 19: {
globs.c 20: rxnxti  = 0;
globs.c 21: rxnxto  = 0;
globs.c 22: sp_sav  = 0;
globs.c 23: }
globs.c 24:
globs.c 25:             char port82;
globs.c 26:         char kbque[16];
globs.c 27:             char kblen;
globs.c 28:     char kbd_matrix[] =
globs.c 29: { 0xef, 0xdf, 0xbf, 0x7f };
globs.c 30:
globs.c 31:     char kbdlist[] =
globs.c 32: { 1, 2, 1, 3, 1, 2, 1, 1, 0 };
globs.c 33:
globs.c 34:             char pvc_tfe;
globs.c 35:         char *cbl_name;
globs.c 36:             unsigned scable_nvp;
globs.c 37:             unsigned ocable_nvp;
globs.c 38:             char scbl_front;
globs.c 39:             char ocbl_front;
globs.c 40:
globs.c 41:
globs.c 42: MEAS_STRUCT sngl_val[4];
globs.c 43:
globs.c 44:     TIMER tarray[10 ];
globs.c 45:         unsigned lopcnt;
globs.c 46:       char lbuf[40];
globs.c 47:     char output[20];
globs.c 48:         char *dumpaddr;
globs.c 49:                 char key;
globs.c 50:           char buzzflg;
globs.c 51:         char opnda_short;
```

```
globs.c 52:        char velocity;
globs.c 53:        char impedance;
globs.c 54:
globs.c 55: CABLE_STRUCT    cable_init[] =
globs.c 56: {
globs.c 57: {"ENET THIN PVC", "RG-58", 304, 304, 5, 5, 67, 50, 6, 16, 0 },
globs.c 58: {"ENET THIN TFE", "RG-58", 288, 288, 6, 6, 70, 50, 6, 16, 0 },
globs.c 59: {"ENET THICK PVC", "RG-8", 261, 261, 5, 6, 77, 50, 3, 7, 0 },
globs.c 60: {"ENET THICK TFE", "RG-8", 261, 261, 5, 6, 77, 50, 3, 7, 0 },
globs.c 61: {"ARCNET PVC", "RG-62", 226, 226, 6, 6, 84, 93, 11, 16, 0 },
globs.c 62: {"ARCNET TFE", "RG-62", 226, 226, 6, 6, 84, 93, 11, 16, 0 },
globs.c 63: {"TWISTED PAIR PVC", "Twisted Pair",314, 313, 4, 5, 67, 100, 5, 16,
0 },
globs.c 64: {"TWISTED PAIR TFE", "Twisted Pair", 314, 313, 4, 5, 67, 100, 5, 16,
0 },
globs.c 65: {"TV CABLE PVC", "RG-59", 263, 263, 5, 5, 78, 75, 5, 16, 0 },
globs.c 66: {"TV CABLE TFE", "RG-59", 226, 226, 5, 5, 84, 75, 5, 16, 0 },
globs.c 67: {"TOKEN RING PVC", "Sheilded Twisted Pair", 265, 264, 6, 6, 78, 150,
10, 16, 0 },
globs.c 68: {"TOKEN RING TFE", "Sheilded Twisted Pair", 265, 264, 6, 6, 78, 150,
10, 16, 0 },
globs.c 69: {"", "", 304, 304, 5, 5, 67, 50, 6, 16, 0 },
globs.c 70: {"", "", 304, 304, 5, 5, 67, 50, 6, 16, 0 },
globs.c 71: {"TERMNL COAX PVC", "RG-62", 226, 226, 6, 6, 84, 93, 11, 16, 0 },
globs.c 72: {"TERMNL COAX TFE", "RG-62", 226, 226, 6, 6, 84, 93, 11, 16, 0 },
globs.c 73:
globs.c 74: {"USER TYPE 0","", 0, 0, 6, 6, 99, 0, 8, 16, 0 },
globs.c 75: {"USER TYPE 1", "",317, 317, 6, 6, 64, 0, 8, 16, 0 },
globs.c 76: {"USER TYPE 2","", 308, 308, 6, 6, 66, 0, 8, 16, 0 },
globs.c 77: {"USER TYPE 3","", 290, 290, 6, 6, 70, 0, 8, 16, 0 },
globs.c 78: {"USER TYPE 4","", 282, 282, 6, 6, 72, 0, 8, 16, 0 },
globs.c 79: {"USER TYPE 5","", 267, 267, 6, 6, 76, 0, 8, 16, 0 },
globs.c 80: {"USER TYPE 6","", 261, 261, 6, 6, 78, 0, 8, 16, 0 },
globs.c 81: {"USER TYPE 7","", 248, 248, 6, 6, 82, 0, 8, 16, 0 },
globs.c 82: {"USER TYPE 8","", 242, 242, 6, 6, 84, 0, 8, 16, 0 },
globs.c 83: {"USER TYPE 9","", 236, 236, 6, 6, 86, 0, 8, 16, 0 }
globs.c 84:
globs.c 85: };
globs.c 86:
globs.c 87:        char *fault[] =
globs.c 88: { "NO FAULTS FOUND", "OPEN", "SHORT" , "OPEN", "SHORT" };
globs.c 89:        char *fltmes[] =
globs.c 90: { "Properly Terminated", "Break in cable", "Wires are touching" , ""
, "" };
globs.c 91:    char scal_val[] =
globs.c 92: { 0, 14, 56, 113, 169, 28, 56, 113, 140 };
globs.c 93:    unsigned scal_mval[] =
globs.c 94: { 0, 100, 400, 800, 1200, 2000, 4000, 8000, 10000 };
globs.c 95:
globs.c 96:        char actv_lib;
globs.c 97:        char cbl_type;
globs.c 98:            unsigned cable_type;
globs.c 99:            unsigned cbl_sht_ofst;
globs.c 100:           unsigned cbl_nnofset;
globs.c 101:           unsigned cbl_wnofset;
globs.c 102:           unsigned cbl_wfudg;
globs.c 103:
globs.c 104:            char tag;
globs.c 105:       RESLT reslt[10];
globs.c 106:           char c_cb_ty;
globs.c 107:           char chksum;
globs.c 108:    CABLE_STRUCT cable_usr[10];
globs.c 109:
globs.c 110:        char func_var;
globs.c 111:         char xonoff;
globs.c 112:
globs.c 113:    unsigned (*defmac)();
globs.c 114:    char amp_flag;
globs.c 115:    unsigned low_thresh;
globs.c 116:    unsigned hi_thresh;
globs.c 117:
globs.c 118: extern        unsigned f1000();
```

```
globs.c 119: extern        unsigned f100();
globs.c 120: extern        unsigned f200();
globs.c 121: extern        unsigned f300();
globs.c 122: extern        unsigned f400();
globs.c 123: extern        unsigned f500();
globs.c 124: extern        unsigned f600();
globs.c 125: extern        unsigned f970();
globs.c 126: extern        unsigned f800();
globs.c 127: extern        unsigned f900();
globs.c 128: extern        unsigned f910();
globs.c 129: extern        unsigned f920();
globs.c 130: extern        unsigned f930();
globs.c 131: extern        unsigned f940();
globs.c 132: extern        unsigned f950();
globs.c 133: extern           unsigned f960();
globs.c 134: extern           unsigned sf0062();
globs.c 135:    unsigned deftbl[] =
globs.c 136: {
globs.c 137: f1000,
globs.c 138: f100,
globs.c 139: f200,
globs.c 140: f300,
globs.c 141: f400,
globs.c 142: f500,
globs.c 143: f600,
globs.c 144: f970,
globs.c 145: f800,
globs.c 146: f900,
globs.c 147: f910,
globs.c 148: f920,
globs.c 149: f930,
globs.c 150: f940,
globs.c 151: sf0062,
globs.c 152: f960,
globs.c 153: f970,
globs.c 154: sf0062,
globs.c 155: sf0062,
globs.c 156: sf0062,
globs.c 157: sf0062,
globs.c 158: };
globs.c 159:
globs.c 160:             char bsense;
globs.c 161:             char bcount;
globs.c 162:         char ftm_flag;
globs.c 163:             char greslt;
globs.c 164:
globs.c 165:
globs.c 166:

charlib.c 1:
charlib.c 2:
..\include\std.h 1:
charlib.c 3:
..\include\charlib.h 1:
charlib.c 4:
charlib.c 5: char isalpha(c)
charlib.c 6: char c;
charlib.c 7: {
charlib.c 8: return (cmap[c] & 0x80  );
charlib.c 9: }
charlib.c 10:
charlib.c 11:
charlib.c 12: char isdigit(c)
charlib.c 13: char c;
charlib.c 14: {
charlib.c 15: return (cmap[c] & 0x40  );
charlib.c 16: }
charlib.c 17:
charlib.c 18: char ishex(c)
charlib.c 19: char c;
charlib.c 20: {
charlib.c 21: return (cmap[c] & 0x20  );
charlib.c 22: }
```

```
charlib.c 23:
charlib.c 24: char isalphanum(c)
charlib.c 25: char c;
charlib.c 26: {
charlib.c 27: return (cmap[c] & 0x10  );
charlib.c 28: }
charlib.c 29:
charlib.c 30: char islower(c)
charlib.c 31: char c;
charlib.c 32: {
charlib.c 33: return (cmap[c] & 0x04  );
charlib.c 34: }
charlib.c 35:
charlib.c 36: char isupper(c)
charlib.c 37: char c;
charlib.c 38: {
charlib.c 39: return (cmap[c] & 0x02  );
charlib.c 40: }
charlib.c 41:
charlib.c 42: char iswhite(c)
charlib.c 43: char c;
charlib.c 44: {
charlib.c 45: return( cmap[c] & 0x08  );
charlib.c 46: }
charlib.c 47:
charlib.c 48: char ispunct(c)
charlib.c 49: char c;
charlib.c 50: {
charlib.c 51: return( cmap[c] & 0x01  );
charlib.c 52: }
charlib.c 53:
charlib.c 54: int charhex(c)
charlib.c 55: char c;
charlib.c 56: {
charlib.c 57: if (isdigit(c))                      return (c - '0');
charlib.c 58: if (ishex(c) && isupper(c) ) return ( c - ('A' - 10));
charlib.c 59: return( c - ('a' - 10) );
charlib.c 60: }
charlib.c 61:
charlib.c 62:          char tolower(c)
charlib.c 63:                  char c;
charlib.c 64: {
charlib.c 65: if(isupper(c))
charlib.c 66: return( (char ) (c + ('a' - 'A')) );
charlib.c 67: return( c );
charlib.c 68: }
charlib.c 69:
charlib.c 70:          char toupper(c)
charlib.c 71:                  char c;
charlib.c 72: {
charlib.c 73: if(islower(c))
charlib.c 74: return( (char ) (c - ('a' - 'A')) );
charlib.c 75: return( c );
charlib.c 76: }
charlib.c 77:
charlib.c 78:
charlib.c 79:
charlib.c 80:

nglobs.c 1:
nglobs.c 2:
nglobs.c 3: G( actv_lib,         UBYTE,  )
nglobs.c 4: G( cbl_type,         UBYTE,  )
nglobs.c 5:
nglobs.c 6: G( cable_type,        UWORD, )
nglobs.c 7: G( cbl_sht_ofst,      UWORD, )
nglobs.c 8: G( cbl_nnofset,       UWORD, )
nglobs.c 9: G( cbl_wnofset,       UWORD, )
nglobs.c 10: G( cbl_wfudg,        UWORD, )
nglobs.c 11:
nglobs.c 12:
nglobs.c 13:
```

```
exec.c 1:
exec.c 2:
exec.c 3:
..\include\std.h 1:
exec.c 4:
..\include\ipc.h 1:
exec.c 5:
..\include\box.h 1:
exec.c 6:
..\include\equ.h 1:
exec.c 7:
..\include\tdr.h 1:
exec.c 8:
..\include\globs.ext 1:
exec.c 9:
exec.c 10:
exec.c 11:
exec.c 12:        int main()
exec.c 13: {
exec.c 14:        unsigned i;
exec.c 15:
exec.c 16: sf0018();
exec.c 17: sf0030(0);
exec.c 18:
exec.c 19: xonoff = 1;
exec.c 20:
exec.c 21: sf0005t();
exec.c 22: sf0006();
exec.c 23: sf0007();
exec.c 24: sf0008();
exec.c 25: checksm();
exec.c 26: ei();
exec.c 27:
exec.c 28:
exec.c 29: sf0046();
exec.c 30: for(i=0;i<500;i++)
exec.c 31: ;
exec.c 32: sf0047();
exec.c 33:
exec.c 34: for(i=0;i<2000;i++)
exec.c 35: {
exec.c 36: if( kblen > 0 )
exec.c 37: break;
exec.c 38: }
exec.c 39:
exec.c 40: sf0030(1);
exec.c 41: sf0010();
exec.c 42:
exec.c 43:
exec.c 44:
exec.c 45:
exec.c 46:
exec.c 47: i = sf0065(0x82 );
exec.c 48: if( i & 0x08 )
exec.c 49: {
exec.c 50: sf0019();
exec.c 51: sf0027("Recharge me");
exec.c 52: sf0025();
exec.c 53: sf0027("Battery low!");
exec.c 54: for(i=0;i<20000;i++)
exec.c 55: ;
exec.c 56: }
exec.c 57:
exec.c 58: sf0055();
exec.c 59:
exec.c 60:
exec.c 61:
exec.c 62:
exec.c 63:
exec.c 64: f100();
exec.c 65: f400();
exec.c 66: f300();
exec.c 67: f600();
```

```
exec.c 68: f500();
exec.c 69:
exec.c 70: }
exec.c 71:
exec.c 72: extern          unsigned sf0078();
exec.c 73: extern          unsigned sf0079();
exec.c 74: extern          unsigned sf0002();
exec.c 75: extern          unsigned sf0081();
exec.c 76: extern          unsigned sf0082();
exec.c 77: extern          unsigned sf0083();
exec.c 78: extern          unsigned sf0001();
exec.c 79: extern          unsigned sf0085();
exec.c 80: extern          unsigned sf0070();
exec.c 81:
exec.c 82:      unsigned itable[9] =
exec.c 83: {
exec.c 84: sf0078,
exec.c 85: sf0079,
exec.c 86: sf0002,
exec.c 87: sf0081,
exec.c 88: sf0082,
exec.c 89: sf0083,
exec.c 90: sf0001,
exec.c 91: sf0070,
exec.c 92: sf0085
exec.c 93: };
exec.c 94:
exec.c 95:      int sf0005t()
exec.c 96: {
exec.c 97:      unsigned *p;
exec.c 98:      unsigned i;
exec.c 99:
exec.c 100:
exec.c 101:
exec.c 102:
exec.c 103:
exec.c 104: p = (unsigned *)0x9fe0 ;
exec.c 105: for ( i = 0; i < 9; i++ )
exec.c 106: *p++ = itable[i];
exec.c 107:
exec.c 108:
exec.c 109:
exec.c 110:
exec.c 111:
exec.c 112: p = (unsigned *)0x9fe0 ;
exec.c 113:
exec.c 114:
exec.c 115:
exec.c 116:
exec.c 117:
exec.c 118:
exec.c 119:
exec.c 120:
exec.c 121: sf0069();
exec.c 122:
exec.c 123:
exec.c 124:
exec.c 125:
exec.c 126:
exec.c 127: softinit();
exec.c 128: }
exec.c 129:
exec.c 130:         int sf0007()
exec.c 131: {
exec.c 132: sf0066(0x0A ,0x05);
exec.c 133: sf0066(0x10 ,6);
exec.c 134: sf0066(0x0C ,0x00);
exec.c 135: sf0066(0x0E ,0x00);
exec.c 136: sf0066(0x0D ,0x0c);
exec.c 137: sf0066(0x0F ,0x0c);
exec.c 138: sf0066(0x10 ,0x17);
exec.c 139: sf0066(0x34 ,0x00);
exec.c 140: }
```

```
exec.c 141:
exec.c 142:          int sf0006()
exec.c 143: {
exec.c 144:             int sf0012();
exec.c 145:          int sf0042();
exec.c 146:             int i;
exec.c 147:
exec.c 148: for(i=0; i < 10 ; i++)
exec.c 149: tarray[i].flags = 0;
exec.c 150:
exec.c 151: sf0011(1,1,0x01  ,sf0042);
exec.c 152: sf0011(2,2,0,0);
exec.c 153: sf0011(3,0xbb8,0x01  ,sf0012);
exec.c 154:
exec.c 155: }
exec.c 156:
exec.c 157:                 int      sf0008()
exec.c 158: {
exec.c 159:          unsigned i;
exec.c 160:
exec.c 161: pwr_cntr = 0;
exec.c 162: buzzflg = 0 ;
exec.c 163: port82 = 0;
exec.c 164:
exec.c 165:
exec.c 166: sf0066(0x82 ,port82);
exec.c 167:
exec.c 168: for( i=0; i<15; i++)
exec.c 169: {
exec.c 170: kbque[i] = 0xff ;
exec.c 171: }
exec.c 172: kblen = 0;
exec.c 173: rxmod0 = 0x74;
exec.c 174:
exec.c 175: }
exec.c 176:
exec.c 177:     int sf0011(tid,count,flags,funct)
exec.c 178:         int tid;
exec.c 179:         unsigned count;
exec.c 180:         unsigned flags;
exec.c 181:     unsigned (*funct)();
exec.c 182: {
exec.c 183:         TIMER *tp;
exec.c 184:
exec.c 185: tp = &tarray[tid];
exec.c 186:
exec.c 187: di();
exec.c 188: tp->id = tid;
exec.c 189: tp->reload = count;
exec.c 190: tp->downcount = count;
exec.c 191: tp->flags = flags;
exec.c 192: tp->funct = funct;
exec.c 193: tp->result = 0;
exec.c 194: ei();
exec.c 195: return(tid);
exec.c 196: }
exec.c 197:
exec.c 198:         int sf0013()
exec.c 199: {
exec.c 200:             TIMER *tp;
exec.c 201:            TIMER *temptp;
exec.c 202:             int i;
exec.c 203:
exec.c 204: for(i = 0; i < 10 ; i++ )
exec.c 205: {
exec.c 206: tp = &tarray[i];
exec.c 207: if(tp->flags & 0x01  )
exec.c 208: {
exec.c 209: if(!( --(tp->downcount) ))
exec.c 210: {
exec.c 211: tp->downcount = tp->reload;
exec.c 212:
exec.c 213: if(tp->funct)
```

```
exec.c 214: {
exec.c 215: tp->result = (tp->funct)(tp->id);
exec.c 216: }
exec.c 217: }
exec.c 218: }
exec.c 219: }
exec.c 220: }
exec.c 221:
exec.c 222:             int sf0012()
exec.c 223: {
exec.c 224:        char i;
exec.c 225:
exec.c 226: i = sf0065(0x82 );
exec.c 227: if( i & 0x08 )
exec.c 228: {
exec.c 229: sf0019();
exec.c 230: sf0027("Recharge me");
exec.c 231: sf0025();
exec.c 232: sf0027("Battery low!");
exec.c 233: sf0074();
exec.c 234: }
exec.c 235: pwr_cntr++;
exec.c 236: if( pwr_cntr > 4 )
exec.c 237: {
exec.c 238: pwr_cntr = 0;
exec.c 239: }
exec.c 240: }
exec.c 241:
exec.c 242:        int     checksm()
exec.c 243: {
exec.c 244:          int i;
exec.c 245:          char sum;
exec.c 246:          char *pnt;
exec.c 247:        char *pnt2;
exec.c 248:
exec.c 249: sum = 0;
exec.c 250: sum = tag = 0x32;
exec.c 251: pnt = &reslt[1];
exec.c 252: for( i=0; i < (sizeof(RESLT)*9); i++)
exec.c 253: {
exec.c 254: sum += *pnt++;
exec.c 255: }
exec.c 256: pnt = &cable_usr[0];
exec.c 257: for( i=0; i < (sizeof(CABLE_STRUCT)*10); i++)
exec.c 258: {
exec.c 259: sum += *pnt++;
exec.c 260: }
exec.c 261:
exec.c 262: if( sum != chksum )
exec.c 263: {
exec.c 264: tag = 0x32;
exec.c 265: pnt = &reslt[1];
exec.c 266: for( i=0; i < (sizeof(RESLT)*9); i++)
exec.c 267: *pnt++ = 0;
exec.c 268:
exec.c 269: chksum = 0x32;
exec.c 270: pnt = &cable_usr[0];
exec.c 271: pnt2 = &cable_init[16];
exec.c 272: for( i=0; i < (sizeof(CABLE_STRUCT)*10); i++)
exec.c 273: {
exec.c 274: chksum += *pnt2;
exec.c 275: *pnt++ = *pnt2++;
exec.c 276: }
exec.c 277: c_cb_ty = 0;
exec.c 278:
exec.c 279: defmac = deftbl[10];
exec.c 280: amp_flag = 1 ;
exec.c 281: ftm_flag = 0 ;
exec.c 282:
exec.c 283: low_thresh = 500;
exec.c 284: hi_thresh = 2000;
exec.c 285: }
exec.c 286: }
```

```
exec.c 287:
exec.c 288:          int      sf0014()
exec.c 289: {
exec.c 290:          int i;
exec.c 291:          char sum;
exec.c 292:          char *pnt;
exec.c 293:
exec.c 294: sum = 0;
exec.c 295: sum = tag = 0x32;
exec.c 296: pnt = &reslt[1];
exec.c 297: for( i=0; i < (sizeof(RESLT)*9); i++)
exec.c 298: {
exec.c 299: sum += *pnt++;
exec.c 300: }
exec.c 301: pnt = &cable_usr[0];
exec.c 302: for( i=0; i < (sizeof(CABLE_STRUCT)*10); i++)
exec.c 303: {
exec.c 304: sum += *pnt++;
exec.c 305: } .
exec.c 306:
exec.c 307: chksum = sum;
exec.c 308: }
exec.c 309:
exec.c 310:          int      sf0015(fail)
exec.c 311:     char fail;
exec.c 312: {
exec.c 313: sf0019();
exec.c 314: sf0022("Failure #%x", fail );
exec.c 315: sf0025();
exec.c 316: sf0027("Call for Service");
exec.c 317: while(1)
exec.c 318: {
exec.c 319: }
exec.c 320: }
exec.c 321:
exec.c 322:
exec.c 323:          int sf0010()
exec.c 324: {
exec.c 325: extern  unsigned Chksum;
exec.c 326:     unsigned i;
exec.c 327:
exec.c 328: i = sf0003();
exec.c 329:
exec.c 330: if( i != Chksum )
exec.c 331: { sf0015(0x02 ); }
exec.c 332: }
exec.c 333:
exec.c 334:
exec.c 335:

kbd.c 1:
..\include\std.h 1:
kbd.c 2:
..\include\tdr.h 1:
kbd.c 3:
..\include\globs.ext 1:
kbd.c 4:
kbd.c 5:
kbd.c 6:
kbd.c 7:
kbd.c 8:          int      sf0038()
kbd.c 9: {
kbd.c 10:    char i;
kbd.c 11:
kbd.c 12: do
kbd.c 13: {
kbd.c 14: i = sf0039();
kbd.c 15: }while(i == 0xff );
kbd.c 16: return(i);
kbd.c 17: }
kbd.c 18:
kbd.c 19:          int sf0040()
kbd.c 20: {
```

```
kbd.c 21:            char i;
kbd.c 22:            char j;
kbd.c 23:
kbd.c 24: for(i=0; i<4; i++)
kbd.c 25: {
kbd.c 26: port82 |= 0xf0;
kbd.c 27: port82 &= kbd_matrix[i];
kbd.c 28: sf0066(0x82 , port82);
kbd.c 29: j = sf0065(0x82 );
kbd.c 30: j >>= 5;
kbd.c 31:
kbd.c 32: if( j != 7)
kbd.c 33: {
kbd.c 34: key = ( kbdlist[ j ] + (i*3) );
kbd.c 35: break;
kbd.c 36: }
kbd.c 37: else
kbd.c 38: {
kbd.c 39: key = 0xff ;
kbd.c 40: }
kbd.c 41: }
kbd.c 42: }
kbd.c 43:
kbd.c 44:
kbd.c 45:            int       sf0039()
kbd.c 46: {
kbd.c 47:     char retkey;
kbd.c 48:
kbd.c 49: if(kblen < 1)
kbd.c 50: {
kbd.c 51: return(0xff );
kbd.c 52: }
kbd.c 53: else
kbd.c 54: {
kbd.c 55: di();
kbd.c 56: retkey = kbque[kblen-1];
kbd.c 57: kblen--;
kbd.c 58: ei();
kbd.c 59: return(retkey);
kbd.c 60: }
kbd.c 61: }
kbd.c 62:
kbd.c 63:            int       sf0041(key)
kbd.c 64:            int key;
kbd.c 65: {
kbd.c 66:     char retkey;
kbd.c 67:
kbd.c 68: if(kblen < 1)
kbd.c 69: {
kbd.c 70: return(0 );
kbd.c 71: }
kbd.c 72: else
kbd.c 73: {
kbd.c 74: di();
kbd.c 75: retkey = kbque[kblen-1];
kbd.c 76: ei();
kbd.c 77: if( key == retkey )
kbd.c 78: {
kbd.c 79: sf0038();
kbd.c 80: return(0 );
kbd.c 81: }
kbd.c 82: else
kbd.c 83: return(retkey);
kbd.c 84: }
kbd.c 85: }
kbd.c 86:
kbd.c 87:            int sf0042()
kbd.c 88: {
kbd.c 89:          char i;
kbd.c 90: extern    int sf0043();
kbd.c 91:
kbd.c 92: port82 &= 0x0f;
kbd.c 93:
```

```
kbd.c 94: sf0066(0x82 ,port82);
kbd.c 95: i = sf0065(0x82 ) & 0xE0.;
kbd.c 96: if ( i < 0xE0  )
kbd.c 97: {
kbd.c 98: sf0040();
kbd.c 99: tarray[1].downcount = 2;
kbd.c 100: tarray[1].funct = sf0043;
kbd.c 101: }
kbd.c 102: else
kbd.c 103: {
kbd.c 104: key = 0xff ;
kbd.c 105: }
kbd.c 106: return( key );
kbd.c 107: }
kbd.c 108:
kbd.c 109:        int sf0043()
kbd.c 110: {
kbd.c 111:           char old_key;
kbd.c 112:             char i;
kbd.c 113: extern      int sf0042();
kbd.c 114: extern         int sf0044();
kbd.c 115:
kbd.c 116:
kbd.c 117: old_key = key;
kbd.c 118: sf0040();
kbd.c 119: if( key != old_key )
kbd.c 120: {
kbd.c 121: tarray[1].funct = sf0042;
kbd.c 122: }
kbd.c 123: else
kbd.c 124: {
kbd.c 125:
kbd.c 126: pwr_cntr = 0;
kbd.c 127: tarray[1].funct = sf0044;
kbd.c 128:
kbd.c 129: if(kblen < 15)
kbd.c 130: {
kbd.c 131: for( i=(kblen + 1); i>0; i--)
kbd.c 132: {
kbd.c 133: kbque[i] = kbque[i-1];
kbd.c 134: }
kbd.c 135: kbque[0] = key;
kbd.c 136: kblen++;
kbd.c 137: }
kbd.c 138: }
kbd.c 139: }
kbd.c 140:
kbd.c 141:        int     sf0044()
kbd.c 142: {
kbd.c 143:          char old_key;
kbd.c 144:
kbd.c 145: old_key = key;
kbd.c 146: sf0040();
kbd.c 147: if( key != old_key )
kbd.c 148: {
kbd.c 149: tarray[1].funct = sf0042;
kbd.c 150: }
kbd.c 151: }
kbd.c 152:
kbd.c 153:    int     sf0045()
kbd.c 154: {
kbd.c 155: if( buzzflg == 0  )
kbd.c 156: {
kbd.c 157: sf0066(0x0a ,0x06);
kbd.c 158: }
kbd.c 159: }
kbd.c 160:
kbd.c 161:    int     sf0046()
kbd.c 162: {
kbd.c 163: buzzflg = 1 ;
kbd.c 164: sf0066(0x10 ,6);
kbd.c 165:
```

```
kbd.c 166: sf0066(0x0b , 0x55);
kbd.c 167: sf0066(0x0a , 0x56);
kbd.c 168: }
kbd.c 169:
kbd.c 170:   int     sf0047()
kbd.c 171: {
kbd.c 172: buzzflg = 0 ;
kbd.c 173: sf0066(0x10 ,0x17);
kbd.c 174:
kbd.c 175: }
kbd.c 176:
kbd.c 177:
kbd.c 178:

dsp.c 1:
dsp.c 2:
..\include\tdr.h 1:
dsp.c 3:
..\include\std.h 1:
dsp.c 4:
..\include\globs.ext 1:
dsp.c 5:
dsp.c 6:         int     sf0016(level)
dsp.c 7:            int level;
dsp.c 8: {
dsp.c 9:    unsigned i;
dsp.c 10: static         char char1[] =
dsp.c 11: { 0x00, 0x00, 0x00, 0x00, 0x00, 0x00, 0x00, 0x1f,
dsp.c 12: 0x00, 0x00, 0x00, 0x00, 0x00, 0x00, 0x1f, 0x1f,
dsp.c 13: 0x00, 0x00, 0x00, 0x00, 0x00, 0x1f, 0x1f, 0x1f,
dsp.c 14: 0x00, 0x00, 0x00, 0x00, 0x1f, 0x1f, 0x1f, 0x1f,
dsp.c 15: 0x00, 0x00, 0x00, 0x1f, 0x1f, 0x1f, 0x1f, 0x1f,
dsp.c 16: 0x00, 0x00, 0x1f, 0x1f, 0x1f, 0x1f, 0x1f, 0x1f,
dsp.c 17: 0x00, 0x1f, 0x1f, 0x1f, 0x1f, 0x1f, 0x1f, 0x1f,
dsp.c 18: 0x1f, 0x1f, 0x1f, 0x1f, 0x1f, 0x1f, 0x1f, 0x1f,
dsp.c 19: 0x00, 0x00, 0x00, 0x10, 0x10, 0x10, 0x1f, 0x00,
dsp.c 20: 0x00, 0x00, 0x00, 0x01, 0x01, 0x01, 0x1f, 0x00};
dsp.c 21:
dsp.c 22: for(i=0; i<64 ; i++ )
dsp.c 23: {
dsp.c 24: sf0017(0x84 , i + 0x40 );
dsp.c 25: if( level )
dsp.c 26: sf0017(0x85 , char1[i+64]);
dsp.c 27: else
dsp.c 28: sf0017(0x85 , char1[i]);
dsp.c 29: }
dsp.c 30: }
dsp.c 31:
dsp.c 32:      int     sf0017(port,data)
dsp.c 33:         char port;
dsp.c 34:         char data;
dsp.c 35: {
dsp.c 36: while( sf0065(0x84) & 0x80 )
dsp.c 37: ;
dsp.c 38: sf0066(port, data);
dsp.c 39: }
dsp.c 40:
dsp.c 41:         int     sf0018()
dsp.c 42: {
dsp.c 43:      int i;
dsp.c 44:
dsp.c 45: sf0017(0x84 ,0x38 );
dsp.c 46: sf0060(100);
dsp.c 47: sf0017(0x84 ,0x0c );
dsp.c 48: sf0060(100);
dsp.c 49: sf0017(0x84 ,0x06 );
dsp.c 50: sf0060(100);
dsp.c 51: sf0016();
dsp.c 52:
dsp.c 53: sf0019();
dsp.c 54: }
dsp.c 55:
dsp.c 56:    int sf0020(string)
```

```
dsp.c 57:            char *string;
dsp.c 58: {
dsp.c 59: while( *string )
dsp.c 60: {
dsp.c 61: sf0017(0x85,*string++);
dsp.c 62: }
dsp.c 63: }
dsp.c 64:
dsp.c 65:
dsp.c 66:         int sf0021(chr)
dsp.c 67:            char chr;
dsp.c 68: {
dsp.c 69: sf0017(0x85,chr);
dsp.c 70: }
dsp.c 71:
dsp.c 72:         int sf0022(format,arg1,arg2,arg3,arg4,arg5)
dsp.c 73:         char *format;
dsp.c 74:         unsigned arg1;
dsp.c 75:         unsigned arg2;
dsp.c 76:         unsigned arg3;
dsp.c 77:         unsigned arg4;
dsp.c 78:         unsigned arg5;
dsp.c 79: {
dsp.c 80: putf(sf0021,format,arg1,arg2,arg3,arg4,arg5);
dsp.c 81: }
dsp.c 82:
dsp.c 83:         int     sf0019()
dsp.c 84: {
dsp.c 85: sf0023();
dsp.c 86: sf0017(0x84 ,0x01 );
dsp.c 87: }
dsp.c 88:
dsp.c 89:         int     sf0024()
dsp.c 90: {
dsp.c 91: sf0017(0x84 , 0x02 );
dsp.c 92: }
dsp.c 93:
dsp.c 94:         int     sf0023()
dsp.c 95: {
dsp.c 96: sf0017(0x84 ,0x0c );
dsp.c 97: }
dsp.c 98:
dsp.c 99:         int     sf0025()
dsp.c 100: {
dsp.c 101: sf0017(0x84 ,0xc0 );
dsp.c 102: }
dsp.c 103:
dsp.c 104:         int     sf0026(lnth)
dsp.c 105: char lnth;
dsp.c 106: {      char i;
dsp.c 107:
dsp.c 108:
dsp.c 109:
dsp.c 110: if(lnth > 0x10)
dsp.c 111: {
dsp.c 112: lnth = 0x10;
dsp.c 113: }
dsp.c 114:
dsp.c 115: i = 16 - lnth;
dsp.c 116: while( lnth > 0)
dsp.c 117: {
dsp.c 118: sf0017(0x85 , '>');
dsp.c 119: lnth--;
dsp.c 120: }
dsp.c 121: while( i > 0)
dsp.c 122: {
dsp.c 123: sf0017(0x85 , ' ');
dsp.c 124: i--;
dsp.c 125: }
dsp.c 126: }
dsp.c 127:
dsp.c 128:         int     sf0027(string)
dsp.c 129:         char *string;
```

```
dsp.c 130: {
dsp.c 131:      char    length;
dsp.c 132:      char    *index;
dsp.c 133:          char i;
dsp.c 134:
dsp.c 135: index = string;
dsp.c 136: length = 0;
dsp.c 137: while ( *index++ != 0x00  )
dsp.c 138: length++;
dsp.c 139: if( length > 16)
dsp.c 140: {
dsp.c 141: length = 16;
dsp.c 142: }
dsp.c 143: for(i=0; i<((16-length)/2); i++)
dsp.c 144: {
dsp.c 145: sf0017(0x85 ,' ');
dsp.c 146: }
dsp.c 147: sf0022("%-16s",string);
dsp.c 148: }
dsp.c 149:
dsp.c 150:       int     sf0028()
dsp.c 151: {
dsp.c 152: sf0019();
dsp.c 153: sf0020("Hit key to exit");
dsp.c 154: }
dsp.c 155:
dsp.c 156:       int     sf0029(strng)
dsp.c 157:       char *strng;
dsp.c 158: {
dsp.c 159: sf0019();
dsp.c 160: sf0028();
dsp.c 161: sf0025();
dsp.c 162: sf0027(strng);
dsp.c 163: sf0038();
dsp.c 164: }
dsp.c 165:
dsp.c 166:          int     sf0030(type)
dsp.c 167: char type;
dsp.c 168: {
dsp.c 169: extern   unsigned OpnDsp;
dsp.c 170: extern   unsigned DatDsp;
dsp.c 171: extern   unsigned CptDsp;
dsp.c 172: extern   unsigned Microt;
dsp.c 173:       char *p;
dsp.c 174:
dsp.c 175: sf0024();
dsp.c 176: if(type)
dsp.c 177: {
dsp.c 178: p = &CptDsp;
dsp.c 179: sf0027(p);
dsp.c 180: sf0025();
dsp.c 181: p = &Microt;
dsp.c 182: sf0022(" %s ", p);
dsp.c 183: p = &DatDsp;
dsp.c 184: sf0020(p);
dsp.c 185: }
dsp.c 186: else
dsp.c 187: {
dsp.c 188: p = &OpnDsp;
dsp.c 189: sf0027(p);
dsp.c 190: }
dsp.c 191:
dsp.c 192: }
dsp.c 193:
dsp.c 194:          int     sf0031(p)
dsp.c 195:       int p;
dsp.c 196: {
dsp.c 197:
dsp.c 198: if( p )
dsp.c 199: {
dsp.c 200: sf0024();
dsp.c 201: sf0027("Select Function");
dsp.c 202: sf0025();
```

```
dsp.c 203: sf0027(cbl_name);
dsp.c 204: }
dsp.c 205: }
dsp.c 206:
dsp.c 207:          int      sf0032()
dsp.c 208: {
dsp.c 209:     unsigned i;
dsp.c 210:
dsp.c 211: sf0024();
dsp.c 212: sf0027("Enter Cable Type");
dsp.c 213: sf0025();
dsp.c 214: sf0027(cbl_name);
dsp.c 215: }
dsp.c 216:
dsp.c 217:          int      f152()
dsp.c 218: {
dsp.c 219:     char *bpnt;
dsp.c 220:          int i;
dsp.c 221:
dsp.c 222: sf0024();
dsp.c 223: sf0020("Hit key to exit   ");
dsp.c 224: sf0025();
dsp.c 225: sf0020("No Faults Found ");
dsp.c 226:
dsp.c 227: reslt[0].ft_dist = 0;
dsp.c 228: reslt[0].m_dist = 0;
dsp.c 229: reslt[0].valid = 1 ;
dsp.c 230:
dsp.c 231: bpnt = cbl_name;
dsp.c 232: for( i=0; i<sizeof(reslt[0].name); i++)
dsp.c 233: reslt[0].name[i] = *bpnt++;
dsp.c 234: reslt[0].nvp = velocity;
dsp.c 235: reslt[0].imped = impedance;
dsp.c 236: reslt[0].f_type = 0 ;
dsp.c 237: }
dsp.c 238:
dsp.c 239:    int     sf0033(typ)
dsp.c 240:       char typ;
dsp.c 241: {
dsp.c 242: sf0028();
dsp.c 243: sf0025();
dsp.c 244: if(typ == 1 )
dsp.c 245: {
dsp.c 246: sf0020("Pulsing wide...  ");
dsp.c 247: }
dsp.c 248: else
dsp.c 249: {
dsp.c 250: sf0020("Pulsing thin...  ");
dsp.c 251: }
dsp.c 252: }
dsp.c 253:
dsp.c 254:    int     f402()
dsp.c 255: {
dsp.c 256:  char i;
dsp.c 257:
dsp.c 258: sf0016(1);
dsp.c 259: sf0019();
dsp.c 260:
dsp.c 261: sf0022("Select 1)--%c%c---", 0x00 , 0x01 );
dsp.c 262: sf0025();
dsp.c 263: sf0022("Pulse  2)-%c__%c---",0x00 , 0x01 );
dsp.c 264: i = sf0038();
dsp.c 265: return(i);
dsp.c 266:
dsp.c 267: }
dsp.c 268:
dsp.c 269:    int     f1002()
dsp.c 270: {
dsp.c 271:     unsigned i;
dsp.c 272: sf0019();
dsp.c 273: sf0027("Attach cable");
dsp.c 274: sf0025();
dsp.c 275: sf0027("Hit a key...");
```

```
dsp.c 276: }
dsp.c 277:
dsp.c 278:         int        sf0073()
dsp.c 279: {
dsp.c 280:     unsigned i;
dsp.c 281:     unsigned j;
dsp.c 282:
dsp.c 283: sf0028();
dsp.c 284: sf0025();
dsp.c 285: sf0020(" Scanning");
dsp.c 286: for(i=0; i<6; i++)
dsp.c 287: {
dsp.c 288: sf0017(0x85 , 0xa5 );
dsp.c 289:
dsp.c 290: j = sf0039();
dsp.c 291: if( (j != 0xff ) && ( j != 1    ) )
dsp.c 292: {
dsp.c 293: break;
dsp.c 294: }
dsp.c 295: }
dsp.c 296: if( i != 6 )
dsp.c 297: {
dsp.c 298: return( 0  );
dsp.c 299: }
dsp.c 300: return(1 );
dsp.c 301: }
dsp.c 302:
dsp.c 303:         int     sf0034(str1,str2)
dsp.c 304:     char *str1;
dsp.c 305:     char *str2;
dsp.c 306: {
dsp.c 307: sf0019();
dsp.c 308: sf0020(str1);
dsp.c 309: sf0025();
dsp.c 310: sf0020(str2);
dsp.c 311:
dsp.c 312: }
dsp.c 313:
dsp.c 314:         int     sf0035(str1,str2)
dsp.c 315:     char *str1;
dsp.c 316:     char *str2;
dsp.c 317: {
dsp.c 318: sf0019();
dsp.c 319: sf0027(str1);
dsp.c 320: sf0025();
dsp.c 321: sf0027(str2);
dsp.c 322:
dsp.c 323: }
dsp.c 324:
dsp.c 325:         int     sf0036(str1,str2,value)
dsp.c 326:     char *str1;
dsp.c 327:     char *str2;
dsp.c 328:     unsigned value;
dsp.c 329: {
dsp.c 330: sf0019();
dsp.c 331: sf0027(str1);
dsp.c 332: sf0025();
dsp.c 333: sf0022(str2, value);
dsp.c 334: }
dsp.c 335:
dsp.c 336:     int sf0037(typ, dist, mag)
dsp.c 337:     char typ;
dsp.c 338: unsigned dist;
dsp.c 339:     char mag;
dsp.c 340: {
dsp.c 341: unsigned front;
dsp.c 342:     unsigned nvp;
dsp.c 343: char *bpnt;
dsp.c 344:     int i;
dsp.c 345:
dsp.c 346: sf0024();
dsp.c 347:
dsp.c 348: if( typ < 3 )
```

```
dsp.c 349:
dsp.c 350: {
dsp.c 351: front = scbl_front;
dsp.c 352: nvp = scable_nvp;
dsp.c 353: }
dsp.c 354: else
dsp.c 355: {
dsp.c 356: front = ocbl_front;
dsp.c 357: nvp = ocable_nvp;
dsp.c 358: }
dsp.c 359: if( dist < front )
dsp.c 360: dist = front;
dsp.c 361:
dsp.c 362: sf0053( front, nvp, dist );
dsp.c 363:
dsp.c 364: if( dist - front < 0x0c  )
dsp.c 365: {
dsp.c 366: sf0020("Hit key to exit   ");
dsp.c 367: sf0025();
dsp.c 368:
dsp.c 369: if (typ < 3)
dsp.c 370: {
dsp.c 371: sf0020("Short under ");
dsp.c 372: reslt[0].f_type = 4 ;
dsp.c 373: }
dsp.c 374: else
dsp.c 375: {
dsp.c 376: sf0020("Open within ");
dsp.c 377: reslt[0].f_type = 3 ;
dsp.c 378: }
dsp.c 379:
dsp.c 380: if( ftm_flag )
dsp.c 381: {
dsp.c 382: front = (0x0c *1524)/nvp;
dsp.c 383: sf0022("%1u.%1um      ", (front/10), (front%10) );
dsp.c 384: }
dsp.c 385: else
dsp.c 386: {
dsp.c 387: sf0022("%2uft  ", (0x0c *500)/nvp );
dsp.c 388: }
dsp.c 389: }
dsp.c 390: else
dsp.c 391: {
dsp.c 392:
dsp.c 393: if(typ < 3)
dsp.c 394: {
dsp.c 395: sf0020("Short at ");
dsp.c 396: reslt[0].f_type = 2 ;
dsp.c 397: }
dsp.c 398: else
dsp.c 399: {
dsp.c 400: sf0020("Open at ");
dsp.c 401: reslt[0].f_type = 1 ;
dsp.c 402: }
dsp.c 403:
dsp.c 404: if( ftm_flag )
dsp.c 405: {
dsp.c 406: sf0022("%4u.%1um     ", (reslt[0].m_dist/10), (reslt[0].m_dist%10) );
dsp.c 407: }
dsp.c 408: else
dsp.c 409: {
dsp.c 410: sf0022("%5uft  ", reslt[0].ft_dist );
dsp.c 411: }
dsp.c 412: sf0025();
dsp.c 413: if( amp_flag )
dsp.c 414:
dsp.c 415: sf0026( mag/7 );
dsp.c 416: else
dsp.c 417: sf0027("Hit key to exit");
dsp.c 418: }
dsp.c 419:
dsp.c 420: reslt[0].valid   = 1 ;
dsp.c 421:
```

```
dsp.c 422: bpnt = cbl_name;
dsp.c 423: for( i=0; i<sizeof(reslt[0].name); i++)
dsp.c 424: reslt[0].name[i] = *bpnt++;
dsp.c 425:
dsp.c 426: reslt[0].nvp = velocity;
dsp.c 427: reslt[0].imped = impedance;
dsp.c 428:
dsp.c 429: }
dsp.c 430:
dsp.c 431:

hd80asci.c 1:
hd80asci.c 2:
..\include\std.h 1:
hd80asci.c 3:
..\include\equ.h 1:
hd80asci.c 4:
..\include\box.h 1:
hd80asci.c 5:
..\include\TDR.H 1:
hd80asci.c 6:
hd80asci.c 7: extern     unsigned char    rxnxti;
hd80asci.c 8: extern     unsigned char    rxnxto;
hd80asci.c 9: extern     unsigned char    xonoff;
hd80asci.c 10:
hd80asci.c 11:
hd80asci.c 12:
hd80asci.c 13:
hd80asci.c 14: sf0086()
hd80asci.c 15: {
hd80asci.c 16: }
hd80asci.c 17:
hd80asci.c 18: rputs(str)
hd80asci.c 19: char *str;
hd80asci.c 20: {
hd80asci.c 21: while ( *str )
hd80asci.c 22: rputc(*str++);
hd80asci.c 23: }
hd80asci.c 24:
hd80asci.c 25: rputc(c)
hd80asci.c 26: char c;
hd80asci.c 27: {
hd80asci.c 28: char rstat();
hd80asci.c 29: char temp;
hd80asci.c 30:
hd80asci.c 31: while( (rxnxti - rxnxto) || !xonoff )
hd80asci.c 32: {
hd80asci.c 33: if( (temp = sf0072()) == 0x13  )
hd80asci.c 34: {
hd80asci.c 35: xonoff = 0;
hd80asci.c 36:
hd80asci.c 37: if( sf0041() != 0xff  )
hd80asci.c 38: xonoff = 1;
hd80asci.c 39: }
hd80asci.c 40: if( temp == 0x11  )
hd80asci.c 41: {
hd80asci.c 42: xonoff = 1;
hd80asci.c 43: }
hd80asci.c 44: }
hd80asci.c 45:
hd80asci.c 46:
hd80asci.c 47: if( xonoff )
hd80asci.c 48: {
hd80asci.c 49: while(!(rstat() & 0x02  )) ;
hd80asci.c 50: sf0077(c);
hd80asci.c 51: }
hd80asci.c 52: else
hd80asci.c 53: {
hd80asci.c 54:
hd80asci.c 55: if( sf0042() != 0xff  )
hd80asci.c 56: xonoff = 1;
hd80asci.c 57: }
hd80asci.c 58:
hd80asci.c 59: }
```

```
hd80asci.c 60:
hd80asci.c 61: char rstat()
hd80asci.c 62: {
hd80asci.c 63: char c;
hd80asci.c 64:
hd80asci.c 65: c = sf0076();
hd80asci.c 66: return(c);
hd80asci.c 67: }
hd80asci.c 68:
hd80asci.c 69:        int rputf(format,arg1,arg2,arg3,arg4,arg5)
hd80asci.c 70:        char *format;
hd80asci.c 71:        unsigned arg1;
hd80asci.c 72:        unsigned arg2;
hd80asci.c 73:        unsigned arg3;
hd80asci.c 74:        unsigned arg4;
hd80asci.c 75:        unsigned arg5;
hd80asci.c 76: {
hd80asci.c 77:        int rputc();
hd80asci.c 78:
hd80asci.c 79: putf(rputc,format,arg1,arg2,arg3,arg4,arg5);
hd80asci.c 80: }
hd80asci.c 81:
hd80asci.c 82:  int putf(cputc,format,firstarg)
hd80asci.c 83:  char (*cputc)();
hd80asci.c 84:  char *format;
hd80asci.c 85:  unsigned firstarg;
hd80asci.c 86: {
hd80asci.c 87:        unsigned c;
hd80asci.c 88:  int fillsize;
hd80asci.c 89:        int i;
hd80asci.c 90:  char leftadj;
hd80asci.c 91:        char *p;
hd80asci.c 92:  unsigned padchar;
hd80asci.c 93:  unsigned *parg;
hd80asci.c 94:  unsigned textsize;
hd80asci.c 95:  int value;
hd80asci.c 96:  unsigned width;
hd80asci.c 97:  char *textptr;
hd80asci.c 98:
hd80asci.c 99: char textbuff[80];
hd80asci.c 100: char *fmtdec();
hd80asci.c 101: char *fmthex();
hd80asci.c 102: char *fmtbin();
hd80asci.c 103:
hd80asci.c 104: parg = &firstarg;
hd80asci.c 105:
hd80asci.c 106: while(c = *format++)
hd80asci.c 107: {
hd80asci.c 108: if( c != '%')
hd80asci.c 109: {
hd80asci.c 110: (*cputc)(c);
hd80asci.c 111: continue;
hd80asci.c 112: }
hd80asci.c 113: leftadj = 0 ;
hd80asci.c 114: padchar = ' ';
hd80asci.c 115: c = *format++;
hd80asci.c 116: if ( c == '-' )
hd80asci.c 117: {
hd80asci.c 118: leftadj = 1 ;
hd80asci.c 119: c = *format++;
hd80asci.c 120: }
hd80asci.c 121: if ( c == '0' )
hd80asci.c 122: {
hd80asci.c 123: padchar = '0';
hd80asci.c 124: c = *format++;
hd80asci.c 125: }
hd80asci.c 126:
hd80asci.c 127: width = 0;
hd80asci.c 128: while( isdigit(c))
hd80asci.c 129: {
hd80asci.c 130: width = 10 * width + ( c - '0' );
hd80asci.c 131: c = *format++;
hd80asci.c 132: }
```

```
hd80asci.c 133:
hd80asci.c 134: textptr = textbuff;
hd80asci.c 135: switch (c)
hd80asci.c 136: {
hd80asci.c 137: case 'd':
hd80asci.c 138: case 'D':
hd80asci.c 139: value = *parg++;
hd80asci.c 140: if( value < 0)
hd80asci.c 141: {
hd80asci.c 142: value = -value;
hd80asci.c 143: *textptr++ = '-';
hd80asci.c 144: }
hd80asci.c 145: textptr = fmtdec(textptr,value);
hd80asci.c 146: break;
hd80asci.c 147:
hd80asci.c 148: case 'u':
hd80asci.c 149: case 'U':
hd80asci.c 150: textptr = fmtdec(textptr,*parg++);
hd80asci.c 151: break;
hd80asci.c 152:
hd80asci.c 153: case 'x':
hd80asci.c 154: case 'X':
hd80asci.c 155: textptr = fmthex(textptr,*parg++);
hd80asci.c 156: break;
hd80asci.c 157:
hd80asci.c 158: case 'b':
hd80asci.c 159: case 'B':
hd80asci.c 160: textptr = fmtbin(textptr,*parg++);
hd80asci.c 161: break;
hd80asci.c 162:
hd80asci.c 163: case 'c':
hd80asci.c 164: case 'C':
hd80asci.c 165: *textptr++ = *parg++;
hd80asci.c 166: break;
hd80asci.c 167:
hd80asci.c 168: case 's':
hd80asci.c 169: case 'S':
hd80asci.c 170: p = (char *)(*parg++);
hd80asci.c 171: while(*textptr++ = *p++)
hd80asci.c 172: ;
hd80asci.c 173: textptr--;
hd80asci.c 174: break;
hd80asci.c 175:
hd80asci.c 176:
hd80asci.c 177: case 'p':
hd80asci.c 178: case 'P':
hd80asci.c 179: c = *format++;
hd80asci.c 180: for(i=0; i<=width; i++)
hd80asci.c 181: *textptr++ = c;
hd80asci.c 182: textptr--;
hd80asci.c 183: break;
hd80asci.c 184: }
hd80asci.c 185:
hd80asci.c 186: textsize = textptr - textbuff;
hd80asci.c 187: if(width == 0)
hd80asci.c 188: {
hd80asci.c 189: putb(cputc,textbuff,textsize);
hd80asci.c 190: }
hd80asci.c 191: else
hd80asci.c 192: {
hd80asci.c 193: fillsize = width - textsize;
hd80asci.c 194: if(leftadj)
hd80asci.c 195: {
hd80asci.c 196: putb(cputc,textbuff,textsize);
hd80asci.c 197: for(i=0;i < fillsize; (*cputc)(padchar), i++)
hd80asci.c 198: ;
hd80asci.c 199: }
hd80asci.c 200: else
hd80asci.c 201: {
hd80asci.c 202: for( i=0; i < fillsize;(*cputc)(padchar), i++)
hd80asci.c 203: ;
hd80asci.c 204: putb(cputc,textbuff,textsize);
hd80asci.c 205: }
```

```
hd80asci.c 206: }
hd80asci.c 207: }
hd80asci.c 208: }
hd80asci.c 209:
hd80asci.c 210:     int putb(cputc,string,length)
hd80asci.c 211:         char (*cputc)();
hd80asci.c 212:         char *string;
hd80asci.c 213:         int length;
hd80asci.c 214: {
hd80asci.c 215: while(length--)
hd80asci.c 216: (*cputc)(*string++);
hd80asci.c 217: }
hd80asci.c 218:
hd80asci.c 219: char *fmtdec(tp,number)
hd80asci.c 220:
hd80asci.c 221:         char *tp;
hd80asci.c 222:         unsigned number;
hd80asci.c 223: {
hd80asci.c 224:         int testnum;
hd80asci.c 225:     unsigned decdigit;
hd80asci.c 226:         unsigned i;
hd80asci.c 227:     char leadzero;
hd80asci.c 228:         unsigned power10;
hd80asci.c 229:     unsigned pwr10tab[4];
hd80asci.c 230:
hd80asci.c 231: pwr10tab[0] = 10000;
hd80asci.c 232: pwr10tab[1] = 1000;
hd80asci.c 233: pwr10tab[2] = 100;
hd80asci.c 234: pwr10tab[3] = 10;
hd80asci.c 235:
hd80asci.c 236: testnum = number;
hd80asci.c 237: if (testnum < 0)
hd80asci.c 238: {
hd80asci.c 239: number -= 30000;
hd80asci.c 240: decdigit = 3;
hd80asci.c 241: leadzero = 0 ;
hd80asci.c 242: }
hd80asci.c 243: else
hd80asci.c 244: {
hd80asci.c 245: decdigit = 0;
hd80asci.c 246: leadzero = 1 ;
hd80asci.c 247: }
hd80asci.c 248:
hd80asci.c 249: for (i=0; i<4; i++,  decdigit = 0)
hd80asci.c 250: {
hd80asci.c 251: power10 = pwr10tab[i];
hd80asci.c 252:
hd80asci.c 253: while(1)
hd80asci.c 254: {
hd80asci.c 255: number -= power10;
hd80asci.c 256: testnum = number;
hd80asci.c 257: if (testnum >= 0)
hd80asci.c 258: decdigit++;
hd80asci.c 259: else
hd80asci.c 260: break;
hd80asci.c 261: }
hd80asci.c 262:
hd80asci.c 263: number += power10;
hd80asci.c 264: if (decdigit != 0 || !leadzero)
hd80asci.c 265: {
hd80asci.c 266: *tp++ = decdigit + '0';
hd80asci.c 267: leadzero = 0 ;
hd80asci.c 268: }
hd80asci.c 269: }
hd80asci.c 270: *tp++ = number + '0';
hd80asci.c 271: return(tp);
hd80asci.c 272: }
hd80asci.c 273:
hd80asci.c 274: char *fmthex(tp,number)
hd80asci.c 275:
hd80asci.c 276:         char *tp;
hd80asci.c 277:         unsigned number;
hd80asci.c 278: {
```

```
hd80asci.c 279:       unsigned hexdigit;
hd80asci.c 280:       char leadzero;
hd80asci.c 281:           int shift;
hd80asci.c 282:       char *hextable;
hd80asci.c 283:
hd80asci.c 284: hextable = "0123456789ABCDEF";
hd80asci.c 285:
hd80asci.c 286: leadzero = 1 ;
hd80asci.c 287: for (shift = 12; shift >= 0; shift -= 4)
hd80asci.c 288: {
hd80asci.c 289: hexdigit = (number >> shift) & 0x0f;
hd80asci.c 290: if (hexdigit != 0 || !leadzero || shift == 0)
hd80asci.c 291: {
hd80asci.c 292: *tp++ = hextable[hexdigit];
hd80asci.c 293: leadzero = 0 ;
hd80asci.c 294: }
hd80asci.c 295: }
hd80asci.c 296: return(tp);
hd80asci.c 297: }
hd80asci.c 298:
hd80asci.c 299: char *fmtbin(tp,number)
hd80asci.c 300:
hd80asci.c 301:           char *tp;
hd80asci.c 302:           unsigned number;
hd80asci.c 303: {
hd80asci.c 304:           int bit;
hd80asci.c 305:      unsigned masktab[16];
hd80asci.c 306:
hd80asci.c 307: masktab[0] = 0x0001;
hd80asci.c 308: for (bit=1; bit<16; bit++)
hd80asci.c 309: {
hd80asci.c 310: masktab[bit] = masktab[bit-1] << 1;
hd80asci.c 311: }
hd80asci.c 312:
hd80asci.c 313: for (bit = 15; bit >= 1 && (number & masktab[bit]) == 0; bit--)
hd80asci.c 314: ;
hd80asci.c 315: while (bit >= 0)
hd80asci.c 316: {
hd80asci.c 317: *tp++ = (number & masktab[bit--]) ? '1' : '0';
hd80asci.c 318: }
hd80asci.c 319: return(tp);
hd80asci.c 320: }
hd80asci.c 321:
hd80asci.c 322:
hd80asci.c 323:

utils.c 1:
utils.c 2:
..\include\tdr.h 1:
utils.c 3:
..\include\std.h 1:
utils.c 4:
..\include\nglobs.ext 1:
utils.c 5:
..\include\globs.ext 1:
utils.c 6:
utils.c 7:       int           f400()
utils.c 8: {
utils.c 9:  char quit;
utils.c 10:          unsigned i;
utils.c 11:          char j;
utils.c 12:
utils.c 13: quit = 0 ;
utils.c 14: while( !quit )
utils.c 15: {
utils.c 16: i = f402();
utils.c 17: switch(i)
utils.c 18: {
utils.c 19: case 1 :
utils.c 20:
utils.c 21: sf0033(0 );
utils.c 22: do
utils.c 23: {
utils.c 24: sf0066(0x80 , 0x20   );
```

```
utils.c 25: sf0066(0x80 ,0x20  | 0x10 );
utils.c 26: }while( ! sf0041(0xff ) );
utils.c 27:
utils.c 28: sf0066(0x80 ,0x20 );
utils.c 29: break;
utils.c 30:
utils.c 31: case 2 :
utils.c 32:
utils.c 33: sf0033(1 );
utils.c 34: do
utils.c 35: {
utils.c 36: sf0066(0x80 , 0x20  );
utils.c 37: sf0066(0x80 , 0x00 );
utils.c 38: }while( ! sf0041(0xff ) );
utils.c 39: sf0066(0x80 ,0x20 );
utils.c 40: break;
utils.c 41:
utils.c 42: default:
utils.c 43: quit = 1 ;
utils.c 44: break;
utils.c 45:
utils.c 46: }
utils.c 47: if( sf0041(0xff ) )
utils.c 48: quit = 1 ;
utils.c 49: }
utils.c 50: }
utils.c 51:
utils.c 52:          int      f500()
utils.c 53: {
utils.c 54:          char j;
utils.c 55:          char pos;
utils.c 56:          char neg;
utils.c 57:     unsigned level;
utils.c 58:     unsigned off_count;
utils.c 59:     unsigned levels[5];
utils.c 60:     char beep_level;
utils.c 61: static unsigned int counts[] = { 0, 4, 3, 2, 1, 0 };
utils.c 62:
utils.c 63: level = (hi_thresh - low_thresh)/4;
utils.c 64: levels[0] = low_thresh;
utils.c 65: levels[4] = hi_thresh;
utils.c 66: for(j=1; j<4; j++)
utils.c 67: {
utils.c 68: levels[j] = low_thresh + (j*level);
utils.c 69: }
utils.c 70:
utils.c 71: off_count = 0;
utils.c 72: beep_level = 0;
utils.c 73: sf0028();
utils.c 74: do
utils.c 75: {
utils.c 76: sf0025();
utils.c 77: if(beep_level == 0)
utils.c 78: sf0047();
utils.c 79: if( off_count == 0)
utils.c 80: {
utils.c 81: if( beep_level )
utils.c 82: {
utils.c 83: if(buzzflg == 0 )
utils.c 84: sf0046();
utils.c 85: off_count = counts[beep_level];
utils.c 86: }
utils.c 87: }
utils.c 88: else
utils.c 89: {
utils.c 90: sf0047();
utils.c 91: off_count--;
utils.c 92: }
utils.c 93: pos = f502(0x40 );
utils.c 94: if( off_count == 0)
utils.c 95: {
utils.c 96: if( beep_level )
utils.c 97: {
```

```
utils.c 98: if(buzzflg == 0 )
utils.c 99: sf0046();
utils.c 100: off_count = counts[beep_level];
utils.c 101: }
utils.c 102: }
utils.c 103: else
utils.c 104: {
utils.c 105: sf0047();
utils.c 106: off_count--;
utils.c 107: }
utils.c 108: neg = f502(0x00 );
utils.c 109: pos -= 2;
utils.c 110: neg += 2;
utils.c 111:
utils.c 112: level = (pos - neg)*20;
utils.c 113: sf0022("noise = %1d.%02dVp-p   ",((pos-neg)*2)/100,
utils.c 114: ((pos-neg)*2)%100);
utils.c 115:
utils.c 116: for(j=0; j<5; j++)
utils.c 117: {
utils.c 118: if(level < levels[j])
utils.c 119: break;
utils.c 120: }
utils.c 121: beep_level = j;
utils.c 122:
utils.c 123: if( (beep_level == 5) && (sf0042() != 0xff  )  )
utils.c 124: break;
utils.c 125:
utils.c 126: }while( ! sf0041(5 ) );
utils.c 127: sf0047();
utils.c 128: }
utils.c 129:
utils.c 130:     int     f1006(len,pmt1,pmt2)
utils.c 131:         int len;
utils.c 132:     char *pmt1;
utils.c 133:     char *pmt2;
utils.c 134: {
utils.c 135:        char i;
utils.c 136:        char j;
utils.c 137:     char key[5];
utils.c 138:
utils.c 139:     char key_cnt;
utils.c 140:     unsigned rslt;
utils.c 141:     char quit;
utils.c 142:
utils.c 143: static unsigned int pwr[] = { 1, 10, 100, 1000 };
utils.c 144:
utils.c 145: for( i=0; i<len; i++)
utils.c 146: {
utils.c 147: key[i] = 0x5f;
utils.c 148: }
utils.c 149:
utils.c 150: sf0019();
utils.c 151: sf0020(pmt1);
utils.c 152: sf0052( key,len,pmt2 );
utils.c 153:
utils.c 154: quit = 0 ;
utils.c 155: key_cnt = 0;
utils.c 156: rslt = 0;
utils.c 157: while( 1 )
utils.c 158: {
utils.c 159: i = sf0038();
utils.c 160: if( i == 0x0a    )
utils.c 161: {
utils.c 162: if( key_cnt == 0 )
utils.c 163: {
utils.c 164: quit = 1 ;
utils.c 165: rslt = -1;
utils.c 166: break;
utils.c 167: }
utils.c 168: else
utils.c 169: {
utils.c 170: key_cnt = 0;
```

```
utils.c 171: for( i=0; i<len; i++)
utils.c 172: {
utils.c 173: key[i] = 0x5f;
utils.c 174: }
utils.c 175: sf0052( key,len,pmt2 );
utils.c 176: }
utils.c 177: }
utils.c 178: else if( i != 0x0c   )
utils.c 179: {
utils.c 180: key_cnt++;
utils.c 181: if( key_cnt > len)
utils.c 182: {
utils.c 183: key_cnt = len;
utils.c 184: }
utils.c 185: for( j=key_cnt; j>0; j--)
utils.c 186: {
utils.c 187: key[j] = key[j-1];
utils.c 188: }
utils.c 189: if( i == 0x0b  )
utils.c 190: {
utils.c 191: i -= 0x0b;
utils.c 192: }
utils.c 193: key[0] = i + 0x30;
utils.c 194: sf0052( key,len,pmt2 );
utils.c 195: }
utils.c 196: else
utils.c 197: {
utils.c 198: if( key_cnt == 0 )
utils.c 199: {
utils.c 200: rslt = -1;
utils.c 201: }
utils.c 202: break;
utils.c 203: }
utils.c 204: }
utils.c 205:
utils.c 206: if( rslt != -1 )
utils.c 207: {
utils.c 208: rslt = 0;
utils.c 209: if( (quit == 0 ) && (key_cnt > 0) )
utils.c 210: {
utils.c 211: for( i=0; i<key_cnt; i++)
utils.c 212: {
utils.c 213: rslt += (key[i]&0x0f) * pwr[i];
utils.c 214: }
utils.c 215: }
utils.c 216: }
utils.c 217: return(rslt);
utils.c 218: }
utils.c 219:
utils.c 220:         int      sf0052(keys,len,pmt)
utils.c 221:         char keys[];
utils.c 222:            int len;
utils.c 223:            char *pmt;
utils.c 224: {
utils.c 225:    char i;
utils.c 226:
utils.c 227: sf0025();
utils.c 228: sf0022("%s ",pmt);
utils.c 229: for( i=0; i<len; i++)
utils.c 230: {
utils.c 231: sf0017(0x85 , keys[len-1-i]);
utils.c 232: }
utils.c 233: }
utils.c 234:
utils.c 235:         int      f88()
utils.c 236: {
utils.c 237:         unsigned i;
utils.c 238:         char typ;
utils.c 239:
utils.c 240: while(1)
utils.c 241: {
utils.c 242: typ = 0x70;
utils.c 243:
```

```
utils.c 244: sf0035("Select User Type", "0 Through 9->");
utils.c 245: sf0022("%c",(typ + 0x30));
utils.c 246: i = sf0038();
utils.c 247:
utils.c 248: if ( (i == 0x0a  ) || (i == 0x0c  ) )
utils.c 249: {
utils.c 250: break;
utils.c 251: }
utils.c 252: else
utils.c 253: {
utils.c 254: if( i == 0x0b  )
utils.c 255: {
utils.c 256: i = 0;
utils.c 257: }
utils.c 258: typ = i;
utils.c 259: }
utils.c 260:
utils.c 261: if( cable_usr[typ].s_nvp )
utils.c 262: {
utils.c 263: c_cb_ty = cbl_type = 16 + typ;
utils.c 264: pvc_tfe = 0;
utils.c 265: reslt[0].name[0] = 0;
utils.c 266: f87( cbl_type );
utils.c 267:
utils.c 268: break;
utils.c 269: }
utils.c 270: else
utils.c 271: {
utils.c 272: sf0035( cable_usr[typ].name, "is NOT set!");
utils.c 273: sf0063(10000);
utils.c 274:
utils.c 275: }
utils.c 276: }
utils.c 277: }
utils.c 278:
utils.c 279:          int     f940()
utils.c 280: {
utils.c 281:    unsigned i;
utils.c 282:    unsigned j;
utils.c 283:
utils.c 284: i = f1006(4,"Enter LOW noise", "threshold");
utils.c 285: if( i != -1 )
utils.c 286: {
utils.c 287: if( i > 5000 )
utils.c 288: {
utils.c 289: sf0029("Level too high");
utils.c 290: }
utils.c 291: else
utils.c 292: {
utils.c 293: j = f1006(4,"Enter HIGH noise", "threshold");
utils.c 294: if( j != -1)
utils.c 295: {
utils.c 296: if( j > 5000 )
utils.c 297: {
utils.c 298:
utils.c 299: sf0029("Level too high");
utils.c 300: }
utils.c 301: else
utils.c 302: {
utils.c 303: hi_thresh = j;
utils.c 304: low_thresh = (i < j) ? i : j-1 ;
utils.c 305: }
utils.c 306: }
utils.c 307: }
utils.c 308: }
utils.c 309: }
utils.c 310:
utils.c 311:          int     f930()
utils.c 312: {
utils.c 313:    unsigned i;
utils.c 314:
utils.c 315: amp_flag++;
utils.c 316: amp_flag &= 1;
```

```
utils.c 317: sf0019();
utils.c 318: sf0027("Pulse amplitude");
utils.c 319: sf0025();
utils.c 320: if( amp_flag )
utils.c 321: sf0027("Displayed");
utils.c 322: else
utils.c 323: sf0027("Not displayed");
utils.c 324: for( i=0; i<7500; i++)
utils.c 325: ;
utils.c 326:
utils.c 327: }
utils.c 328:
utils.c 329:         int     f950()
utils.c 330: {
utils.c 331:     unsigned i;
utils.c 332:
utils.c 333: ftm_flag++;
utils.c 334: ftm_flag &= 1;
utils.c 335: sf0019();
utils.c 336: sf0027("Length displayed");
utils.c 337: sf0025();
utils.c 338: if( ftm_flag )
utils.c 339: sf0027("in meters");
utils.c 340: else
utils.c 341: sf0027("in feet");
utils.c 342: for( i=0; i<7500; i++)
utils.c 343: ;
utils.c 344: }
utils.c 345:
utils.c 346:         int f970()
utils.c 347: {
utils.c 348:     int i;
utils.c 349:
utils.c 350: i = f1006( 1,"Choose def macro", "function" );
utils.c 351: if(i != -1)
utils.c 352: {
utils.c 353: if( i == 9 )
utils.c 354: {
utils.c 355: sf0034("Enter Macro", "Function # ->_");
utils.c 356: i = sf0038();
utils.c 357:
utils.c 358: if( (i!=0x0a  ) && (i!=0x0c  ) )
utils.c 359: defmac = deftbl[i + 9];
utils.c 360: }
utils.c 361: else
utils.c 362: {
utils.c 363: defmac = deftbl[i];
utils.c 364: }
utils.c 365: }
utils.c 366: }
utils.c 367:
utils.c 368:            int sf0053( front, nvp, counts )
utils.c 369:         char front;
utils.c 370:            unsigned nvp;
utils.c 371:         unsigned counts;
utils.c 372: {
utils.c 373: counts -= front;
utils.c 374: if( counts < 0x0c  )
utils.c 375: counts = 0x0c ;
utils.c 376:
utils.c 377: reslt[0].m_dist = sf0054(1, counts, nvp);
utils.c 378:
utils.c 379: reslt[0].ft_dist = sf0054(0, counts, nvp);
utils.c 380: }
utils.c 381:
utils.c 382:         int f1000()
utils.c 383: {
utils.c 384:        unsigned i;
utils.c 385:        unsigned j;
utils.c 386:     unsigned length;
utils.c 387:     unsigned utyp;
utils.c 388:     char count;
```

```
utils.c 389:         char *pnt1;
utils.c 390:         char *pnt2;
utils.c 391:         unsigned fnvp;
utils.c 392:         unsigned mnvp;
utils.c 393:         char pnvp;
utils.c 394:
utils.c 395:
utils.c 396: sf0034("Calibrate Type", "0 Through 9->");
utils.c 397: utyp = sf0038();
utils.c 398:
utils.c 399: if( (utyp == 0x0c  ) || (utyp == 0x0a  ) )
utils.c 400: {
utils.c 401: return();
utils.c 402: }
utils.c 403: else if( utyp == 0x0b  )
utils.c 404: {
utils.c 405:
utils.c 406: f1008();
utils.c 407: return();
utils.c 408: }
utils.c 409:
utils.c 410: length = f1006(4, "Enter cable", "length");
utils.c 411:
utils.c 412: if( (length == 0) || (length == -1) )
utils.c 413: {
utils.c 414: return();
utils.c 415: }
utils.c 416:
utils.c 417: else if( (ftm_flag && length < 6) || (!ftm_flag && length < 20) )
utils.c 418: {
utils.c 419: sf0029("Cable too short");
utils.c 420: }
utils.c 421:
utils.c 422: else if( (ftm_flag && length > 1500) || (!ftm_flag && length > 5000
) )
utils.c 423: {
utils.c 424: sf0029("Cable too long");
utils.c 425: }
utils.c 426: else
utils.c 427: {
utils.c 428: sf0019();
utils.c 429: f1002();
utils.c 430:
utils.c 431: i = sf0038();
utils.c 432: if( i != 0x0a   )
utils.c 433: {
utils.c 434: f1014(utyp, length);
utils.c 435: }
utils.c 436: }
utils.c 437: }
utils.c 438:
utils.c 439:         int f1014( utyp, length )
utils.c 440:         char utyp;
utils.c 441:         unsigned length;
utils.c 442: {
utils.c 443:         char p[3];
utils.c 444:            unsigned i;
utils.c 445:            unsigned j;
utils.c 446:            unsigned avg;
utils.c 447:         unsigned average;
utils.c 448:         char type;
utils.c 449:    char neg_floor;
utils.c 450:    char pos_floor;
utils.c 451:         char offset;
utils.c 452:         char count;
utils.c 453:         char *pnt1;
utils.c 454:         char *pnt2;
utils.c 455:         unsigned fnvp;
utils.c 456:         unsigned mnvp;
utils.c 457:         char pnvp;
utils.c 458:
utils.c 459:         char valid;
utils.c 460:
```

```
utils.c 461: type = 0;
utils.c 462: do
utils.c 463: {
utils.c 464: if( kblen )
utils.c 465: {
utils.c 466: type = 0;
utils.c 467: break;
utils.c 468: }
utils.c 469: pos_floor = f102(0x40 );
utils.c 470: neg_floor = f102(0x00 );
utils.c 471:
utils.c 472: pnt1 = f142( pos_floor, neg_floor, 25 );
utils.c 473:
utils.c 474: pnt2 = p;
utils.c 475: for(i=0; i<3; i++)
utils.c 476: *pnt2++ = *pnt1++;
utils.c 477: type   = p[0];
utils.c 478: offset = p[1];
utils.c 479: count  = p[2];
utils.c 480: }while( type == 0);
utils.c 481: if( type != 0 )
utils.c 482: {
utils.c 483: sf0036("Calibrating...", "   User Type %x   ", utyp);
utils.c 484: sf0060(7500);
utils.c 485: average = 0;
utils.c 486: valid = 1 ;
utils.c 487: for( count = 0; count < 5; count++ )
utils.c 488: {
utils.c 489: avg = 0;
utils.c 490: for( i=0; i<20; i++)
utils.c 491: {
utils.c 492:
utils.c 493: j = f166( offset, sngl_val[type-1].start,
utils.c 494: sngl_val[type-1].width, sngl_val[type-1].slope);
utils.c 495:
utils.c 496: if( j <= 0x0c  )
utils.c 497: {
utils.c 498: valid = 0 ;
utils.c 499: break;
utils.c 500: }
utils.c 501: if( j == 0 )
utils.c 502: {
utils.c 503: break;
utils.c 504: }
utils.c 505: else
utils.c 506: {
utils.c 507: avg +=j;
utils.c 508: }
utils.c 509: }
utils.c 510: avg /= i;
utils.c 511: avg -= 0x06;
utils.c 512: average += avg;
utils.c 513: }
utils.c 514: average /= count;
utils.c 515:
utils.c 516: mnvp = sf0054(3, average, (length*10));
utils.c 517:
utils.c 518: fnvp = sf0054(2, average, length);
utils.c 519:
utils.c 520: if( ftm_flag )
utils.c 521: {
utils.c 522: i = mnvp;
utils.c 523: pnvp = 20334/mnvp;
utils.c 524: }
utils.c 525: else
utils.c 526: {
utils.c 527: i = fnvp;
utils.c 528: pnvp = 20334/fnvp;
utils.c 529: }
utils.c 530:
utils.c 531: if( (pnvp < 100) && (pnvp > 49) && (valid == 1 ) )
utils.c 532: {
utils.c 533:
```

```
utils.c 534: cable_usr[utyp].s_nvp = cable_usr[utyp].o_nvp = i;
utils.c 535: cable_usr[utyp].nvp_pcnt = pnvp;
utils.c 536:
utils.c 537: if( ftm_flag )
utils.c 538: {
utils.c 539:
utils.c 540: cable_usr[utyp].ftc_len = sf0054(0, average, i);
utils.c 541: cable_usr[utyp].mc_len = (length*10);
utils.c 542: }
utils.c 543: else
utils.c 544: {
utils.c 545: cable_usr[utyp].ftc_len = length;
utils.c 546: cable_usr[utyp].mc_len = sf0054(1, average, i);
utils.c 547: }
utils.c 548:
utils.c 549: pvc_tfe = 0;
utils.c 550:
utils.c 551: f87(utyp + 16);
utils.c 552:
utils.c 553: sf0036( cbl_name, "   NVP = %2u", velocity);
utils.c 554: sf0022("%c", 0x25);
utils.c 555: sf0060(10000);
utils.c 556: }
utils.c 557: else
utils.c 558: {
utils.c 559: sf0029("Can't calibrate");
utils.c 560: }
utils.c 561: }
utils.c 562:
utils.c 563: }
utils.c 564:
utils.c 565:         int sf0054( type, avg, factor )
utils.c 566:     char type;
utils.c 567:         unsigned avg;
utils.c 568:     unsigned factor;
utils.c 569: {
utils.c 570:         unsigned i;
utils.c 571:
utils.c 572: switch(type)
utils.c 573: {
utils.c 574: case 0:
utils.c 575:
utils.c 576: i = ((avg%100)*500)/factor;
utils.c 577: i += (avg/100)*(50000/factor);
utils.c 578: break;
utils.c 579:
utils.c 580: case 1:
utils.c 581:
utils.c 582: i = (((avg%40)*1524)/factor);
utils.c 583: i += (avg/40)*(60960/factor);
utils.c 584: break;
utils.c 585:
utils.c 586: case 2:
utils.c 587:
utils.c 588: i = (( (avg%100)*500) + ((avg/100)*50000))/factor;
utils.c 589: break;
utils.c 590:
utils.c 591: case 3:
utils.c 592:
utils.c 593: i = (((avg%40)*1524) + ((avg/40)*60960))/factor;
utils.c 594: break;
utils.c 595: }
utils.c 596: return(i);
utils.c 597: }
utils.c 598:
utils.c 599:             int     f201( res )
utils.c 600:                 RESLT *res;
utils.c 601: {
utils.c 602:             int amp;
utils.c 603:             int dis;
utils.c 604:     int i;
utils.c 605:         char k;
utils.c 606:      int scale;
```

```
utils.c 607:     int scale_max;
utils.c 608:             char *pnt;
utils.c 609:         int mult;
utils.c 610:
utils.c 611: if(ftm_flag)
utils.c 612: {
utils.c 613: dis = res->m_dist;
utils.c 614: mult = ( dis > 12000 ) ? 1 : 10;
utils.c 615:
utils.c 616: }
utils.c 617: else
utils.c 618: {
utils.c 619: dis = res->ft_dist;
utils.c 620: mult = ( dis > 1200 ) ? 1 : 10;
utils.c 621: }
utils.c 622:
utils.c 623: f202("   Graph of Test Results");
utils.c 624:
utils.c 625: if( kblen ) return;
utils.c 626:
utils.c 627: f204( res );
utils.c 628:
utils.c 629: rputf("| Cable type%12p |    %-23s |   %-22s |\r\n",res->name,res->c_nam);
utils.c 630:
utils.c 631: sf2041( res );
utils.c 632:
utils.c 633: if( kblen ) return;
utils.c 634:
utils.c 635: if( res->imped )
utils.c 636: rputf("| Cable impedance%7p |    %-3d ohms%16p |   +/- 2 ohms%13p |\r\n",res->imped);
utils.c 637: else
utils.c 638: rputf("| Cable impedance%7p |    Undefined%15p |%25p |\r\n",res->imped);
utils.c 639:
utils.c 640:
utils.c 641: rputf("| Fault type found%6p |    %-23s |   %-22s |\r\n",fault[res->f_type],fltmes[res->f_type]);
utils.c 642: if( kblen ) return;
utils.c 643: sf2042( res );
utils.c 644: sf2043(res);
utils.c 645: if( kblen ) return;
utils.c 646: if( res->f_type )
utils.c 647: {
utils.c 648: sf2044lt( res, dis, mult );
utils.c 649: }
utils.c 650: else
utils.c 651: {
utils.c 652: sf2045s();
utils.c 653: }
utils.c 654: if( kblen ) return;
utils.c 655:
utils.c 656: rputf("\r\n%80p*\r\n\n");
utils.c 657: if( kblen ) return;
utils.c 658: rputf("Test Date:%28p_   Operator:%29p_\r\n\n");
utils.c 659: if( kblen ) return;
utils.c 660: rputf("Installation:%66p_\r\n\n");
utils.c 661: if( kblen ) return;
utils.c 662: rputf("Notes:%73p_\r\n\n");
utils.c 663: if( kblen ) return;
utils.c 664: rputf("%33p* End of Report %32p*\r\n");
utils.c 665:
utils.c 666: }
utils.c 667:
utils.c 668:         int sf2044lt( res, dis, mult )
utils.c 669:        * RESLT *res;
utils.c 670:          int dis;
utils.c 671:        int mult;
utils.c 672: {
utils.c 673:     int meter_dis;
utils.c 674:             char k;
utils.c 675:        int scale;
```

```
utils.c 676:     int scale_max;
utils.c 677:         int i;
utils.c 678:            char *pnt;
utils.c 679:         int amp;
utils.c 680:
utils.c 681: rputf("| Fault found%11p |    ");
utils.c 682: if(ftm_flag)
utils.c 683: {
utils.c 684: rputf("%-d.%1d m from scanner", (dis/10), (dis%10) );
utils.c 685: rputs("  ");
utils.c 686:
utils.c 687: i = 10000;
utils.c 688: for( k=0; k<3; k++)
utils.c 689: {
utils.c 690: if( dis < i)
utils.c 691: rputs(" ");
utils.c 692: i = i/10;
utils.c 693: }
utils.c 694:
utils.c 695: i = (dis + 5)/10;
utils.c 696: meter_dis = dis;
utils.c 697: dis = i;
utils.c 698: }
utils.c 699: else
utils.c 700: {
utils.c 701: rputf("%-5d feet from Scanner", dis);
utils.c 702: i = dis;
utils.c 703: }
utils.c 704:
utils.c 705: rputs("  |");
utils.c 706:
utils.c 707: if( (ftm_flag && dis < 9) || (!ftm_flag && dis < 30) )
utils.c 708: {
utils.c 709: rputf("   %-22s |\r\n","Use tracer to isolate");
utils.c 710: }
utils.c 711: else
utils.c 712: {
utils.c 713: rputf("   %-22s |\r\n","Move closer to fault");
utils.c 714: }
utils.c 715:
utils.c 716: sf2046( res );
utils.c 717:
utils.c 718: for( k = 0; k < 8; k++)
utils.c 719: {
utils.c 720: if( (i > scal_mvall[k]) && (i <= scal_mvall[k+1]) )
utils.c 721: {
utils.c 722: scale_max = scal_mvall[k + 1];
utils.c 723: scale = scal_val[k + 1];
utils.c 724: }
utils.c 725: }
utils.c 726: if( kblen ) return;
utils.c 727:
utils.c 728: rputf("\r\nPlot of Reflected Pulse Amplitude / Transmitted Pulse Amplitude versus Distance\r\n");
utils.c 729: rputs("(Maximum distance displayed = ");
utils.c 730: if(ftm_flag)
utils.c 731: {
utils.c 732: rputf("%d meters", scale_max);
utils.c 733: }
utils.c 734: else
utils.c 735: {
utils.c 736: rputf("%d feet", scale_max);
utils.c 737: }
utils.c 738: rputs(")\r\n\n\n");
utils.c 739:
utils.c 740: if( kblen ) return;
utils.c 741:
utils.c 742: f206(scale_max);
utils.c 743: if( kblen ) return;
utils.c 744: if(ftm_flag)
utils.c 745: {
utils.c 746: rputs("meters+");
utils.c 747: }
```

```
utils.c 748: else
utils.c 749: {
utils.c 750: rputs("feet  +");
utils.c 751: }
utils.c 752: sf2047();
utils.c 753: rputs("\r\n");
utils.c 754:
utils.c 755: for( i=0; i<21; i++)
utils.c 756: {
utils.c 757: if( kblen ) return;
utils.c 758: switch(i)
utils.c 759: {
utils.c 760: case 0: pnt = "+100% |";
utils.c 761: break;
utils.c 762: case 5: pnt = " +50% |";
utils.c 763: break;
utils.c 764: case 10: pnt = "    0 +";
utils.c 765: break;
utils.c 766: case 15: pnt = " -50% |";
utils.c 767: break;
utils.c 768: case 20: pnt = "-100% |";
utils.c 769: break;
utils.c 770: default: pnt = "      |";
utils.c 771: }
utils.c 772: rputs(pnt);
utils.c 773:
utils.c 774: if( i == 10 )
utils.c 775: {
utils.c 776: sf2047();
utils.c 777: }
utils.c 778: else
utils.c 779: {
utils.c 780:
utils.c 781: if( (res->f_type == 4 ) && (i == 5) )
utils.c 782: {
utils.c 783: rputs("           Shorted cable at less than ");
utils.c 784: if( ftm_flag)
utils.c 785: {
utils.c 786: rputf("%d.%1d m", (meter_dis/10), (meter_dis%10) );
utils.c 787: }
utils.c 788: else
utils.c 789: {
utils.c 790: rputf("%d ft", dis);
utils.c 791: }
utils.c 792: }
utils.c 793: if( (res->f_type == 3 ) && (i == 15) )
utils.c 794: {
utils.c 795: rputs("           Open cable at less than ");
utils.c 796: if( ftm_flag)
utils.c 797: {
utils.c 798: rputf("%d.%1d m", (meter_dis/10), (meter_dis%10) );
utils.c 799: }
utils.c 800: else
utils.c 801: {
utils.c 802: rputf("%d ft", dis);
utils.c 803: }
utils.c 804: }
utils.c 805:
utils.c 806: if( (res->f_type == 2 ) && ( i < 10 ) )
utils.c 807: {
utils.c 808: amp = res->ampl + 3;
utils.c 809:
utils.c 810: if(( ((20-i) - (amp/12)) <= 0 ) || (i == 9))
utils.c 811: {
utils.c 812: for( k=0; k< ((dis*mult)/scale); k++)
utils.c 813: {
utils.c 814: rputc(' ');
utils.c 815: }
utils.c 816: rputc('|');
utils.c 817: }
utils.c 818: }
utils.c 819: if( (res->f_type == 1 ) && ( i > 10 ) )
utils.c 820: {
utils.c 821: amp = res->ampl - 8;
```

```
utils.c 822:
utils.c 823: if(( ((21-i) - (amp/12)) > 0 ) || (i == 11) )
utils.c 824: {
utils.c 825: for( k=0; k< ((dis*mult)/scale); k++)
utils.c 826: {
utils.c 827: rputc(' ');
utils.c 828: }
utils.c 829: rputc('|');
utils.c 830: }
utils.c 831:
utils.c 832: }
utils.c 833: }
utils.c 834: rputs("\r\n");
utils.c 835:
utils.c 836: }
utils.c 837: rputs("        +");
utils.c 838: sf2047();
utils.c 839: rputs("\r\n");
utils.c 840: if( kblen ) return;
utils.c 841: f206(scale_max);
utils.c 842: if(ftm_flag)
utils.c 843: {
utils.c 844: rputs("meters\r\n");
utils.c 845: }
utils.c 846: else
utils.c 847: {
utils.c 848: rputs("feet\r\n");
utils.c 849: }
utils.c 850: }
utils.c 851:
utils.c 852:     int    f202(str)
utils.c 853:            char *str;
utils.c 854: {
utils.c 855: extern        unsigned RelInfo;
utils.c 856: extern        unsigned Microt;
utils.c 857:            char *p;
utils.c 858:
utils.c 859: rputc(0x0c);
utils.c 860: rputf("%80p*\r\n");
utils.c 861:
utils.c 862: p = &Microt;
utils.c 863: rputf("*  %9s Scanner   - %-27s -   ", p, str);
utils.c 864: p = &RelInfo;
utils.c 865: rputf("Firmware Ver %5s  *\r\n", p );
utils.c 866: rputf("%80p*\r\n");
utils.c 867: }
utils.c 868:
utils.c 869:        int    f960()
utils.c 870: {
utils.c 871:            int i;
utils.c 872:            unsigned k;
utils.c 873: static    char *dlibs[] =
utils.c 874: { "NOT Active","Active","Feet","Meters"};
utils.c 875:
utils.c 876: sf0034("Data library","print out");
utils.c 877: f202(" RAM / Data library index");
utils.c 878: rputf("\r\n\n----- Data Libarary %60p-\r\n");
utils.c 879:
utils.c 880: for(i=1; i<10; i++)
utils.c 881: {
utils.c 882: if( kblen )
utils.c 883: return;
utils.c 884: rputf("  Data Library  %1d - ",i);
utils.c 885: if( *reslt[i].name )
utils.c 886: {
utils.c 887: rputf("Scan with %s\r\n",reslt[i].name);
utils.c 888: }
utils.c 889: else
utils.c 890: {
utils.c 891: rputs("Empty\r\n");
utils.c 892: }
utils.c 893: }
utils.c 894: rputf("\r\n----- User types %62p-\r\n");
utils.c 895:
```

```
utils.c 896: for(i=0; i<10; i++)
utils.c 897: {
utils.c 898: if( kblen )
utils.c 899: return;
utils.c 900: rputf("  User Type   %d - ",i);
utils.c 901:
utils.c 902: if( cable_usr[i].ftc_len )
utils.c 903: {
utils.c 904:
utils.c 905: rputf("User defined NVP = %2d%c measured with ",
utils.c 906: cable_usr[i].nvp_pcnt, '%');
utils.c 907:
utils.c 908: if(ftm_flag)
utils.c 909: {
utils.c 910: k = cable_usr[i].mc_len;
utils.c 911: rputf("%d.%d meters\r\n", (k/10), (k%10) );
utils.c 912: }
utils.c 913: else
utils.c 914: {
utils.c 915: rputf("%d feet\r\n", cable_usr[i].ftc_len);
utils.c 916: }
utils.c 917: }
utils.c 918: else
utils.c 919: {
utils.c 920: rputf("Pre-defined  NVP = %2d%c\r\n",
utils.c 921: cable_usr[i].nvp_pcnt,'%');
utils.c 922: }
utils.c 923: }
utils.c 924:
utils.c 925: rputf("\r\n%80p-\r\n");
utils.c 926: rputf("  Signal Strength Display  - %s\r\n",dlibs[ amp_flag & 1 ]);
utils.c 927: rputf("  Units of Measure         - %s\r\n",dlibs[ (ftm_flag & 1) + 2 ]);
utils.c 928: rputf("  Low Noise Threshold      - %d mv\r\n", low_thresh );
utils.c 929: rputf("  High Noise Threshold     - %d mv\r\n", hi_thresh );
utils.c 930: rputf("\r\n%33p* End of Report %33p*\r\n");
utils.c 931:
utils.c 932: }
utils.c 933:
utils.c 934:             int     f206(max)
utils.c 935:             int max;
utils.c 936: {
utils.c 937:             int k;
utils.c 938:             int val;
utils.c 939:             int inc;
utils.c 940:
utils.c 941: rputs("Scale |");
utils.c 942: inc = val = max/4;
utils.c 943: for( k=6; k<(71+6); k++ )
utils.c 944: {
utils.c 945: if( ((k)%18) == 0 )
utils.c 946: {
utils.c 947: if( val < 1000 )
utils.c 948: {
utils.c 949: if(ftm_flag)
utils.c 950: {
utils.c 951: rputf(" %3d m ", val );
utils.c 952: }
utils.c 953: else
utils.c 954: {
utils.c 955: rputf(" %3d ft",val);
utils.c 956: }
utils.c 957: }
utils.c 958: else
utils.c 959: {
utils.c 960: if(ftm_flag)
utils.c 961: {
utils.c 962: rputf("%4d m ", val);
utils.c 963: }
utils.c 964: else
utils.c 965: {
utils.c 966: rputf("%4d ft",val);
utils.c 967: }
```

```
utils.c 968: }
utils.c 969: k += 6;
utils.c 970: val += inc;
utils.c 971: }
utils.c 972: else
utils.c 973: { rputc(' '); }
utils.c 974: }
utils.c 975: rputs("\r\n");
utils.c 976: }
utils.c 977:
utils.c 978:             int     sf2047()
utils.c 979: {
utils.c 980:      int k;
utils.c 981:
utils.c 982: for( k=0; k<72; k++ )
utils.c 983: {
utils.c 984: if( ((k+1)%18) == 0 )
utils.c 985: rputc('+');
utils.c 986: else
utils.c 987: rputc('-');
utils.c 988: }
utils.c 989: }
utils.c 990:
utils.c 991:        int sf2045s()
utils.c 992: {
utils.c 993: rputf("+%78p-+\r\n");
utils.c 994: rputs("\r\n\n\n");
utils.c 995: rputs("  PPPP    A       SSSSS   SSSSS\r\n");
utils.c 996: rputs("  P   P   A A     S       S\r\n");
utils.c 997: rputs("  P   P   A A     S       S\r\n");
utils.c 998: rputs("  PPPP    AAAAA   SSSSS   SSSSS\r\n");
utils.c 999: rputs("  P       A   A       S       S\r\n");
utils.c 1000: rputs("  P       A   A       S       S\r\n");
utils.c 1001: rputs("  P       A   A   SSSSS   SSSSS\r\n");
utils.c 1002: }
utils.c 1003:
utils.c 1004:         int sf2043(res)
utils.c 1005:         RESLT *res;
utils.c 1006: {
utils.c 1007: rputf("| DC resistance%9p |    ");
utils.c 1008: if( res->dcohms > 0xff )
utils.c 1009: {
utils.c 1010: rputf("Not measured%12p | Make resistance meas    |\r\n");
utils.c 1011: }
utils.c 1012: else
utils.c 1013: {
utils.c 1014: if( res->dcohms == 0xff )
utils.c 1015: {
utils.c 1016: rputf("> 25 ohms%15p | Correct for good cable |\r\n");
utils.c 1017: }
utils.c 1018: else
utils.c 1019: {
utils.c 1020: if( res->dcohms/10 > 9 )
utils.c 1021: {
utils.c 1022: rputf("%2d.%1d ohms%15p | ",res->dcohms/10, res->dcohms % 10);
utils.c 1023: }
utils.c 1024: else
utils.c 1025: {
utils.c 1026: rputf("%1d.%1d ohms%16p | ",res->dcohms/10, res->dcohms % 10);
utils.c 1027: }
utils.c 1028: rputf("%-22s |\r\n","Cable touching fault");
utils.c 1029: }
utils.c 1030: }
utils.c 1031: }
utils.c 1032:
utils.c 1033:         int sf2041(res)
utils.c 1034:         RESLT *res;
utils.c 1035: {
utils.c 1036: rputf("| Velocity of Prop%6p |    %-2d%c%21p |",res->nvp,'%');
utils.c 1037:
utils.c 1038: if( res->cbl_type < 16 )
utils.c 1039: {
utils.c 1040: rputf("  %-22s |\r\n","Average for cable type");
```

```
utils.c 1041: }
utils.c 1042: else
utils.c 1043: {
utils.c 1044: if( res->cbl_type == 16 )
utils.c 1045: {
utils.c 1046: rputf("  %-22s |\r\n","NVP operator entered");
utils.c 1047: }
utils.c 1048: else
utils.c 1049: {
utils.c 1050:
utils.c 1051: if( res->ftc_len || res->mc_len )
utils.c 1052: {
utils.c 1053: rputf("  %-22s |\r\n","Calculated from cable");
utils.c 1054: }
utils.c 1055: else
utils.c 1056: {
utils.c 1057: rputf("  %-22s |\r\n","Pre-defined constant");
utils.c 1058: }
utils.c 1059:
utils.c 1060: }
utils.c 1061: }
utils.c 1062: }
utils.c 1063:
utils.c 1064:              int f204(res)
utils.c 1065:                 RESLT *res;
utils.c 1066: {
utils.c 1067: rputf("+%78p-+\r\n");
utils.c 1068: rputf("|     Description           |    Data and Test Results     |    Comments%11p |\r\n");
utils.c 1069: rputf("|%23p-|%28p-|%25p-|\r\n");
utils.c 1070: if( kblen ) return;
utils.c 1071: }
utils.c 1072:
utils.c 1073:              int sf2048()
utils.c 1074: {
utils.c 1075: if( kblen ) return;
utils.c 1076:
utils.c 1077: rputf("\r\n%80p*\r\n\n");
utils.c 1078: if( kblen ) return;
utils.c 1079: rputf("Test Date:%28p_   Operator:%29p_\r\n\n");
utils.c 1080: if( kblen ) return;
utils.c 1081: rputf("Installation:%66p_\r\n\n");
utils.c 1082: if( kblen ) return;
utils.c 1083: rputf("Notes:%73p_\r\n\n");
utils.c 1084: if( kblen ) return;
utils.c 1085: rputf("%33p* End of Report %32p*\r\n");
utils.c 1086: }
utils.c 1087:
utils.c 1088:              int sf2046(res)
utils.c 1089:                 RESLT *res;
utils.c 1090: {
utils.c 1091:              int amp;
utils.c 1092:
utils.c 1093: amp = res->ampl;
utils.c 1094: amp = ((amp - 128) * 195)/10;
utils.c 1095:
utils.c 1096: rputf("| Amplitude of fault     |   %-5d millivolts%8p |",amp);
utils.c 1097: if( (amp > 1500) || (amp < -1500) )
utils.c 1098: { rputf("  %-22s |\r\n","Strong reflection"); }
utils.c 1099: else
utils.c 1100: { if( (amp < 700) && (amp > -700) )
utils.c 1101: { rputf("  %-22s |\r\n","Weak reflection"); }
utils.c 1102: else
utils.c 1103: { rputf("  %-22s |\r\n","Moderate reflection"); }
utils.c 1104: }
utils.c 1105: rputf("+%78p-+\r\n");
utils.c 1106: }
utils.c 1107:
utils.c 1108:              int sf2042(res)
```

```
utils.c 1109:                 RESLT *res;
utils.c 1110: {
utils.c 1111:         char i;
utils.c 1112: static    int n_val[] =
utils.c 1113: { 100,400,800,1200,1800,2500,5000 };
utils.c 1114: static    char *n_str[] =
utils.c 1115: { "Good low level",
utils.c 1116: "Lower than normal",
utils.c 1117: "Normal noise level",
utils.c 1118: "Higher than normal",
utils.c 1119: "Could cause problem",
utils.c 1120: "May degrade system",
utils.c 1121: "Very high level"};
utils.c 1122: rputf("| Noise%17p |    %-4d mV peak to peak    |",res->noise*20);
utils.c 1123: for( i=0; i<7 ; i++)
utils.c 1124: {
utils.c 1125: if( (res->noise*20) < n_val[i] )
utils.c 1126: { break; }
utils.c 1127: }
utils.c 1128: rputf("  %-22s |\r\n",n_str[i]);
utils.c 1129: }
utils.c 1130:
utils.c 1131:
utils.c 1132:
utils.c 1133:
```

---

FILE: ROM.I
PAGE: 1

---

```
rom.c 1:
..\include\std.h 1:
rom.c 2:
..\include\box.h 1:
rom.c 3:
..\include\equ.h 1:
rom.c 4:
..\include\tdr.h 1:
rom.c 5:
..\include\nglobs.ext 1:
rom.c 6:
..\include\globs.ext 1:
rom.c 7:
rom.c 8: int moncnt;
rom.c 9:
rom.c 10:         int sf0055()
rom.c 11: {
rom.c 12:         unsigned i;
rom.c 13:         unsigned j;
rom.c 14:         unsigned *p;
rom.c 15:    unsigned count;
rom.c 16:         int k;
rom.c 17:
rom.c 18:
rom.c 19: sf0056();
rom.c 20: func_var = 1 ;
rom.c 21:
rom.c 22: if( kblen > 0 )
rom.c 23: {
rom.c 24: i = sf0039();
rom.c 25: if( i == 0x0a   )
rom.c 26: func_var = 0 ;
rom.c 27: }
rom.c 28: else
rom.c 29: {
rom.c 30: i = 0x0c  ;
rom.c 31: func_var = 1 ;
rom.c 32: }
rom.c 33:
rom.c 34: while(1)
rom.c 35: {
```

```
rom.c  36: if (func_var == 0 )
rom.c  37: {
rom.c  38: sf0032();
rom.c  39: sf0057(i);
rom.c  40: }
rom.c  41: else
rom.c  42: {
rom.c  43: if( i == 0x0c   )
rom.c  44: {
rom.c  45: sf0031(1 );
rom.c  46: }
rom.c  47: sf0058(i);
rom.c  48: }
rom.c  49: if( func_var == 0 )
rom.c  50: {
rom.c  51: sf0032();
rom.c  52: }
rom.c  53: else
rom.c  54: {
rom.c  55: if( (sf0041(0xff ) == 0x0c   ) || !sf0041(0xff ) )
rom.c  56: sf0031(1 );
rom.c  57: }
rom.c  58: i = sf0038();
rom.c  59: }
rom.c  60: }
rom.c  61:            int       sf0056()
rom.c  62: {
rom.c  63:         char i;
rom.c  64:
rom.c  65:
rom.c  66: bsense = 1;
rom.c  67: bcount = 80;
rom.c  68:
rom.c  69:
rom.c  70: pvc_tfe = c_cb_ty & 1;
rom.c  71: cbl_type = c_cb_ty & 0xfe;
rom.c  72: f87( cbl_type + pvc_tfe   );
rom.c  73:
rom.c  74:
rom.c  75: reslt[0].name[0] = 0;
rom.c  76: reslt[0].dcohms = 0xffff;
rom.c  77:
rom.c  78:
rom.c  79: sngl_val[0].start = sngl_val[2].start = 3;
rom.c  80: sngl_val[1].start = sngl_val[3].start = 7;
rom.c  81: sngl_val[0].width = sngl_val[2].width = 0 ;
rom.c  82: sngl_val[1].width = sngl_val[3].width = 1 ;
rom.c  83: sngl_val[0].slope = sngl_val[1].slope = 0x40 ;
rom.c  84: sngl_val[2].slope = sngl_val[3].slope = 0x00 ;
rom.c  85:
rom.c  86: }
rom.c  87:
rom.c  88:            int       sf0058(key)
rom.c  89:            char key;
rom.c  90: {
rom.c  91:         unsigned i;
rom.c  92:         char j;
rom.c  93:
rom.c  94:
rom.c  95: switch(key)
rom.c  96: {
rom.c  97: case 0x0b  :
rom.c  98: f1000();
rom.c  99: break;
rom.c 100: case 1   :
rom.c 101:
rom.c 102:
rom.c 103: j = sf0073();
rom.c 104: if( j != 0   )
rom.c 105: {
rom.c 106: f100();
```

```
rom.c 107: }
rom.c 108: break;
rom.c 109: case 2   :
rom.c 110:
rom.c 111:
rom.c 112: f200();
rom.c 113: break;
rom.c 114: case 3   :
rom.c 115:
rom.c 116: f300();
rom.c 117: break;
rom.c 118:
rom.c 119: case 4   :
rom.c 120:
rom.c 121: f400();
rom.c 122: break;
rom.c 123: case 5   :
rom.c 124:
rom.c 125: f500();
rom.c 126: break;
rom.c 127: case 6   :
rom.c 128:
rom.c 129: f600();
rom.c 130: break;
rom.c 131:
rom.c 132: case 7   :
rom.c 133:
rom.c 134: sf0019();
rom.c 135: sf0020("Find Baud rate 1");
rom.c 136: sf0025();
rom.c 137: sf0020("Check XON/XOFF 2");
rom.c 138: i=sf0038();
rom.c 139: if( i == 1   )
rom.c 140: f704();
rom.c 141: if( i == 2   )
rom.c 142: f706();
rom.c 143: break;
rom.c 144: case 8   :
rom.c 145: f800();
rom.c 146: break;
rom.c 147: case 9   :
rom.c 148: f900();
rom.c 149: break;
rom.c 150: case 0x0a   :
rom.c 151: func_var = 0 ;
rom.c 152: default:
rom.c 153: break;
rom.c 154:
rom.c 155: }
rom.c 156: }
rom.c 157:
rom.c 158:         int     sf0057(key)
rom.c 159:         char key;
rom.c 160: {
rom.c 161:         unsigned i;
rom.c 162:
rom.c 163:
rom.c 164: if( key == 7   )
rom.c 165: {
rom.c 166: if(c_cb_ty < 16)
rom.c 167: {
rom.c 168: pvc_tfe++;
rom.c 169: pvc_tfe &= 0x01;
rom.c 170:
rom.c 171:
rom.c 172: c_cb_ty = (cbl_type & 0xfe) | pvc_tfe;
rom.c 173:
rom.c 174: f87( cbl_type + pvc_tfe );
rom.c 175: }
rom.c 176: return( 0x0a   );
rom.c 177: }
rom.c 178: else if( key > 8   )
rom.c 179: {
rom.c 180: switch(key)
```

```
rom.c 181: {
rom.c 182: case 0x0b  :
rom.c 183: ( defmac )();
rom.c 184: break;
rom.c 185:
rom.c 186: case 9    :
rom.c 187: f88();
rom.c 188: break;
rom.c 189:
rom.c 190: case 0x0a :
rom.c 191: break;
rom.c 192:
rom.c 193: case 0x0c :
rom.c 194: func_var = 1 ;
rom.c 195: break;
rom.c 196: }
rom.c 197:
rom.c 198: }
rom.c 199: else
rom.c 200: {
rom.c 201:
rom.c 202:
rom.c 203: cbl_type = (key-1)*2;
rom.c 204: c_cb_ty = (cbl_type & 0xfe) | pvc_tfe;
rom.c 205: f87( cbl_type + pvc_tfe );
rom.c 206: }
rom.c 207: }
rom.c 208:
rom.c 209:        int     f800()
rom.c 210: {
rom.c 211:         char i;
rom.c 212:     char *pnt1;
rom.c 213:     char *pnt2;
rom.c 214:         char dir;
rom.c 215:
rom.c 216: sf0034("Data      1-Save","Library   2-Load");
rom.c 217: i = sf0038();
rom.c 218: sf0019();
rom.c 219: switch(i)
rom.c 220: {
rom.c 221: case 1 :
rom.c 222: sf0020("Save to        ");
rom.c 223: dir = 1;
rom.c 224: break;
rom.c 225: case 2 :
rom.c 226: sf0020("Load from      ");
rom.c 227: dir = 0;
rom.c 228: break;
rom.c 229: default:
rom.c 230: return;
rom.c 231: }
rom.c 232:
rom.c 233: sf0025();
rom.c 234: sf0020("Library # ->_    ");
rom.c 235: i = sf0038();
rom.c 236: sf0025();
rom.c 237: if( (i == 0x0c  ) || (i == 0x0a  ) )
rom.c 238: return;
rom.c 239: if( i == 0x0b  )
rom.c 240: {
rom.c 241: sf0059();
rom.c 242: return;
rom.c 243: }
rom.c 244: sf0022("Library # ->%1d  ",i);
rom.c 245: sf0060(1000);
rom.c 246: if(dir)
rom.c 247: {
rom.c 248: pnt1 = &reslt[i];
rom.c 249: pnt2 = &reslt[0];
rom.c 250: }
rom.c 251: else
rom.c 252: {
rom.c 253: pnt1 = &reslt[0];
rom.c 254:
```

```
rom.c 255:    if( ! (*reslt[i].name) )
rom.c 256:    return;
rom.c 257:
rom.c 258:    pnt2 = &reslt[i];
rom.c 259:    c_cb_ty = reslt[i].cbl_type;
rom.c 260:    cbl_type = c_cb_ty & 0xfe;
rom.c 261:    pvc_tfe = c_cb_ty & 1;
rom.c 262:    f87( c_cb_ty );
rom.c 263:    }
rom.c 264:    for( i=0; i < sizeof(RESLT); i++)
rom.c 265:    {
rom.c 266:    *pnt1++ = *pnt2++;
rom.c 267:    }
rom.c 268:    sf0014();
rom.c 269:
rom.c 270:    }
rom.c 271:
rom.c 272:
rom.c 273:         int sf0061()
rom.c 274:    {
rom.c 275:    }
rom.c 276:
rom.c 277:         int      f87(indx)
rom.c 278:         int indx;
rom.c 279:    {
rom.c 280:            CABLE_STRUCT *pnt;
rom.c 281:            char i;
rom.c 282:         char *bpnt;
rom.c 283:
rom.c 284:    if( indx < 16 )
rom.c 285:    {
rom.c 286:    pnt = &cable_init[indx];
rom.c 287:    }
rom.c 288:    else
rom.c 289:    {
rom.c 290:    pnt = &cable_usr[indx-16];
rom.c 291:    }
rom.c 292:
rom.c 293:    cbl_name   = pnt->name;
rom.c 294:    scable_nvp = pnt->s_nvp;
rom.c 295:    ocable_nvp = pnt->o_nvp;
rom.c 296:    scbl_front = pnt->scbl_front;
rom.c 297:    ocbl_front = pnt->ocbl_front;
rom.c 298:    velocity   = pnt->nvp_pcnt;
rom.c 299:    impedance  = pnt->cbl_imp;
rom.c 300:    opnda_short= pnt->sht_da;
rom.c 301:
rom.c 302:    for(i=0; i<4; i++)
rom.c 303:    {
rom.c 304:    sngl_val[i].da = pnt->cbl_da;
rom.c 305:    }
rom.c 306:
rom.c 307:
rom.c 308:    c_cb_ty = indx;
rom.c 309:    reslt[0].cbl_type = c_cb_ty;
rom.c 310:
rom.c 311:    reslt[0].ftc_len = pnt->ftc_len;
rom.c 312:    reslt[0].mc_len = pnt->mc_len;
rom.c 313:    reslt[0].dcohms = 0xffff;
rom.c 314:    reslt[0].valid  = 0 ;
rom.c 315:
rom.c 316:    bpnt = &pnt->cb_nam[0];
rom.c 317:    for( i=0; i < 22; i++)
rom.c 318:    {
rom.c 319:    reslt[0].c_nam[i] = *bpnt++;
rom.c 320:    }
rom.c 321:
rom.c 322:    sf0014();
rom.c 323:    }
rom.c 324:
rom.c 325:         int f923()
rom.c 326:    {
rom.c 327:    moncnt++;
rom.c 328:    }
rom.c 329:
rom.c 330:              int      f920()
```

```
rom.c 331: {
rom.c 332:        int done;
rom.c 333:           int i;
rom.c 334:           int low;
rom.c 335:        int high;
rom.c 336:           int k;
rom.c 337:        int oldmon;
rom.c 338:        int linecnt;
rom.c 339:        int level;
rom.c 340:        int current;
rom.c 341:        unsigned time;
rom.c 342: static   int logls[] =
rom.c 343: {
rom.c 344:
rom.c 345:  -1,    0,    1,    2,    3,    4,    5,    6,    8,   10,   12,
rom.c 346:  14,   16,   18,   20,   22,   24,   28,   30,   34,   38,
rom.c 347:  42,   48,   54,   60,   70,   80,   90,  100,  110,  120,
rom.c 348: 130,  140,  150,  160,  170,  180,  190,  200,  210,  220,
rom.c 349: 230,  240,  250,  260,  270,  280,  290,  300,  310,  320,
rom.c 350: 330,  340,  350,  360,  370,  380,  390,  400,  410,  420,
rom.c 351: 430,  440,  450,  460,  470,  480,  490,  500,  510,  520,
rom.c 352: 530,  540,  550,  560,  570,  580,  590,  600,  610,  620,
rom.c 353: 630,  640,  650,  560,  670,  680,  690,  700,  710,  720,
rom.c 354: 730,  740,  750,  760,  770,  780,  790,  800,  900,  910
rom.c 355: };
rom.c 356: static   int loglm[] =
rom.c 357: {
rom.c 358:
rom.c 359:  -1,    0,    1,    2,    3,    4,    5,    6,    8,   10,   12,
rom.c 360:  14,   16,   18,   20,   22,   24,   28,   30,   34,   38,
rom.c 361:  42,   48,   54,   60,   70,   80,   90,  100,  110,  120,
rom.c 362: 130,  140,  150,  160,  170,  180,  190,  200,  210,  220,
rom.c 363: 230,  240,  250,  260,  270,  280,  290,  300,  310,  320,
rom.c 364: 330,  340,  350,  360,  370,  380,  390,  400,  410,  420,
rom.c 365: 430,  440,  450,  460,  470,  480,  490,  500,  510,  520,
rom.c 366: 530,  540,  550,  560,  570,  580,  590,  600,  610,  620,
rom.c 367: 630,  640,  650,  560,  670,  680,  690,  700,  710, 720,
rom.c 368: 730,  740,  750,  760,  770,  780,  790,  800,  900,  910
rom.c 369: };
rom.c 370:
rom.c 371:
rom.c 372:
rom.c 373: sf0016(0);
rom.c 374: sf0019();
rom.c 375: do
rom.c 376: {
rom.c 377: if( (time = f1006(4,"Network monitor","Enter time:")) == -1 )
rom.c 378: break;
rom.c 379: }while( ((time/100) > 24) || ((time%100) > 60));
rom.c 380:
rom.c 381: if( time == -1 )
rom.c 382: return();
rom.c 383:
rom.c 384: sf0025();
rom.c 385: sf0020("  1S= 0 1M= 0   ");
rom.c 386:
rom.c 387:
rom.c 388: sf0066(0x80 +1 ,0x60);
rom.c 389: sf0066(0x80 ,0);
rom.c 390: level = 0x02;
rom.c 391:
rom.c 392: sf0011(4,10,0x01   ,f923);
rom.c 393: low = high = 0;
rom.c 394: done = 0;
rom.c 395: while(!done)
rom.c 396: {
rom.c 397:
rom.c 398: f202("Network Utilization Monitor");
rom.c 399:
rom.c 400: rputs("Notes|         Normal Network Activity | Moderate | Heavy    |    Pr
obable Fault Area|\r\n");
rom.c 401: rputs("->    0%  Network Traffic       5%          10%       20%
   50%       100%\r\n");
```

```
rom.c 402: rputf("Time:|%25p-|%12p-|%7p-|%12p-|%13p-|\r\n");
rom.c 403: for( linecnt = 0; (linecnt < 60) &&  !done; linecnt++ )
rom.c 404: {
rom.c 405: moncnt = 0;
rom.c 406:
rom.c 407:
rom.c 408: while( moncnt < 300 )
rom.c 409: {
rom.c 410: current = 0;
rom.c 411: oldmon = moncnt;
rom.c 412: i=0;
rom.c 413: while( oldmon == moncnt )
rom.c 414: {
rom.c 415: if( ! (sf0065(0x82  ) & level) )
rom.c 416: {
rom.c 417: low++;
rom.c 418: current++;
rom.c 419: i++;
rom.c 420: }
rom.c 421: }
rom.c 422:
rom.c 423: sf0025();
rom.c 424: if( ! i )
rom.c 425: sf0021(' ');
rom.c 426: else
rom.c 427: {
rom.c 428: i = (i>80) ? 80 : i;
rom.c 429: sf0021( ((i/10) +1)  );
rom.c 430: }
rom.c 431: i=0;
rom.c 432:
rom.c 433: if( !(moncnt % 5) )
rom.c 434: {
rom.c 435: for( i=0; current > logls[i]; i++ )
rom.c 436: ;
rom.c 437: sf0022(" 1S=%2d",i-1);
rom.c 438:
rom.c 439: if( low < 0 )
rom.c 440: {
rom.c 441: low = 0;
rom.c 442: high++;
rom.c 443: }
rom.c 444: }
rom.c 445:
rom.c 446: if( sf0041(0xff )  )
rom.c 447: {
rom.c 448: low = high = 0;
rom.c 449: rputs("User stop ...\r\n");
rom.c 450: done = 1;
rom.c 451: return;
rom.c 452: }
rom.c 453: }
rom.c 454:
rom.c 455:
rom.c 456: if( ! high )
rom.c 457: {
rom.c 458:
rom.c 459: if( (low >10) && (low < 81) )
rom.c 460: low /= 4;
rom.c 461:
rom.c 462: if( (low > 80) && (low < 241) )
rom.c 463: low /= 6;
rom.c 464:
rom.c 465: if( low > 240 )
rom.c 466: low /= 455;
rom.c 467: }
rom.c 468: else
rom.c 469: {
rom.c 470: if( high = 1 )
rom.c 471: low = 78;
rom.c 472: if( high = 2 )
rom.c 473: low = 80;
rom.c 474: }
```

```
rom.c 475:
rom.c 476: if( (time%100) > 59 )
rom.c 477: time = ((time/100) + 1) * 100;
rom.c 478: if( (time/100) > 24 )
rom.c 479: time = 0;
rom.c 480: rputf("%2d:%02d|",time/100,time%100);
rom.c 481: if( high < 3 )
rom.c 482: {
rom.c 483: for( i=0; i < low; i++)
rom.c 484: rputc('*');
rom.c 485: rputs("\r\n");
rom.c 486: sf0025();
rom.c 487:
rom.c 488: for( i=0; current > log1s[i]; i++ )
rom.c 489: ;
rom.c 490: for( k=0; low > log1m[k]; k++ )
rom.c 491: ;
rom.c 492: sf0022("  1S=%2d  1M=%2d ",i-1,k-1);
rom.c 493: }
rom.c 494: else
rom.c 495: rputs("Probable Network ERROR\r\n");
rom.c 496:
rom.c 497: low = high = 0;
rom.c 498: time++;
rom.c 499: }
rom.c 500: }
rom.c 501: sf0011(4,0x32,0,f923);
rom.c 502: }
rom.c 503:
rom.c 504:        int     f900()
rom.c 505: {
rom.c 506:  unsigned i;
rom.c 507:
rom.c 508: sf0034("Enter Macro", "Function # ->_");
rom.c 509: i= sf0038();
rom.c 510: if( (i == 0x0c  ) || (i == 0x0a  ) )
rom.c 511: return;
rom.c 512: else if( i == 0x0b  )
rom.c 513: {
rom.c 514: i = 0;
rom.c 515: }
rom.c 516: sf0025();
rom.c 517: sf0022("Function # ->%d",i);
rom.c 518: sf0060(1000);
rom.c 519:
rom.c 520: switch( i )
rom.c 521: {
rom.c 522: case 1 :
rom.c 523: f910();
rom.c 524: break;
rom.c 525: case 2 :
rom.c 526: f920();
rom.c 527: break;
rom.c 528: case 3 :
rom.c 529: f930();
rom.c 530: break;
rom.c 531:
rom.c 532: case 4 :
rom.c 533:
rom.c 534: f940();
rom.c 535: break;
rom.c 536:
rom.c 537: case 5 :
rom.c 538:
rom.c 539: f950();
rom.c 540: break;
rom.c 541:
rom.c 542: case 6 :
rom.c 543: f960();
rom.c 544: break;
rom.c 545:
rom.c 546: case 7 :
rom.c 547:
```

```
rom.c 548: f970();
rom.c 549: break;
rom.c 550:
rom.c 551: case 8 :
rom.c 552:
rom.c 553: sf0062();
rom.c 554: break;
rom.c 555:
rom.c 556: case 9 :
rom.c 557:
rom.c 558: sf0062();
rom.c 559: break;
rom.c 560:
rom.c 561: case 0:
rom.c 562:
rom.c 563: sf0062();
rom.c 564: break;
rom.c 565:
rom.c 566: default:
rom.c 567: break;
rom.c 568:
rom.c 569: }
rom.c 570:
rom.c 571: }
rom.c 572:        int     f910()
rom.c 573: {
rom.c 574:        int i;
rom.c 575:        int j;
rom.c 576:   int count;
rom.c 577:        int k;
rom.c 578:
rom.c 579:
rom.c 580: sf0035("Tracer active","Hit a key..");
rom.c 581:
rom.c 582: sf0066(0x80, 0x80);
rom.c 583: sf0066(0x10 , 0x06);
rom.c 584: port82 |= 0x02 ;
rom.c 585: sf0066(0x82, port82);
rom.c 586:
rom.c 587:
rom.c 588: port82 &= 0x0f;
rom.c 589: sf0066(0x82 ,port82);
rom.c 590: while((sf0065(0x82 ) & 0xE0 ) != 0xE0   )
rom.c 591: ;
rom.c 592:
rom.c 593: for( i=0; ; i++)
rom.c 594: {
rom.c 595: port82 &= 0x0f;
rom.c 596: sf0066(0x82 ,port82);
rom.c 597: k = sf0065(0x82 ) & 0xE0 ;
rom.c 598: if ( k < 0xE0   )
rom.c 599: {
rom.c 600: break;
rom.c 601: }
rom.c 602:
rom.c 603: count = 200;
rom.c 604: if( i & 1 )
rom.c 605: {
rom.c 606: while(count--)
rom.c 607: {
rom.c 608:
rom.c 609: for( j=0; j<1; j++)
rom.c 610: {
rom.c 611: port82 |= 0x08;
rom.c 612: sf0066(0x82, port82);
rom.c 613: }
rom.c 614: for( j=0; j<1; j++)
rom.c 615: {
rom.c 616: port82 &= 0xf7;
rom.c 617: sf0066(0x82, port82);
rom.c 618: }
rom.c 619: }
rom.c 620: }
rom.c 621: else
```

```
rom.c 622: {
rom.c 623: while(count--)
rom.c 624: {
rom.c 625: for( j=0; j<2; j++)
rom.c 626: {
rom.c 627: port82 |= 0x08;
rom.c 628: sf0066(0x82, port82);
rom.c 629: }
rom.c 630: for( j=0; j<2; j++)
rom.c 631: {
rom.c 632: port82 &= 0xf7;
rom.c 633: sf0066(0x82, port82);
rom.c 634: }
rom.c 635: }
rom.c 636: }
rom.c 637: }
rom.c 638:
rom.c 639: sf0066(0x10 , 0x17);
rom.c 640: sf0066(0x80, 0x0);
rom.c 641: port82 &= ~0x02 ;
rom.c 642: sf0066(0x82 ,port82);
rom.c 643:
rom.c 644: }
rom.c 645:         int f1008()
rom.c 646: {
rom.c 647:  unsigned i;
rom.c 648:
rom.c 649: sf0019()
rom.c 650: i = f1006( 2, "Enter NVP as", "a percentage" );
rom.c 651: if( i !=-1)
rom.c 652: {
rom.c 653: if( (i<50) || (i>99) )
rom.c 654: {
rom.c 655: sf0019();
rom.c 656: sf0022("NVP of %d", i);
rom.c 657: sf0025();
rom.c 658: sf0059();
rom.c 659: }
rom.c 660: else
rom.c 661: {
rom.c 662:
rom.c 663: cable_usr[0].nvp_pcnt = i;
rom.c 664: scable_nvp = ocable_nvp = 20334/i;
rom.c 665: cable_usr[0].s_nvp = scable_nvp;
rom.c 666: cable_usr[0].o_nvp = ocable_nvp;
rom.c 667: f87( 16 );
rom.c 668: c_cb_ty = 16;
rom.c 669: pvc_tfe = 0;
rom.c 670: }
rom.c 671: }
rom.c 672: }
rom.c 673:
rom.c 674:           int      f200()
rom.c 675: {
rom.c 676:
rom.c 677: sf0019();
rom.c 678: sf0027("Graphic output");
rom.c 679: sf0025();
rom.c 680: if( *reslt[0].name && reslt[0].valid )
rom.c 681: {
rom.c 682: sf0027("Printing now");
rom.c 683: f201(&reslt[0]);
rom.c 684: }
rom.c 685: else
rom.c 686: {
rom.c 687: sf0027("NO valid data");
rom.c 688: sf0063(10000);
rom.c 689: }
rom.c 690: }
rom.c 691:
rom.c 692:           int      f704()
rom.c 693: {
rom.c 694:           int i;
```

```
rom.c 695:            int j;
rom.c 696:        char baud;
rom.c 697:        char rxctl0;
rom.c 698:        char finish;
rom.c 699:  char result[7];
rom.c 700:            int min;
rom.c 701:        int done;
rom.c 702: static    int brate[] =
rom.c 703: { 19200, 9600, 4800, 2400, 1200, 600, 300 };
rom.c 704:
rom.c 705: sf0019();
rom.c 706: sf0035("Auto baud sense","Start Xmiting");
rom.c 707:
rom.c 708: rxstat0 = 0;
rom.c 709: rxmod0 = 0x74;
rom.c 710:
rom.c 711: sf0066(0x10 ,6);
rom.c 712:
rom.c 713: for( done = 1; done > 0; done--)
rom.c 714: {
rom.c 715: for( rxctl0 = 0, finish=0; (rxctl0 < 7) && !finish; rxctl0++)
rom.c 716: {
rom.c 717: sf0066(0x00 ,rxmod0 & 0xb7);
rom.c 718: sf0066(0x02 ,rxctl0);
rom.c 719:
rom.c 720: for(min=0; min<2000; min++)
rom.c 721: ;
rom.c 722: rxnxti = 0;
rom.c 723: rxnxto = 0;
rom.c 724: rxstat0=0;
rom.c 725: sf0066(0x00 ,rxmod0);
rom.c 726:
rom.c 727: while( rxnxti < 10 )
rom.c 728: {
rom.c 729: port82 &= 0x0f;
rom.c 730: sf0066(0x82 ,port82);
rom.c 731: j = sf0065(0x82 ) & 0xE0 ;
rom.c 732: if ( j < 0xE0 )
rom.c 733: {
rom.c 734: sf0066(0x02 ,0x01);
rom.c 735: sf0066(0x10 ,0x17);
rom.c 736: return;
rom.c 737: }
rom.c 738: }
rom.c 739: rxstat0 = 0;
rom.c 740: while( rxnxti < 30 )
rom.c 741: {
rom.c 742: port82 &= 0x0f;
rom.c 743: sf0066(0x82 ,port82);
rom.c 744: j = sf0065(0x82 ) & 0xE0 ;
rom.c 745: if ( j < 0xE0 )
rom.c 746: {
rom.c 747: sf0066(0x02 ,0x01);
rom.c 748: sf0066(0x10 ,0x17);
rom.c 749: return;
rom.c 750: }
rom.c 751: }
rom.c 752:
rom.c 753: sf0066(0x00 ,rxmod0 & 0xb7);
rom.c 754:
rom.c 755: result[rxctl0] = rxstat0;
rom.c 756: }
rom.c 757:
rom.c 758: min = 100;
rom.c 759: j = 10;
rom.c 760:
rom.c 761: for( i=1; i<7 ; i++)
rom.c 762: {
rom.c 763: if( (result[i] & 0x7f) < min )
rom.c 764: {
rom.c 765: j = i;
rom.c 766: min = result[i];
rom.c 767: }
```

```
rom.c 768: }
rom.c 769: }
rom.c 770:
rom.c 771: if( j < 10 )
rom.c 772: {
rom.c 773: bsense = j;
rom.c 774: sf0025();
rom.c 775: sf0022("Baud =%5d     ",brate[j]);
rom.c 776: }
rom.c 777:
rom.c 778: sf0066(0x10 ,0x17);
rom.c 779: sf0066(0x02 ,0x01);
rom.c 780:
rom.c 781: while( ! sf0041(0xff ) )
rom.c 782: ;
rom.c 783:
rom.c 784: }
rom.c 785:
rom.c 786:
rom.c 787:
rom.c 788:
rom.c 789:         int     f706()
rom.c 790: {
rom.c 791:
rom.c 792: sf0019();
rom.c 793: sf0035("XON / XOFF test","Start Xmiting");
rom.c 794:
rom.c 795: rxmod0 = 0x74;
rom.c 796: sf0066(0x10 ,6);
rom.c 797: sf0066(0x00 ,rxmod0 & 0xb7);
rom.c 798: sf0066(0x02 ,bsense);
rom.c 799:
rom.c 800: rxnxti = 0;
rom.c 801: rxnxto = 0;
rom.c 802: rxstat0 = 0;
rom.c 803:
rom.c 804:
rom.c 805: sf0066(0x82 ,port82 & 0x0f);
rom.c 806: while( (sf0065(0x82 ) & 0xE0 ) != 0xE0   )
rom.c 807: ;
rom.c 808:
rom.c 809:
rom.c 810:
rom.c 811: sf0066(0x00 ,rxmod0);
rom.c 812: while( rxnxti < bcount )
rom.c 813: {
rom.c 814: if( (sf0065(0x82 ) & 0xE0 ) < 0xE0   )
rom.c 815: {
rom.c 816: while( (sf0065(0x82 ) & 0xE0 ) != 0xE0   )
rom.c 817: ;
rom.c 818: sf0066(0x02 ,0x01);
rom.c 819: sf0066(0x10 ,0x17);
rom.c 820: return;
rom.c 821: }
rom.c 822: }
rom.c 823: sf0077(0x13 );
rom.c 824:
rom.c 825: sf0060(5000);
rom.c 826:
rom.c 827: sf0025();
rom.c 828:
rom.c 829:
rom.c 830: if( (rxnxti - bcount - 1) > 49 )
rom.c 831: {
rom.c 832: sf0027("Xoff NOT working");
rom.c 833: }
rom.c 834: else
rom.c 835: {
rom.c 836:
rom.c 837: sf0022("Count=%2u STOPPED", rxnxti - bcount - 1 );
rom.c 838: }
rom.c 839:
rom.c 840:
```

```
rom.c 841:
rom.c 842:
rom.c 843: sf0066(0x10 ,0x17);
rom.c 844: sf0066(0x00 ,rxmod0);
rom.c 845: sf0066(0x02 ,0x01);
rom.c 846: sf0077(0x11 );
rom.c 847: sf0038();
rom.c 848:
rom.c 849: }
rom.c 850:
rom.c 851:
rom.c 852:
rom.c 853:
rom.c 854:        int       sf0060(len)
rom.c 855:            int len;
rom.c 856: {
rom.c 857:        int i;
rom.c 858:
rom.c 859: for(i=0;i<len;i++)
rom.c 860: ;
rom.c 861: }
rom.c 862:
rom.c 863:        int       sf0063(len)
rom.c 864:            int len;
rom.c 865: {
rom.c 866:        int i;
rom.c 867:
rom.c 868:
rom.c 869: sf0046();
rom.c 870: for(i=0;i<1000;i++)
rom.c 871: ;
rom.c 872: sf0047();
rom.c 873: for(i=0;i<len;i++)
rom.c 874: ;
rom.c 875: }
rom.c 876:
rom.c 877:        int       sf0059()
rom.c 878: {
rom.c 879: sf0020("NOT valid     ");
rom.c 880: sf0063(5000);
rom.c 881: return;
rom.c 882: }
rom.c 883:
rom.c 884:        int       sf0062()
rom.c 885: {
rom.c 886: sf0019();
rom.c 887: sf0027("NOT Implemented");
rom.c 888: sf0063(5000);
rom.c 889: return;
rom.c 890: }
rom.c 891:
rom.c 892:
rom.c 893:
```

```
FILE: includes.i
PAGE: 1
```

Structures and externs for include files

TDR.H
..\include\tdr.h 1:
..\include\tdr.h 156: typedef struct
..\include\tdr.h 157: {
..\include\tdr.h 158: char        name[17];
..\include\tdr.h 159: char        cb_nam[22];
..\include\tdr.h 160: unsigned   int    s_nvp;
..\include\tdr.h 161: unsigned   int    o_nvp;
..\include\tdr.h 162: unsigned   int    scbl_front;
..\include\tdr.h 163: unsigned   int    ocbl_front;
..\include\tdr.h 164: unsigned   char   nvp_pcnt;

```
..\include\tdr.h 165: unsigned   char     cbl_imp;
..\include\tdr.h 166: unsigned   char     cbl_da;
..\include\tdr.h 167: unsigned   char     sht_da;
..\include\tdr.h 168: unsigned   int      ftc_len;
..\include\tdr.h 169: unsigned   int      mc_len;
..\include\tdr.h 170: } CABLE_STRUCT;
..\include\tdr.h 171:
..\include\tdr.h 172: typedef struct
..\include\tdr.h 173: {
..\include\tdr.h 174: unsigned  char *name;
..\include\tdr.h 175: unsigned  int *snvp;
..\include\tdr.h 176: unsigned  int *onvp;
..\include\tdr.h 177: unsigned  int *sfrnt;
..\include\tdr.h 178: unsigned  int *ofrnt;
..\include\tdr.h 179: }CABLE_POINT;
..\include\tdr.h 180:
..\include\tdr.h 181: typedef struct
..\include\tdr.h 182: {
..\include\tdr.h 183: unsigned        id;
..\include\tdr.h 184: unsigned        reload;
..\include\tdr.h 185: unsigned        downcount;
..\include\tdr.h 186: unsigned        flags;
..\include\tdr.h 187: unsigned        result;
..\include\tdr.h 188: unsigned        (* funct)();
..\include\tdr.h 189: }    TIMER;
..\include\tdr.h 190:
..\include\tdr.h 191:
..\include\tdr.h 192: typedef struct
..\include\tdr.h 193: {
..\include\tdr.h 194: char   da;
..\include\tdr.h 195: char   start;
..\include\tdr.h 196: char   width;
..\include\tdr.h 197: char   slope;
..\include\tdr.h 198: } MEAS_STRUCT;
..\include\tdr.h 199:
..\include\tdr.h 200:
..\include\tdr.h 201:
..\include\tdr.h 202:
..\include\tdr.h 203:
..\include\tdr.h 204:
..\include\tdr.h 205:
..\include\tdr.h 206:
..\include\tdr.h 207: typedef struct
..\include\tdr.h 208: {
..\include\tdr.h 209: unsigned   char    name[17];
..\include\tdr.h 210: unsigned   char    c_nam[22];
..\include\tdr.h 211: unsigned   char    nvp;
..\include\tdr.h 212: unsigned   char    f_type;
..\include\tdr.h 213:
..\include\tdr.h 214: unsigned   int     ft_dist;
..\include\tdr.h 215: unsigned   int     m_dist;
..\include\tdr.h 216: unsigned   char    ampl;
..\include\tdr.h 217: int        noise;
..\include\tdr.h 218: unsigned   int     dcohms;
..\include\tdr.h 219: unsigned   char    imped;
..\include\tdr.h 220: char  cbl_type;
..\include\tdr.h 221: unsigned   int     ftc_len;
..\include\tdr.h 222: unsigned   int     mc_len;
..\include\tdr.h 223: unsigned   char    valid;
..\include\tdr.h 224:
..\include\tdr.h 225: }RESLT;
..\include\tdr.h 226:
..\include\tdr.h 227:
..\include\tdr.h 228:
..\include\tdr.h 229:
..\include\tdr.h 230:
..\include\tdr.h 231:
..\include\tdr.h 232:
CHARLIB.H
..\include\charlib.h 1:
..\include\charlib.h 2:
..\include\charlib.h 3:
..\include\charlib.h 4:
..\include\charlib.h 5:
```

```
..\include\charlib.h  6:
..\include\charlib.h  7:
..\include\charlib.h  8:
..\include\charlib.h  9:
..\include\charlib.h 10:
..\include\charlib.h 11:
..\include\charlib.h 12:
..\include\charlib.h 13:
..\include\charlib.h 14:
..\include\charlib.h 15:
..\include\charlib.h 16: char cmap[] =
..\include\charlib.h 17: {
..\include\charlib.h 18:   (0<<7|0<<6|0<<5|0<<4|0<<3|0<<2|0<<1|0) ,
..\include\charlib.h 19:   (0<<7|0<<6|0<<5|0<<4|0<<3|0<<2|0<<1|0) ,
..\include\charlib.h 20:   (0<<7|0<<6|0<<5|0<<4|0<<3|0<<2|0<<1|0) ,
..\include\charlib.h 21:   (0<<7|0<<6|0<<5|0<<4|0<<3|0<<2|0<<1|0) ,
..\include\charlib.h 22:   (0<<7|0<<6|0<<5|0<<4|0<<3|0<<2|0<<1|0) ,
..\include\charlib.h 23:   (0<<7|0<<6|0<<5|0<<4|0<<3|0<<2|0<<1|0) ,
..\include\charlib.h 24:   (0<<7|0<<6|0<<5|0<<4|0<<3|0<<2|0<<1|0) ,
..\include\charlib.h 25:   (0<<7|0<<6|0<<5|0<<4|0<<3|0<<2|0<<1|0) ,
..\include\charlib.h 26:   (0<<7|0<<6|0<<5|0<<4|0<<3|0<<2|0<<1|0) ,
..\include\charlib.h 27:   (0<<7|0<<6|0<<5|0<<4|1<<3|0<<2|0<<1|0) ,
..\include\charlib.h 28:   (0<<7|0<<6|0<<5|0<<4|0<<3|0<<2|0<<1|0) ,
..\include\charlib.h 29:   (0<<7|0<<6|0<<5|0<<4|0<<3|0<<2|0<<1|0) ,
..\include\charlib.h 30:   (0<<7|0<<6|0<<5|0<<4|0<<3|0<<2|0<<1|0) ,
..\include\charlib.h 31:   (0<<7|0<<6|0<<5|0<<4|0<<3|0<<2|0<<1|0) ,
..\include\charlib.h 32:   (0<<7|0<<6|0<<5|0<<4|0<<3|0<<2|0<<1|0) ,
..\include\charlib.h 33:   (0<<7|0<<6|0<<5|0<<4|0<<3|0<<2|0<<1|0) ,
..\include\charlib.h 34:   (0<<7|0<<6|0<<5|0<<4|0<<3|0<<2|0<<1|0) ,
..\include\charlib.h 35:   (0<<7|0<<6|0<<5|0<<4|0<<3|0<<2|0<<1|0) ,
..\include\charlib.h 36:   (0<<7|0<<6|0<<5|0<<4|0<<3|0<<2|0<<1|0) ,
..\include\charlib.h 37:   (0<<7|0<<6|0<<5|0<<4|0<<3|0<<2|0<<1|0) ,
..\include\charlib.h 38:   (0<<7|0<<6|0<<5|0<<4|0<<3|0<<2|0<<1|0) ,
..\include\charlib.h 39:   (0<<7|0<<6|0<<5|0<<4|0<<3|0<<2|0<<1|0) ,
..\include\charlib.h 40:   (0<<7|0<<6|0<<5|0<<4|0<<3|0<<2|0<<1|0) ,
..\include\charlib.h 41:   (0<<7|0<<6|0<<5|0<<4|0<<3|0<<2|0<<1|0) ,
..\include\charlib.h 42:   (0<<7|0<<6|0<<5|0<<4|0<<3|0<<2|0<<1|0) ,
..\include\charlib.h 43:   (0<<7|0<<6|0<<5|0<<4|0<<3|0<<2|0<<1|0) ,
..\include\charlib.h 44:   (0<<7|0<<6|0<<5|0<<4|0<<3|0<<2|0<<1|0) ,
..\include\charlib.h 45:   (0<<7|0<<6|0<<5|0<<4|0<<3|0<<2|0<<1|0) ,
..\include\charlib.h 46:   (0<<7|0<<6|0<<5|0<<4|0<<3|0<<2|0<<1|0) ,
..\include\charlib.h 47:   (0<<7|0<<6|0<<5|0<<4|0<<3|0<<2|0<<1|0) ,
..\include\charlib.h 48:   (0<<7|0<<6|0<<5|0<<4|0<<3|0<<2|0<<1|0) ,
..\include\charlib.h 49:   (0<<7|0<<6|0<<5|0<<4|0<<3|0<<2|0<<1|0) ,
..\include\charlib.h 50:   (0<<7|0<<6|0<<5|0<<4|1<<3|0<<2|0<<1|0) ,
..\include\charlib.h 51:   (0<<7|0<<6|0<<5|0<<4|0<<3|0<<2|0<<1|1) ,
..\include\charlib.h 52:   (0<<7|0<<6|0<<5|0<<4|0<<3|0<<2|0<<1|1) ,
..\include\charlib.h 53:   (0<<7|0<<6|0<<5|0<<4|0<<3|0<<2|0<<1|1) ,
..\include\charlib.h 54:   (0<<7|0<<6|0<<5|0<<4|0<<3|0<<2|0<<1|1) ,
..\include\charlib.h 55:   (0<<7|0<<6|0<<5|0<<4|0<<3|0<<2|0<<1|1) ,
..\include\charlib.h 56:   (0<<7|0<<6|0<<5|0<<4|0<<3|0<<2|0<<1|1) ,
..\include\charlib.h 57:   (0<<7|0<<6|0<<5|0<<4|0<<3|0<<2|0<<1|1) ,
..\include\charlib.h 58:
..\include\charlib.h 59:   (0<<7|0<<6|0<<5|0<<4|0<<3|0<<2|0<<1|1) ,
..\include\charlib.h 60:   (0<<7|0<<6|0<<5|0<<4|0<<3|0<<2|0<<1|1) ,
..\include\charlib.h 61:   (0<<7|0<<6|0<<5|0<<4|0<<3|0<<2|0<<1|1) ,
..\include\charlib.h 62:   (0<<7|0<<6|0<<5|0<<4|0<<3|0<<2|0<<1|1) ,
..\include\charlib.h 63:   (0<<7|0<<6|0<<5|0<<4|0<<3|0<<2|0<<1|1) ,
..\include\charlib.h 64:   (0<<7|0<<6|0<<5|0<<4|0<<3|0<<2|0<<1|1) ,
..\include\charlib.h 65:   (0<<7|0<<6|0<<5|0<<4|0<<3|0<<2|0<<1|1) ,
..\include\charlib.h 66:   (0<<7|0<<6|0<<5|0<<4|0<<3|0<<2|0<<1|1) ,
..\include\charlib.h 67:   (0<<7|1<<6|1<<5|1<<4|0<<3|0<<2|0<<1|0) ,
..\include\charlib.h 68:   (0<<7|1<<6|1<<5|1<<4|0<<3|0<<2|0<<1|0) ,
..\include\charlib.h 69:   (0<<7|1<<6|1<<5|1<<4|0<<3|0<<2|0<<1|0) ,
..\include\charlib.h 70:   (0<<7|1<<6|1<<5|1<<4|0<<3|0<<2|0<<1|0) ,
..\include\charlib.h 71:   (0<<7|1<<6|1<<5|1<<4|0<<3|0<<2|0<<1|0) ,
..\include\charlib.h 72:   (0<<7|1<<6|1<<5|1<<4|0<<3|0<<2|0<<1|0) ,
..\include\charlib.h 73:   (0<<7|1<<6|1<<5|1<<4|0<<3|0<<2|0<<1|0) ,
..\include\charlib.h 74:   (0<<7|1<<6|1<<5|1<<4|0<<3|0<<2|0<<1|0) ,
..\include\charlib.h 75:   (0<<7|1<<6|1<<5|1<<4|0<<3|0<<2|0<<1|0) ,
..\include\charlib.h 76:   (0<<7|1<<6|1<<5|1<<4|0<<3|0<<2|0<<1|0) ,
..\include\charlib.h 77:   (0<<7|0<<6|0<<5|0<<4|0<<3|0<<2|0<<1|1) ,
..\include\charlib.h 78:   (0<<7|0<<6|0<<5|0<<4|0<<3|0<<2|0<<1|1) ,
..\include\charlib.h 79:   (0<<7|0<<6|0<<5|0<<4|0<<3|0<<2|0<<1|1) ,
```

```
..\include\charlib.h  80: (0<<7|0<<6|0<<5|0<<4|0<<3|0<<2|0<<1|1) ,
..\include\charlib.h  81: (0<<7|0<<6|0<<5|0<<4|0<<3|0<<2|0<<1|1) ,
..\include\charlib.h  82: (0<<7|0<<6|0<<5|0<<4|0<<3|0<<2|0<<1|1) ,
..\include\charlib.h  83: (0<<7|0<<6|0<<5|0<<4|0<<3|0<<2|0<<1|1) ,
..\include\charlib.h  84: (1<<7|0<<6|1<<5|1<<4|0<<3|0<<2|1<<1|0) ,
..\include\charlib.h  85: (1<<7|0<<6|1<<5|1<<4|0<<3|0<<2|1<<1|0) ,
..\include\charlib.h  86: (1<<7|0<<6|1<<5|1<<4|0<<3|0<<2|1<<1|0) ,
..\include\charlib.h  87: (1<<7|0<<6|1<<5|1<<4|0<<3|0<<2|1<<1|0) ,
..\include\charlib.h  88: (1<<7|0<<6|1<<5|1<<4|0<<3|0<<2|1<<1|0) ,
..\include\charlib.h  89: (1<<7|0<<6|1<<5|1<<4|0<<3|0<<2|1<<1|0) ,
..\include\charlib.h  90: (1<<7|0<<6|0<<5|1<<4|0<<3|0<<2|1<<1|0) ,
..\include\charlib.h  91: (1<<7|0<<6|0<<5|1<<4|0<<3|0<<2|1<<1|0) ,
..\include\charlib.h  92: (1<<7|0<<6|0<<5|1<<4|0<<3|0<<2|1<<1|0) ,
..\include\charlib.h  93: (1<<7|0<<6|0<<5|1<<4|0<<3|0<<2|1<<1|0) ,
..\include\charlib.h  94: (1<<7|0<<6|0<<5|1<<4|0<<3|0<<2|1<<1|0) ,
..\include\charlib.h  95: (1<<7|0<<6|0<<5|1<<4|0<<3|0<<2|1<<1|0) ,
..\include\charlib.h  96: (1<<7|0<<6|0<<5|1<<4|0<<3|0<<2|1<<1|0) ,
..\include\charlib.h  97: (1<<7|0<<6|0<<5|1<<4|0<<3|0<<2|1<<1|0) ,
..\include\charlib.h  98: (1<<7|0<<6|0<<5|1<<4|0<<3|0<<2|1<<1|0) ,
..\include\charlib.h  99: (1<<7|0<<6|0<<5|1<<4|0<<3|0<<2|1<<1|0) ,
..\include\charlib.h 100: (1<<7|0<<6|0<<5|1<<4|0<<3|0<<2|1<<1|0) ,
..\include\charlib.h 101: (1<<7|0<<6|0<<5|1<<4|0<<3|0<<2|1<<1|0) ,
..\include\charlib.h 102: (1<<7|0<<6|0<<5|1<<4|0<<3|0<<2|1<<1|0) ,
..\include\charlib.h 103: (1<<7|0<<6|0<<5|1<<4|0<<3|0<<2|1<<1|0) ,
..\include\charlib.h 104: (1<<7|0<<6|0<<5|1<<4|0<<3|0<<2|1<<1|0) ,
..\include\charlib.h 105: (1<<7|0<<6|0<<5|1<<4|0<<3|0<<2|1<<1|0) ,
..\include\charlib.h 106: (1<<7|0<<6|0<<5|1<<4|0<<3|0<<2|1<<1|0) ,
..\include\charlib.h 107: (1<<7|0<<6|0<<5|1<<4|0<<3|0<<2|1<<1|0) ,
..\include\charlib.h 108: (1<<7|0<<6|0<<5|1<<4|0<<3|0<<2|1<<1|0) ,
..\include\charlib.h 109: (1<<7|0<<6|0<<5|1<<4|0<<3|0<<2|1<<1|0) ,
..\include\charlib.h 110: (0<<7|0<<6|0<<5|0<<4|0<<3|0<<2|0<<1|1) ,
..\include\charlib.h 111: (0<<7|0<<6|0<<5|0<<4|0<<3|0<<2|0<<1|1) ,
..\include\charlib.h 112: (0<<7|0<<6|0<<5|0<<4|0<<3|0<<2|0<<1|1) ,
..\include\charlib.h 113: (0<<7|0<<6|0<<5|0<<4|0<<3|0<<2|0<<1|1) ,
..\include\charlib.h 114: (0<<7|0<<6|0<<5|0<<4|0<<3|0<<2|0<<1|1) ,
..\include\charlib.h 115: (0<<7|0<<6|0<<5|0<<4|0<<3|0<<2|0<<1|1) ,
..\include\charlib.h 116: (1<<7|0<<6|1<<5|1<<4|0<<3|1<<2|0<<1|0) ,
..\include\charlib.h 117: (1<<7|0<<6|1<<5|1<<4|0<<3|1<<2|0<<1|0) ,
..\include\charlib.h 118: (1<<7|0<<6|1<<5|1<<4|0<<3|1<<2|0<<1|0) ,
..\include\charlib.h 119: (1<<7|0<<6|1<<5|1<<4|0<<3|1<<2|0<<1|0) ,
..\include\charlib.h 120: (1<<7|0<<6|1<<5|1<<4|0<<3|1<<2|0<<1|0) ,
..\include\charlib.h 121: (1<<7|0<<6|1<<5|1<<4|0<<3|1<<2|0<<1|0) ,
..\include\charlib.h 122: (1<<7|0<<6|0<<5|1<<4|0<<3|1<<2|0<<1|0) ,
..\include\charlib.h 123: (1<<7|0<<6|0<<5|1<<4|0<<3|1<<2|0<<1|0) ,
..\include\charlib.h 124: (1<<7|0<<6|0<<5|1<<4|0<<3|1<<2|0<<1|0) ,
..\include\charlib.h 125: (1<<7|0<<6|0<<5|1<<4|0<<3|1<<2|0<<1|0) ,
..\include\charlib.h 126: (1<<7|0<<6|0<<5|1<<4|0<<3|1<<2|0<<1|0) ,
..\include\charlib.h 127: (1<<7|0<<6|0<<5|1<<4|0<<3|1<<2|0<<1|0) ,
..\include\charlib.h 128: (1<<7|0<<6|0<<5|1<<4|0<<3|1<<2|0<<1|0) ,
..\include\charlib.h 129: (1<<7|0<<6|0<<5|1<<4|0<<3|1<<2|0<<1|0) ,
..\include\charlib.h 130: (1<<7|0<<6|0<<5|1<<4|0<<3|1<<2|0<<1|0) ,
..\include\charlib.h 131: (1<<7|0<<6|0<<5|1<<4|0<<3|1<<2|0<<1|0) ,
..\include\charlib.h 132: (1<<7|0<<6|0<<5|1<<4|0<<3|1<<2|0<<1|0) ,
..\include\charlib.h 133: (1<<7|0<<6|0<<5|1<<4|0<<3|1<<2|0<<1|0) ,
..\include\charlib.h 134: (1<<7|0<<6|0<<5|1<<4|0<<3|1<<2|0<<1|0) ,
..\include\charlib.h 135: (1<<7|0<<6|0<<5|1<<4|0<<3|1<<2|0<<1|0) ,
..\include\charlib.h 136: (1<<7|0<<6|0<<5|1<<4|0<<3|1<<2|0<<1|0) ,
..\include\charlib.h 137: (1<<7|0<<6|0<<5|1<<4|0<<3|1<<2|0<<1|0) ,
..\include\charlib.h 138: (1<<7|0<<6|0<<5|1<<4|0<<3|1<<2|0<<1|0) ,
..\include\charlib.h 139: (1<<7|0<<6|0<<5|1<<4|0<<3|1<<2|0<<1|0) ,
..\include\charlib.h 140: (1<<7|0<<6|0<<5|1<<4|0<<3|1<<2|0<<1|0) ,
..\include\charlib.h 141: (1<<7|0<<6|0<<5|1<<4|0<<3|1<<2|0<<1|0) ,
..\include\charlib.h 142: (0<<7|0<<6|0<<5|0<<4|0<<3|0<<2|0<<1|1) ,
..\include\charlib.h 143: (0<<7|0<<6|0<<5|0<<4|0<<3|0<<2|0<<1|1) ,
..\include\charlib.h 144: (0<<7|0<<6|0<<5|0<<4|0<<3|0<<2|0<<1|1) ,
..\include\charlib.h 145: (0<<7|0<<6|0<<5|0<<4|0<<3|0<<2|0<<1|1) ,
..\include\charlib.h 146: (0<<7|0<<6|0<<5|0<<4|0<<3|0<<2|0<<1|0)
..\include\charlib.h 147: };
..\include\charlib.h 148:
..\include\charlib.h 149:
BOX.H
..\include\box.h 1:
..\include\box.h 42: typedef struct rngb
```

```
..\include\box.h 43: {
..\include\box.h 44: char rbuffer[256 ];
..\include\box.h 45: char rcount;
..\include\box.h 46: char rin_index;
..\include\box.h 47: char rout_index;
..\include\box.h 48: char tbuffer[256 ];
..\include\box.h 49: char tcount;
..\include\box.h 50: char tindex;
..\include\box.h 51: char XONXOFF_enabled;
..\include\box.h 52: char CNTRLS_sent;
..\include\box.h 53: char CNTRLS_recieved;
..\include\box.h 54: char RXEMPTY;
..\include\box.h 55: char RXFULL;
..\include\box.h 56: char TXEMPTY;
..\include\box.h 57: char TXFULL;
..\include\box.h 58: }RNG_BUFFS[2 ], *RNGBUFPTR;
..\include\box.h 59:
..\include\box.h 60:
GLOBS.EXT
..\include\globs.ext 1:
..\include\globs.ext 2:
..\include\globs.ext 3:
..\include\globs.ext 4:
..\include\globs.ext 5: extern   CABLE_POINT    cables[24];
..\include\globs.ext 6:
..\include\globs.ext 7: extern            char rxbuf[];
..\include\globs.ext 8: extern            char safspot[];
..\include\globs.ext 9: extern                 char rxnxti;
..\include\globs.ext 10: extern                    char rxnxto;
..\include\globs.ext 11:
..\include\globs.ext 12: extern                     char rxstat0;
..\include\globs.ext 13: extern                     char rxmod0;
..\include\globs.ext 14:
..\include\globs.ext 15: extern                     unsigned sp_sav;
..\include\globs.ext 16: extern                     int kbcount;
..\include\globs.ext 17: extern            char pwr_cntr;
..\include\globs.ext 18:
..\include\globs.ext 19: extern                char port82;
..\include\globs.ext 20: extern            char kbque[16];
..\include\globs.ext 21: extern                char kblen;
..\include\globs.ext 22:
..\include\globs.ext 23: extern      char kbd_matrix[];
..\include\globs.ext 24:
..\include\globs.ext 25: extern      char kbdlist[];
..\include\globs.ext 26:
..\include\globs.ext 27: extern                char pvc_tfe;
..\include\globs.ext 28: extern         unsigned *cbl_name;
..\include\globs.ext 29: extern              unsigned scable_nvp;
..\include\globs.ext 30: extern              unsigned ocable_nvp;
..\include\globs.ext 31: extern              char scbl_front;
..\include\globs.ext 32: extern              char ocbl_front;
..\include\globs.ext 33:
..\include\globs.ext 34:
..\include\globs.ext 35: extern MEAS_STRUCT sngl_val[4];
..\include\globs.ext 36:
..\include\globs.ext 37: extern      TIMER tarray[10 ];
..\include\globs.ext 38:
..\include\globs.ext 39: extern                     char key;
..\include\globs.ext 40:
..\include\globs.ext 41: extern                 unsigned lopcnt;
..\include\globs.ext 42: extern             char lbuf[40];
..\include\globs.ext 43: extern      char output[20];
..\include\globs.ext 44: extern           char *dumpaddr;
..\include\globs.ext 45:
..\include\globs.ext 46: extern                 char buzzflg;
..\include\globs.ext 47:
..\include\globs.ext 48:
..\include\globs.ext 49: extern             char opnda_short;
..\include\globs.ext 50: extern             char velocity;
..\include\globs.ext 51: extern             char impedance;
..\include\globs.ext 52:
..\include\globs.ext 53:
..\include\globs.ext 54: extern CABLE_STRUCT    cable_init[];
```

```
..\include\globs.ext 55:
..\include\globs.ext 56: extern        char *fault[];
..\include\globs.ext 57: extern        char *fltmes[];
..\include\globs.ext 58: extern   char scal_val[];
..\include\globs.ext 59: extern   unsigned scal_mval[];
..\include\globs.ext 60:
..\include\globs.ext 61: extern        char cbl_type;
..\include\globs.ext 62:
..\include\globs.ext 63: extern                char tag;
..\include\globs.ext 64: extern           RESLT reslt[];
..\include\globs.ext 65: extern           char c_cb_ty;
..\include\globs.ext 66: extern           char chksum;
..\include\globs.ext 67: extern   CABLE_STRUCT cable_usr[];
..\include\globs.ext 68:
..\include\globs.ext 69: extern        char func_var;
..\include\globs.ext 70: extern           char xonoff;
..\include\globs.ext 71:
..\include\globs.ext 72: extern        unsigned (*defmac)();
..\include\globs.ext 73: extern        char amp_flag;
..\include\globs.ext 74: extern        unsigned low_thresh;
..\include\globs.ext 75: extern        unsigned hi_thresh;
..\include\globs.ext 76:
..\include\globs.ext 77: extern        unsigned deftbl[];
..\include\globs.ext 78: extern           char bsense;
..\include\globs.ext 79: extern           char bcount;
..\include\globs.ext 80: extern        char ftm_flag;
..\include\globs.ext 81: extern           char greslt;
..\include\globs.ext 82:
..\include\globs.ext 83:
..\include\globs.ext 84: extern        char *f142();
..\include\globs.ext 85:
NGLOBS.EXT
..\include\nglobs.ext 1:
..\include\nglobs.ext 2:
..\include\nglobs.ext 3: extern        char actv_lib;
..\include\nglobs.ext 4: extern        char *calibl;
..\include\nglobs.ext 5: extern           unsigned cable_type;
..\include\nglobs.ext 6: extern        unsigned cbl_sht_ofst;
..\include\nglobs.ext 7: extern           unsigned cbl_nnofset;
..\include\nglobs.ext 8: extern           unsigned cbl_wnofset;
..\include\nglobs.ext 9: extern           unsigned cbl_wfudg;
..\include\nglobs.ext 10: extern   char cbl_type;
..\include\nglobs.ext 11:
..\include\nglobs.ext 12:
```

```
FILE: chk.asm
PAGE: 1
```

```
    .z80

PUBLIC  sf0003_ sf0003_:
    push    bc
    push    ix
    push    iy
    ld  ix,00h
    ld  de,7ff0h
    ld  hl,000ch
    ld  b,0h again:
    ld  c,(hl)
    add ix,bc
    inc hl
    dec de
    ld  a,e
    or  d
    jp  nz,again
```

```
push    ix
pop     hl
ld      a,l
or      h
pop     iy
pop     ix
pop     bc
ei
ret

END
```

```
┌─────────────────┐
│ FILE: iio.asm   │
│ PAGE: 1         │
└─────────────────┘
```

```
        .8080

PUBLIC      sf0064_
        PUBLIC      sf0065_
        PUBLIC      sf0066_
        PUBLIC      di_
        PUBLIC      ei_
        PUBLIC      sf0069_
        PUBLIC      sf0070_
        PUBLIC      sf0071_
        PUBLIC      sf0072_
        PUBLIC      sf0074_
        PUBLIC      sf0075_
        PUBLIC      sf0076_
        PUBLIC      sf0077_
        PUBLIC      sf0078_
        PUBLIC      sf0079_
        PUBLIC      sf0080_
        PUBLIC      sf0081_
        PUBLIC      sf0082_
        PUBLIC      sf0083_
        PUBLIC      sf0084_
        PUBLIC      sf0085_

EXTRN       print_
        EXTRN       rxbuf_
        EXTRN       safspot_
        EXTRN       rxnxti_
        EXTRN       rxnxto_
        EXTRN       sp_sav_
        EXTRN       rxstat0_
        EXTRN       rxmod0_
        EXTRN       port82_

HANK1           equ     00h
IVLR            equ     33h
ITC     equ     34h
RDR0            equ     08h
CNTR            equ     0ah
TRDR            equ     0bh
TDR0            equ     06h
STAT0   equ     04h
STAT1           equ     05h
I_VAL           equ     9fh
IL_VAL          equ     0e0h ITC_VAL         equ     0

CNTLA0  equ     00h
IO1             equ     81h
IO2             equ     82h
IOWR1           equ     81h
IORD1           equ     81h
IORD0           equ     80h
IOWD0           equ     80h
```

```
IPC_VEC         equ      9fech sf0065_:
        push     b
        lxi      h,4
        dad      sp
        mov      c,m mvi      b,0ffh
        db       0edh
        db       068h mvi      h,0
        mov      a,l
        ora      h
        pop      b
        ret sf0066_:
        push     b
        lxi      h,4
        dad      sp
        mov      c,m
        inx      h
        inx      h
        mov      a,m db       0edh
        db       08bh mvi      h,0
        mov      l,a
        ora      h pop      b
        ret di_:
        push     b
        db       0f3h
        pop      b
        ret ei_:
        push     b
        db       0fbh
        pop      b
        ret sf0069_:

mvi      a,I_VAL
        db       0edh
        db       47h
        mvi      a,IL_VAL
        db       0edh
        db       39h
        db       IVLR mvi      a,ITC_VAL
        db       0edh
        db       39h
        db       ITC ret sf0072_:
        push     b xra      a
        mov      b,a
        mov      c,a
```

```
            mov     e,a
            mov     d,a
    r1:     lxi     h,rxnxti_
            mov     a,m
            lxi     h,rxnxto_
            mov     c,m
            lxi     h,rxbuf_
            sub     c jz      r1 rxoff:  db      0f3h
            dad     b
            mov     e,m
            inr     c
            mov     a,c
            cpi     255
            jnz     r2
            xra     a
            mov     c,a
    r2:     lxi     h,rxnxto_
            mov     m,c
            mvi     h,0
            mov     l,e
            pop     b
            db      0fbh
            ret sf0070_:
            push    psw
            push    b
            push    d
            push    h
            xra     a
            mov     b,a
            mov     c,a db      0f3h
            db      0edh
            db      38h
            db      STAT0 ani     70h
            jz      rxe1 lxi     h,rxstat0_
            mov     a,m
            ora     a
            jm      rxe0
            inr     a
            mov     m,a
    rxe0:

lxi     h,rxmod0_
            mov     a,m
            db      0edh
            db      39h
            db      CNTLA0 db      0edh
            db      38h
            db      STAT0 ani     70h
            jnz     rxe0 rxe1:

db      0edh
            db      38h
            db      RDR0
```

```
            ani       7fh
            mov       e,a lxi       h,rxnxti_
            mov       c,m
            lxi       h,rxbuf_
            dad       b
            mov       m,e
            inr       c
            mov       a,c
            cpi       255
            jnz       rx1
            xra       a
            mov       c,a
rx1:        lxi       h,rxnxti_
            mov       m,c pop       h
            pop       d
            pop       b
            db        0fbh
            pop       psw
            db        0edh
            db        4dh sf0075_:
            db        0edh
            db        4dh sf0074_:
            mvi       a,00h
            db        0edh
            db        39h
            db        HANK1 hlt sf0076_:
            db        0edh
            db        38h
            db        STAT0
            mvi       h,0
            mov       l,a
            ret sf0077_:
            push      b
            lxi       h,4
            dad       sp
            mov       a,m db        0edh
            db        39h
            db        TDR0
            xra       a
och1:
            inr       a
            cpi       200
            jnz       och1
            pop       b
            ret sf0078_:
            mvi       a,'1'
            call      print_
            db        0fbh
            db        0edh
            db        4dh
sf0079_:
            mvi       a,'2'
            call      print_
            db        0fbh
            db        0edh
            db        4dh
sf0080_:
```

```
            mvi         a,'k'
            call        print_
            db          0fbh
            db          0edh
            db          4dh
sf0081_:
            mvi         a,'4'
            call        print_
            db          0fbh
            db          0edh
            db          4dh
sf0082_:
            mvi         a,'5'
            call        print_
            db          0fbh
            db          0edh
            db          4dh
sf0083_:
            mvi         a,'6'
            call        print_
            db          0fbh
            db          0edh
            db          4dh
sf0084_:
            mvi         a,'7'
            call        print_
            db          0fbh
            db          0edh
            db          4dh
sf0085_:
            mvi         a,'8'
            call        print_
            db          0fbh
            db          0edh
            db          4dh sf0071_:
            push        b xra         a
            mov         b,a
            mov         c,a
            mov         e,a
            mov         d,a
            lxi         h,rxnxti_
            mov         a,m
            lxi         h,rxnxto_
            mov         c,m
            lxi         h,rxbuf_
            sub         c mvi         h,0
            mov         l,a
            pop         b
            db          0fbh ret sf0064_:
            push        b
            lxi         h,4
            dad         sp mov         b,m
            inx         h
            inx         h
            mov         a,m
            cma
            mov         d,a lxi         h,port82_
            mvi         c,82h
```

```
        mov     a,m
        ora     b
        ana     d di
        mov     m,a
        db      0edh
        db      79h
        ei pop     b
        ret END
stksize equ 1024 bss stack,stksize

EXTRN   main_
    EXTRN   sf0045_
    PUBLIC  print_
    PUBLIC  sf0001_
    PUBLIC  RelInfo_
    PUBLIC  OpnDsp_
    PUBLIC  CptDsp_
    PUBLIC  DatDsp_
    PUBLIC  Microt_
    PUBLIC  Chksum_ stksize equ 1024 bss stack,stksize

ITC   equ     34h
RCR   equ     36h
CNTLA0 equ    00h
CNTLB0 equ    02h
STAT0  equ    04h
TDR0   equ    06h
TCR    equ    10h
CH1IL  equ    14h
CH1IH  equ    15h
CH1RL  equ    16h
CH1RH  equ    17h
TMDROL equ    0ch
TMDROH equ    0dh public  lnprm, lntmp, lnsec
    bss lnprm,4
    bss lntmp,4
    bss lnsec,4 global  errno_,2
    dseg
    public  Sysvec_
Sysvec_: dw  0
    dw  0
    dw  0
    dw  0
    public  $MEMRY
$MEMRY: dw  0ffffh
    cseg
    public  .begin
.begin:
    di
    db 0edh
    db 05eh
    xra     a
    db      0edh
    db      39h
    db      ITC
    jp      strt
```

```
Chksum_     dw      0E1A5h

OpnDsp_     db      'Cable Scanner!'
            db      0
CptDsp_     db      'Copyright (c)'
            db      0
DatDsp_     db      '1989'
            db      0
            db      ' by '
Microt_     db      'MicroTest'
            db      0
            db      'Inc.  All Rights Reserved.' db      'Ver:'

RelInfo_    db      '1'
            db      '.'
            db      '0'
            db      '5'
            db      ' '
            db      0
strt:

xra     a
    db      0edh
    db      39h
    db      TCR
    db      0edh
    db      39h
    db      CH1IH
    db      0edh
    db      39h
    db      CH1RH mvi     a,05h
    db      0edh
    db      39h
    db      CH1IL
    db      0edh
    db      39h
    db      CH1RL
    mvi     a,06h
    db      0edh
    db      39h
    db      TCR
    db      0edh
    db      39h
    db      RCR
    mvi     a,74h
    db      0edh
    db      39h
    db      CNTLA0 mvi     a,01h db      0edh
    db      39h
    db      CNTLB0 mvi     a,08h
    db      0edh
    db      39h
    db      STAT0 lxi     sp,stack+stksize call    main_
    hlt print_
    db      0edh
    db      39h
```

```
        db          TDR0 xra         a
p1:
    inr         a
    cpi         200
    jnz         p1
    ret PUBLIC  sf0002_
    EXTRN   sf0013_

TCR     equ     010h
TMDROL  equ     0ch
TMDROH  equ     0dh sf0002_:

push    psw
    db  0f3h push    b
    push    d
    push    h
    db      0edh
    db      028h
    db      TCR db      0edh
    db      028h
    db      TMDROL db      0edh
    db      028h
    db      TMDROH call    sf0013_ pop     h
    pop     d
    pop     b
    db      0fbh
    pop     psw db      0edh
    db      4dh TRDR    equ     0bh
CNTR    equ     0ah sf0001_:

push    psw
    db  0f3h push    b
    push    d
    push    h mvi     a,055h
    db      0edh
    db      39h
    db      TRDR mvi     a,56h
    db      0edh
    db      39h
    db      CNTR call    sf0045_
```

```
        pop     h
        pop     d
        pop     b
        db      0fbh
        pop     psw db      0edh
        db      4dh

END

PUBLIC .ovbgn
  .ovbgn:

end rom.o80:  ..\source\rom.c
    cc80  -q ..\source\rom.c  -o rom.o80 -i..\include exec.o80: ..\source\exec.c
    cc80  -q ..\source\exec.c  -o exec.o80 -i..\include hd80asci.o80:  ..\source\hd80asci.c
    cc80  -q ..\source\hd80asci.c  -o hd80asci.o80 -i..\include globs.o80:  ..\source\globs.c
    cc80  -q ..\source\globs.c  -o globs.o80 -i..\include charlib.o80:  ..\source\charlib.c
    cc80  -q ..\source\charlib.c  -o charlib.o80 -i..\include meas.o80:  ..\source\meas.c
    cc80  -q ..\source\meas.c  -o meas.o80 -i..\include utils.o80:  ..\source\utils.c
    cc80  -q ..\source\utils.c  -o utils.o80 -i..\include dsp.o80:  ..\source\dsp.c
    cc80  -q ..\source\dsp.c  -o dsp.o80 -i..\include kbd.o80:  ..\source\kbd.c
    cc80  -q ..\source\kbd.c  -o kbd.o80 -i..\include su.rel:  ..\source\su.asm
    as80 ..\source\su.asm -o su.rel chk.rel:  ..\source\chk.asm
    as80 ..\source\chk.asm -o chk.rel iio.rel:  ..\source\iio.asm
    as80 ..\source\iio.asm -o iio.rel ovb.rel:  ..\source\ovb.asm
    as80 ..\source\ovb.asm -o ovb.rel drom: rom.o80 dsp.o80 kbd.o80 meas.o80 utils.o80 exec.o80 iio.rel hd80asci.o80 s
u.rel ovb.rel charlib.o80 globs.o80
libutil -o lib2.lib dsp.o80 kbd.o80 meas.o80 utils.o80
ln80 -r -t -u 8000 -c 0 -b 0 -o drom su.rel chk.rel exec.o80 lib2.lib rom.o80 ii
o.rel hd80asci.o80 charlib.o80 globs.o80 rom.lib
```

What is claimed is:

1. A cable testing apparatus comprising:
a port for coupling to a cable under test;
a time domain reflectometer (TDR) coupled to said port, said TDR being configured to transmit a series of incident signal pulses of selectable width through said port and to monitor signals at said port; and
a controller coupled to said TDR, said controller comprising:
means for monitoring a quiescent amplitude at said port, said quiescent amplitude occurring when said signals monitored at said port are substantially uninfluenced by said incident signal pulses,
means for monitoring elapsed time from transmission of one of said incident signal pulses until said monitored signals exceed a baseline amplitude, said baseline amplitude being responsive to said quiescent amplitude, and
means for increasing said selectable width of said incident signal pulse when said elapsed time exceeds a predetermined duration.

2. A cable testing apparatus as claimed in claim 1 additionally comprising:
    means, coupled to said port, for measuring conductance at said port; and
    means, coupled to said measuring means, for graphically displaying conductance measured at said port.

3. A cable testing apparatus as claimed in claim 1 additionally comprising:
    means, coupled to said port, for measuring conductance at said port; and
    means, coupled to said measuring means, for audibly indicating conductance measured at said port.

4. A cable testing apparatus as claimed in claim 1 additionally comprising:
    means, coupled to said TDR, for measuring amplitudes of said signals at said port; and
    means, coupled to said measuring means, for audibly indicating said amplitudes measured by said measuring means.

5. A cable testing apparatus as claimed in claim 4 additionally comprising means, coupled to said audibly indicting means, for initiating an action to specify a first amplitude threshold below which said signals measured by said measuring means cause said audibly indicating means to remain silent, and a second amplitude threshold above which said signals measured by said measuring means cause said audibly indicating means to emit a constant tone.

6. A cable testing apparatus as claimed in claim 1 additionally comprising:
    display means, coupled to said TDR, for indicating TDR measurements; and
    memory means, coupled to said TDR, for storing multiple TDR measurements for subsequent recall and display at said display means.

7. A cable testing apparatus comprising:
    a port for coupling to a cable under test;
    a time domain reflectometer (TDR) coupled to said port, said TDR being configured to transmit an incident signal pulse of selectable width through said port and to monitor signals at said port;
    means, coupled to said TDR, for automatically specifying a width for said incident signal pulse in response to said signals monitored at said port; and
    means, coupled to said port, for transmitting an audio frequency electrical signal at said port.

8. A cable testing apparatus as claimed in claim 7 wherein said port includes a signal conductor and a reference conductor, and said apparatus additionally comprises:
    a terminal adapted to receive a common potential; and
    a switch, coupled between said terminal and said reference conductor of said port, said switch being configured to electrically connect said terminal to said reference conductor when said audio frequency electrical signal is not being transmitted at said port.

9. A cable testing apparatus as claimed in claim 1 additionally comprising means, coupled to said TDR, for transmitting test measurements to an external device for storage or display of said test measurements at said external device.

10. A cable testing apparatus as claimed in claim 1 additionally comprising means, coupled to said TDR, for measuring baud rate of data received serially at said apparatus.

11. A cable testing apparatus as claimed in claim 1 wherein said cable under test exhibits a characteristic impedance, and said TDR comprises a cable driver having an output coupled to said port, said cable driver output presenting an impedance greater than said characteristic impedance.

12. A cable testing apparatus as claimed in claim 1 wherein said TDR comprises a cable driver having an output coupled to said port, said cable driver output presenting an impedance greater than 150 ohms.

13. A cable testing apparatus as claimed in claim 1 wherein said cable under test exhibits a characteristic impedance, and said TDR comprises:
    a controller for initiating transmission of said incident signal pulse from said TDR and for delaying transmission of a subsequent incident signal pulse; and
    a cable driver having an input coupled to said controller and having an output coupled to said port, said cable driver output presenting an impedance which does not match said characteristic impedance of said cable under test, and said controller being configured to delay said subsequent incident signal pulse until reflection pulses at said port dissipate.

14. A cable testing apparatus comprising:
    a port for coupling to a cable under test;
    a time domain reflectometer (TDR) coupled to said port, said TDR being configured to transmit an incident signal pulse of selectable width through said port and to monitor signals at said port, said TDR comprising:
        a controller for initiating transmission of said incident signal pulse from said TDR and for automatically specifying a width for said incident signal pulse in response to said signals monitored at said port.
        a pulse generator having an input coupled to said controller and having an output coupled to said port, said pulse generator generating said incident signal pulse,
        a counter, coupled to one of said controller and said pulse generator, said counter being configured to initiate counting substantially simultaneous with the generation of said incident signal pulse,
        a comparison amplitude generator having an input coupled to said controller and having an output, said comparison amplitude generator producing a comparison signal having an amplitude,
        a comparator, having a first input coupled to said comparison amplitude generator output, a second input coupled to said port, and an output coupled to said counter, said comparator and said counter cooperating to halt said counting when said signals monitored at said port exhibit an amplitude exceeding the amplitude of said comparison signal, and
        means, coupled to said counter, for ensuring that said counting is not halted within a predetermined duration subsequent to the initiation of said counting.

15. A cable testing apparatus comprising:
    a port for coupling to a cable under test;
    a time domain reflectometer (TDR) coupled to said port, said TDR being configured to transmit an incident signal pulse of selectable width through said port and to monitor signals at said port, said TDR comprising:
- a controller for initiating transmission of said incident signal pulse from said TDR and for automatically specifying a width for said incident signal pulse in response to said signals monitored at said port,
- a pulse generator having an input coupled to said controller and having an output coupled to said port, said pulse generator generating said incident signal pulse,
- a counter, coupled to one of said controller and said pulse generator, said counter being configured to operate in a first mode wherein counting is initiated substantially simultaneous with the generation of said incident signal pulse at said port and a second mode wherein counting is initiated without the generation of said incident signal pulse at said port,
- a comparison amplitude generator having an input coupled to said controller and having an output, said comparison amplitude generator producing a comparison signal having an amplitude, and
- a comparator, having a first input coupled to said comparison amplitude generator output, a second input coupled to said port, and an output coupled to said counter, said comparator and said counter cooperating to halt said counting when said signals monitored at said port exhibit an amplitude exceeding the amplitude of said comparison signal.

16. A cable testing apparatus comprising:
a port for coupling to a cable under test;
a time domain reflectometer (TDR) coupled to said port, said TDR being configured to transmit an incident signal pulse of selectable width through said port and to monitor signals at said port, and said TDR including a controller for initiating transmission of said incident signal pulse;
means, coupled to said TDR, for automatically specifying a width for said incident signal pulse in response to said signals monitored at said port;
means for measuring resistance at said port, said measuring means having an output and having an input coupled to said port;
a comparison amplitude generator having an input coupled to said controller and having an output;
a comparator having a first input coupled to said comparison amplitude generator output, a second input, and an output coupled to said controller; and
a switch, coupled to said port, said measuring means output, said comparator second input, and said controller, said switch selectively coupling one of said port and said measuring means output to said comparator second input.

17. An apparatus for testing a cable exhibiting a predetermined characteristic impedance, said apparatus comprising:
a time domain reflectometer (TDR) having, coupled to said cable, an output exhibiting an impedance which substantially differs from said predetermined characteristic impedance, said TDR being configured to transmit an incident signal pulse into said cable and to receive a signal from said cable;
said TDR having, coupled to said output, means for measuring elapsed time between said incident signal pulse and said received signal; and
said TDR having, coupled to said measuring means, measurable by said measuring means so that ringing caused by impedance differences may substantially dissipate.

18. A cable testing apparatus as claimed in claim 17 additionally comprising:
means, coupled to said cable, for measuring conductance of said cable; and
means, coupled to said conductance measuring means, for graphically displaying conductance.

19. A cable testing apparatus as claimed in claim 17 additionally comprising:
means, coupled to said cable, for measuring conductance at said cable; and
means, coupled to said conductance measuring means, for audibly indicating conductance.

20. A cable testing apparatus as claimed in claim 17 additionally comprising:
means, coupled to said TDR, for measuring amplitudes of said signals at said port; and
means, coupled to said amplitude measuring means, for audibly indicating said amplitudes measured by said measuring means.

21. A cable testing apparatus as claimed in claim 20 additionally comprising means, coupled to said audibly indicating means, for initiating an action to specify a first amplitude threshold below which said signals measured by said amplitude measuring means cause said audibly indicating means to remain silent, and a second amplitude threshold above which said signals measured by said amplitude measuring means cause said audibly indicating means to emit a constant tone.

22. A cable testing apparatus as claimed in claim 17 additionally comprising:
display means, coupled to said TDR, for indicating TDR measurements; and
memory means, coupled to said TDR, for storing multiple TDR measurements for subsequent recall and display at said display means.

23. A cable testing apparatus as claimed in claim 17 additionally comprising means, coupled to said cable, for transmitting an audio frequency electrical signal into said cable.

24. A cable testing apparatus as claimed in claim 23 wherein said cable includes a signal conductor and a reference conductor, and said apparatus additionally comprises:
a terminal adapted to receive a common potential; and
a switch, coupled between said terminal and said reference conductor of said cable, said switch being configured to electrically couple said reference conductor to said terminal when said audio frequency electrical signal is not being transmitted at said port.

25. A cable testing apparatus as claimed in claim 17 additionally comprising means, coupled to said TDR, for transmitting test measurements to an external device for storage or display of said test measurements at said external device.

26. A cable testing apparatus as claimed in claim 17 wherein said TDR comprises:
a controller for initiating transmission of said incident signal pulse from said TDR;
a cable driver having an input coupled to said controller and having an output coupled to said cable, said cable driver producing said incident signal pulse;

a comparison amplitude generator having an input coupled to said controller and having an output, said comparison amplitude generator producing a comparison signal having an amplitude;

a comparator, having a first input coupled to said comparison amplitude generator output, a second input coupled to said cable, and an output coupled to said elapsed time measuring means, said comparator and said elapsed time measuring means cooperating to determine when said received signal monitored at said cable exhibits an amplitude exceeding the amplitude of said comparison signal; and means, coupled to said establishing means, for ensuring that said elapsed time measuring means does not stop measuring time within a predetermined duration subsequent to the initiation of said incident signal pulse.

27. A cable testing apparatus as claimed in claim 17 wherein said elapsed time measuring means includes a counter, and said establishing means is configured to control said counter so that said counter operates in a first mode wherein counting is initiated substantially simultaneous with the generation of said incident signal pulse and a second mode wherein counting is initiated without the generation of said incident signal pulse, and said TDR comprises:

a controller for initiating transmission of said incident signal pulse from said TDR;

a cable driver having an input coupled to said controller and having an output coupled to said cable, said cable driver generating said incident signal pulse;

a comparison amplitude generator having an input coupled to said controller and having an output, said comparison amplitude generator producing a comparison signal having an amplitude; and a comparator, having a first input coupled to said comparison amplitude generator output, a second input coupled to said cable, and an output coupled to said counter, said comparator and said counter cooperating to halt said counting when said received signal monitored at said cable exhibits an amplitude exceeding the amplitude of said comparison signal.

28. A cable testing apparatus as claimed in claim 17 wherein said TDR comprises a controller for initiating transmission of said incident signal pulse, and said apparatus additionally comprises:

means for measuring resistance of said cable, said measuring means having an output and having an input coupled to said cable;

a comparison amplitude generator having an input coupled to said controller and having an output;

a comparator having a first input coupled to said comparison amplitude generator output, a second input, and an output coupled to said controller; and a switch, coupled to said cable, said resistance measuring means output, said comparator second input, and said controller, said switch selectively coupling one of said cable and said resistance measuring means output to said comparator second input.

29. A cable testing apparatus as claimed in claim 17 wherein said output impedance of said TDR is greater than 150 ohms.

30. A cable testing apparatus as claimed in claim 17 wherein said TDR comprises:

a controller for initiating transmission of said incident signal pulse from said TDR and for delaying transmission of a subsequent incident signal pulse until reflection pulses at said port dissipate.

31. A cable testing apparatus having a port for coupling to a cable under test, said apparatus comprising:

a controller for initiating transmission of an incident signal pulse from said port;

a pulse generator having an input coupled to said controller and having an output coupled to said port, said pulse generator generating said incident signal pulse;

a counter, coupled to one of said controller and said pulse generator, said counter being configured to operate in a first mode wherein counting is initiated substantially simultaneous with the generation of said incident signal pulse at said port and a second mode wherein counting is initiated without the generation of said incident signal pulse at said port;

a comparison amplitude generator having an input coupled to said controller and having an output, said comparison amplitude generator producing a comparison signal having an amplitude; and a comparator, having a first input coupled to said comparison amplitude generator output, a second input coupled tos aid port, and an output coupled to said counter, said comparator and said counter cooperating to halt said counting when said signals monitored at said port exhibit an amplitude exceeding the amplitude of said comparison signal.

32. A cable testing apparatus for performing time domain reflectometry and resistance measurements, said apparatus having a port for coupling to a cable under test, and said apparatus comprising:

a controller for initiating transmission of an incident signal pulse from said port;

means for measuring resistance at said port, said measuring means having an output and having an input coupled to said port;

a comparison amplitude generator having an input coupled to said controller and having an output;

a comparator having a first input coupled to said comparison amplitude generator output, a second input, and an output coupled to said controller; and a switch, coupled to said port, said measuring means output, said comparator second input, and said controller, said switch selectively coupling one of said port and said measuring means output to said comparator second input in response to signals received from said controller.

33. A cable testing apparatus comprising:

a port for coupling to a cable under test;

a controller;

means for measuring resistance at said port, said measuring means having an output and having an input coupled to said port;

a time domain reflectometer (TDR) having an output coupled to said port, said TDR output being configured to present an impedance greater than 150 ohms to said cable under test, said TDR being configured to transmit an incident signal pulse of selectable width through said port and to monitor signals at said port, and said TDR comprising:
a comparison amplitude generator having an input coupled to said controller and having an output,
a comparator, having a first input coupled to said comparison amplitude generator output, a second input, and an output coupled to said controller, and
a switch, coupled to said port, said resistance measuring means output, said comparator second input, and said controller, said switch coupling one of said port and said resistance measuring means output to said comparator second input;
means, coupled to said controller, for automatically specifying a width for said incident signal pulse in response to said signals monitored at said port;

means, coupled to said controller, for graphically displaying resistance measured at said port;

means, coupled to said controller, for audibly indicating resistance measured at said port;

means, coupled to said port, for transmitting an audio frequency electrical signal at said port; and means, coupled to said controller, for transmitting test measurements to an external computer device for storage or display of said test measurements at said external computer device.

34. A cable testing apparatus as claimed in claim 26 wherein said TDR additionally comprises means, coupled to said ensuring means and to said controller, for varying said predetermined duration.

* * * * *

UNITED STATES PATENT AND TRADEMARK OFFICE
CERTIFICATE OF CORRECTION

PATENT NO. : 4,970,466

DATED : November 13, 1990

INVENTOR(S) : David C. Bolles, Eric J. Gotfredson and Robert W. Ellis

It is certified that error appears in the above-identified patent and that said Letters Patent is hereby corrected as shown below:

Column 184, line 2:
    In claim 17, line 14, insert before "measurable",
--means for establishing a minimum elapsed time--.

Column 186, line 32:
    In claim 31, line 22, delete "tos aid" and insert
--to said--.

Signed and Sealed this

Sixteenth Day of June, 1992

*Attest:*

DOUGLAS B. COMER

*Attesting Officer*      *Acting Commissioner of Patents and Trademarks*